(12) United States Patent
Lee et al.

(10) Patent No.: US 12,316,988 B2
(45) Date of Patent: *May 27, 2025

(54) CAMERA DEVICES HAVING AUTOFOCUS PIXELS

(71) Applicant: Samsung Electronics Co., Ltd., Suwon-si (KR)

(72) Inventors: Heesu Lee, Suwon-si (KR); Daekwan Kim, Suwon-si (KR); Taeshick Wang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/389,970

(22) Filed: Dec. 20, 2023

(65) Prior Publication Data

US 2024/0137667 A1 Apr. 25, 2024
US 2024/0236523 A9 Jul. 11, 2024

Related U.S. Application Data

(63) Continuation of application No. 17/189,348, filed on Mar. 2, 2021, now Pat. No. 11,882,372.

(30) Foreign Application Priority Data

Jun. 18, 2020 (KR) .................. 10-2020-0074269

(51) Int. Cl.
*H04N 25/704* (2023.01)
*H10F 39/00* (2025.01)

(52) U.S. Cl.
CPC ....... *H04N 25/704* (2023.01); *H10F 39/8063* (2025.01)

(58) Field of Classification Search
CPC .............. H04N 5/36961; H04N 5/379; H04N 9/04557; H04N 5/2253; H04N 5/2254; H04N 5/23212; H04N 5/3696; H04N 25/704; H04N 25/134; H04N 25/79; H04N 23/54; H04N 23/55; H04N 23/67; H04N 25/702; H01L 27/14627; H01L 27/14605;
(Continued)

(56) References Cited

U.S. PATENT DOCUMENTS 7,012,750 B2 3/2006 Tsukada
9,857,665 B2 1/2018 Song et al.
(Continued)

FOREIGN PATENT DOCUMENTS

CN 101069107 A 11/2007
CN 107786822 A 3/2018
(Continued)

*Primary Examiner* — Shahbaz Nazrul
(74) *Attorney, Agent, or Firm* — Myers Bigel, P.A.

(57) ABSTRACT

A camera device includes an image sensor including a pixel array and a logic circuit, with the camera device further comprising an optical module that includes a plurality of lenses arranged in a path of travel of light incident on the image sensor. The pixel array includes a plurality of pixels having a general pixel, a first autofocus pixel and a second autofocus pixel, and at least one of the plurality of lenses has an edge that extends in a first direction. A height of an upper surface of the microlens, included in the first autofocus pixel, is different from a height of an upper surface of the microlens included in the second autofocus pixel.

19 Claims, 39 Drawing Sheets

(58) Field of Classification Search
CPC ......... H01L 27/14621; H01L 27/14623; H01L 27/14645; H01L 27/1464; H01L 27/14641; H10F 39/8063; H10F 10/163; H10F 30/2635; H10F 10/161; H10F 19/75; A23B 70/20; H10H 20/8232; H10D 89/921

See application file for complete search history.

(56) References Cited

U.S. PATENT DOCUMENTS

| | | |
|---|---|---|
| 9,973,678 B2 | 5/2018 | Mandelli et al. |
| 10,506,187 B2 | 12/2019 | Kim et al. |
| 10,665,626 B2 | 5/2020 | Zhao et al. |
| 2006/0119950 A1 | 6/2006 | Boettiger et al. |
| 2010/0009493 A1 | 1/2010 | Kim et al. |
| 2012/0043634 A1 | 2/2012 | Kurihara |
| 2014/0071322 A1 | 3/2014 | Fukuda |
| 2014/0306360 A1 | 10/2014 | Li et al. |
| 2016/0044250 A1 | 2/2016 | Shabtay et al. |
| 2016/0225805 A1* | 8/2016 | Keelan ................. H04N 23/672 |
| 2016/0240571 A1 | 8/2016 | Baek |
| 2017/0160511 A1 | 6/2017 | Kim et al. |
| 2017/0180628 A1 | 6/2017 | Kato |
| 2018/0063456 A1 | 3/2018 | Lee |
| 2018/0249106 A1 | 8/2018 | Mu et al. |
| 2019/0081098 A1 | 3/2019 | Lenchenkov et al. |
| 2019/0244995 A1 | 8/2019 | Ootsuka |
| 2019/0297291 A1 | 9/2019 | Kim et al. |
| 2019/0394389 A1 | 12/2019 | Lu et al. |
| 2019/0394407 A1 | 12/2019 | Fukuda et al. |
| 2020/0057179 A1 | 2/2020 | Yang et al. |
| 2020/0186723 A1 | 6/2020 | Kang et al. |
| 2020/0280659 A1* | 9/2020 | Galor Gluskin ....... H04N 23/55 |
| 2020/0387050 A1 | 12/2020 | Pyo et al. |

FOREIGN PATENT DOCUMENTS

| | | |
|---|---|---|
| CN | 208538863 U | 2/2019 |
| CN | 110352489 A | 10/2019 |
| CN | 212343888 U | 1/2021 |
| JP | 2014056014 A | 3/2014 |
| JP | 2017212291 A | 11/2017 |
| KR | 20100007562 A | 1/2010 |
| KR | 20110079276 A | 7/2011 |
| KR | 20160100569 A | 8/2016 |
| KR | 20200069024 A | 6/2020 |

* cited by examiner

CAMERA DEVICES HAVING AUTOFOCUS PIXELS

CROSS-REFERENCE TO RELATED APPLICATIONS

This U.S. non-provisional patent application is a continuation of and claims priority to U.S. patent application Ser. No. 17/189,348, filed on Mar. 2, 2021, which claims the benefit of priority to Korean Patent Application No. 10-2020-0074269 filed on Jun. 18, 2020, in the Korean Intellectual Property Office, and the entire contents of the above-identified applications are incorporated by reference herein.

BACKGROUND

The present disclosure relates to camera devices.

An image sensor is a semiconductor-based sensor which may receive light and generate an electrical signal therefrom. An image sensor may include a pixel array that includes a plurality of pixels, a logic circuit that is configured to drive the pixel array and generate an image, and other components. The image sensor may be included in a camera device. The logic circuit may obtain a pixel signal from the pixels to generate image data. The image sensor may provide an autofocusing function to focus on a subject.

SUMMARY

Aspects of the present disclosure provide a camera device having an improved autofocusing function.

According to some example embodiments, a camera device may include: an image sensor including a pixel array and a logic circuit; and an optical module including a plurality of lenses arranged to be in a path of travel of light incident on the image sensor. The pixel array includes a plurality of pixels arranged in a first direction and arranged in a second direction that intersects the first direction, and each of the plurality of pixels includes a pixel circuit, at least one photodiode, a light transmission layer, and a microlens that are sequentially stacked. The logic circuit is configured to obtain a pixel signal from the plurality of pixels. At least one of the plurality of lenses has an edge that extends in the first direction. The pixel array includes a general pixel, a first autofocus pixel, and a second autofocus pixel. The first autofocus pixel and the second autofocus pixel each include a first photodiode and a second photodiode, and the first photodiode and the second photodiode of the first autofocus pixel are adjacent to each other in the first direction and the first photodiode and the second photodiode of the second autofocus pixel are adjacent to each other in the second direction. A height of an upper surface of the microlens, included in the first autofocus pixel, is different from a height of an upper surface of the microlens included in the second autofocus pixel.

According to some example embodiments, a camera device may include: an optical module including a plurality of lenses including a first lens having an edge that extends in a first direction; and an image sensor including a pixel array, in which a plurality of pixels are arranged in the first direction and in a second direction that intersects the first direction. The image sensor further includes a logic circuit configured to obtain a pixel signal generated by the plurality of pixels in response to light passing through the optical module. The pixel array includes a first autofocus pixel and a second autofocus pixel, with each of the first autofocus pixel and the second autofocus pixel including a first photodiode and a second photodiode. The first photodiode and the second photodiode of the first autofocus pixel are arranged in the first direction, and the first photodiode and the second photodiode of the second autofocus pixel are arranged in the second direction. In a third direction that intersects the first direction and the second direction, a gap between an upper surface of the first autofocus pixel and the optical module is greater than a gap between an upper surface of the second autofocus pixel and the optical module.

According to some example embodiments, a camera device may include: an image sensor comprising a pixel array that includes a plurality of pixels, with the image sensor also including a logic circuit configured to obtain a pixel signal from the plurality of pixels; and an optical module including at least one lens having an edge that extends in a first direction and disposed in front of the pixel array. Each of the plurality of pixels includes at least one photodiode and a microlens on a path on which light is incident on the photodiode. The pixel array includes first pixels in which a radius of curvature of the microlens has a first value and second pixels in which a radius of the microlens has a second value, greater than the first value. The number of the first pixels is greater than the number of the second pixels.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, some example embodiments will be described with reference to the accompanying drawings.

Figure 1:
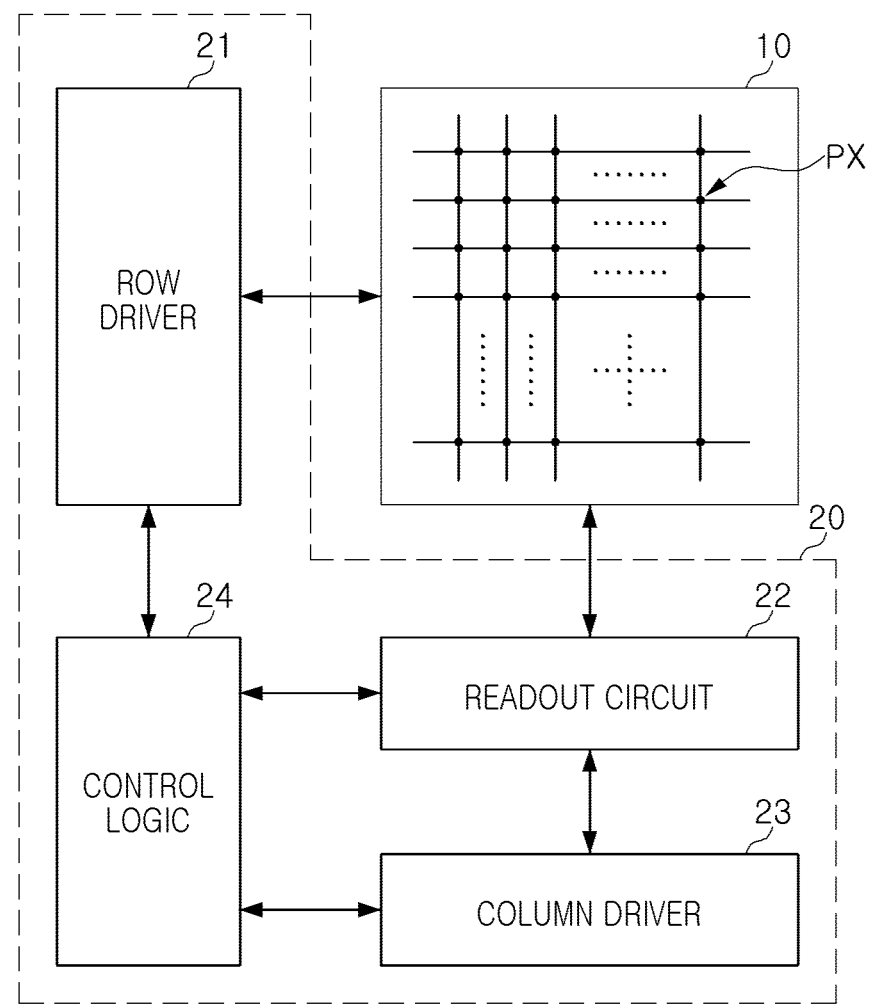
FIG. 1 is a schematic block diagram of an image sensor according to some example embodiments.

FIG. 1 is a schematic block diagram of an image sensor according to some example embodiments.

Referring to FIG. 1, an image sensor 1 may include a pixel array 10 and a logic circuit 20. The image sensor may include additional components which are not shown in FIG. 1 nor described herein, for convenience of description.

The pixel array 10 may include a plurality of pixels PX which are arranged in a plurality of rows and a plurality of columns in array form. Each of the plurality of pixels PX may include at least one photoelectric transformation element that generates an electric charge in response to light and a pixel circuit that generates a pixel signal corresponding to an electric charge generated by the photoelectric transformation element, and may include other components which are not shown in FIG. 1. The photoelectric transformation element may include a photodiode that is formed of a semiconductor material, and/or an organic photodiode that is formed of an organic material, as examples.

As an example, the pixel circuit of each of the pixels PX may include a floating diffusion region, a transfer transistor, a reset transistor, a driving transistor, and a selection transistor. The pixels PX may have varying configurations according to some example embodiments. For example, in some example embodiments each of the pixels PX may include an organic photodiode including an organic material, while in some embodiments the pixels PX may be implemented as a digital pixel. When the pixels PX are implemented as digital pixels, each of the pixels PX may include an analog-to-digital converter for outputting a digital pixel signal.

The logic circuit 20 may include circuits for controlling the pixel array 10. As seen in the example of FIG. 1, the logic circuit 20 may include a row driver 21, a readout circuit 22, a column driver 23, and a control logic 24, and may include other components not shown in FIG. 1. The row driver 21 may drive the pixel array 10 in units of row lines. For example, the row driver 21 may generate control signals, such as a transfer control signal for controlling a transfer transistor of one or more pixel circuits, a reset control signal for controlling a reset transistor of one or more pixel circuits, a selection control signal for controlling a selection transistor of one or more pixel circuits, and the like. The row driver 21 may input the generated signals in units of row lines.

The readout circuit 22 may include one or more correlated double samplers (CDS), one or more analog-to-digital converters (ADC), and other circuit components. The correlated double samplers may be connected to pixels PX through column lines. The correlated double samplers may read a pixel signal through the column lines from pixels PX that are connected to a row line selected by a row line selection signal of the row driver 21. The analog-to-digital converters may convert the pixel signal detected by the correlated double sampler into a digital pixel signal and may transmit the digital pixel signal to the column driver 23.

The column driver 23 may process the digital pixel signal received from the readout circuit 22. The column driver 23 include a latch or a buffer circuit that temporarily stores the digital pixel signal, an amplifier circuit, and the like. The row driver 21, the readout circuit 22, and the column driver 23 may be controlled by the control logic 24. The control logic 24 may include a timing controller for controlling operating timings of the row driver 21, the read-out circuit 22, and the column driver 23.

Among the pixels PX, pixels PX in different rows arranged in the same position in a first direction (a horizontal direction) within each row may share the same column line. Pixels PX arranged in a row (e.g., pixels PX in different columns arranged in the same position in a second direction (a vertical direction) within each column) may be simultaneously selected by the row driver 21, and the pixels PX of the selected row may output a pixel signal through respective column lines. In some example embodiments, the readout circuit 22 may simultaneously obtain a pixel signal from each of the pixels PX in the row selected by the row driver 21, through the column lines. The pixel signal may include a reset voltage and a pixel voltage. The pixel voltage may be a voltage in which electric charges generated in response to light in each of the pixels PX are reflected.

In some example embodiments, the pixel array 10 may include a plurality of autofocus pixels. Each of the autofocus pixels may include two or more photodiodes, and the logic circuit 20 may implement an autofocusing function of the image sensor 1 and/or a camera device that includes the image sensor 1. The logic circuit 20 may implement the autofocusing function in part by using a difference between pixel signals obtained from the photodiodes included in the autofocus pixels.

The pixel signals, obtained from the photodiodes by the logic circuit 20, may be determined by externally incident light, and thus, may be affected by shapes of lenses that are within a path of light incident to the image sensor 1. For example, when there is a lens having a non-circular shape within the path of light, there may be a varying difference between pixel signals for the autofocus pixels, depending on a direction in which the photodiodes are arranged.

In some example embodiments, an image sensor 1 having an improved autofocusing function may be provided in consideration of the above features. As an example, upper surfaces of microlenses included in at least a portion of the autofocus pixels included in the pixel array 10 may be arranged to have different heights, and thus, a more accurate and/or improved autofocusing function may be implemented, irrespective of the arrangement direction of the photodiodes.

Figure 2:
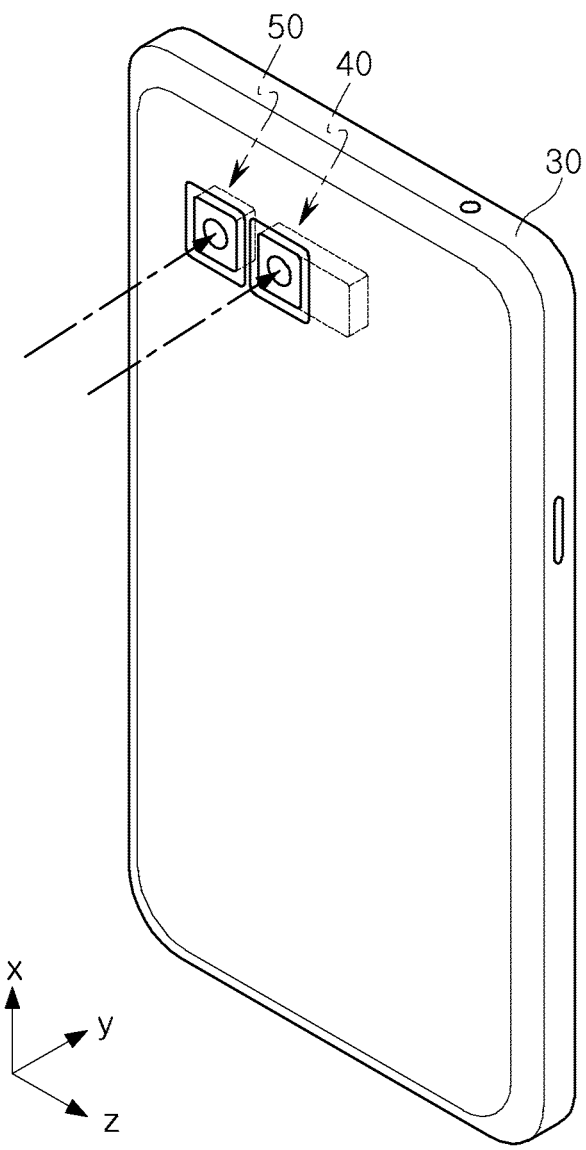
FIG. 2 illustrates an electronic device including a camera device according to some example embodiments.

FIG. 2 illustrates an electronic device including a camera device according to some example embodiments.

Referring to FIG. 2, an electronic device 30 according to some example embodiments may be a mobile device such as a smart phone, tablet, or the like, and may include camera devices 40 and 50. However, the electronic device 30 is not limited to a mobile device, and it should be understood that in some example embodiments, the electronic device 30 may be any electronic device that includes the camera devices 40 and 50. In addition, the number of the camera devices 40 and 50 included in the electronic device 30 may be variously changed.

In some example embodiments, and as illustrated in FIG. 2, the electronic device 30 may include a first camera device 40 and a second camera device 50, and the first camera device 40 and the second camera device 50 may have different structures. For example, an image sensor included in the first camera device 40 may be arranged such that an upper surface of a pixel array is parallel to an X-Y plane, and an image sensor included in the second camera device 50 may be arranged such that an upper top surface of a pixel array is parallel to a X-Z plane.

Referring to FIG. 2, light traveling in one direction (a Y-axis direction) may be incident on the first camera device 40 and the second camera device 50. Accordingly, the first camera device 40 may include a refractive member which may refract the incident light in one direction (a Y-axis direction) and another direction (a Z-axis direction). For example, the refractive member may be implemented as a prism, or the like.

Using a refraction member like the first camera device 40 may permit the thickness of the electronic device 30 in one direction (the Y-axis direction) to be significantly reduced and may allow the number of lenses included in the first camera device 40 to be increased. As an example, a telephoto camera requiring a large or larger number of lenses may be implemented more efficiently using a structure such as the first camera device 40. Hereinafter, this will be described in more detail with reference to FIGS. 3 and 4.

Figure 3:
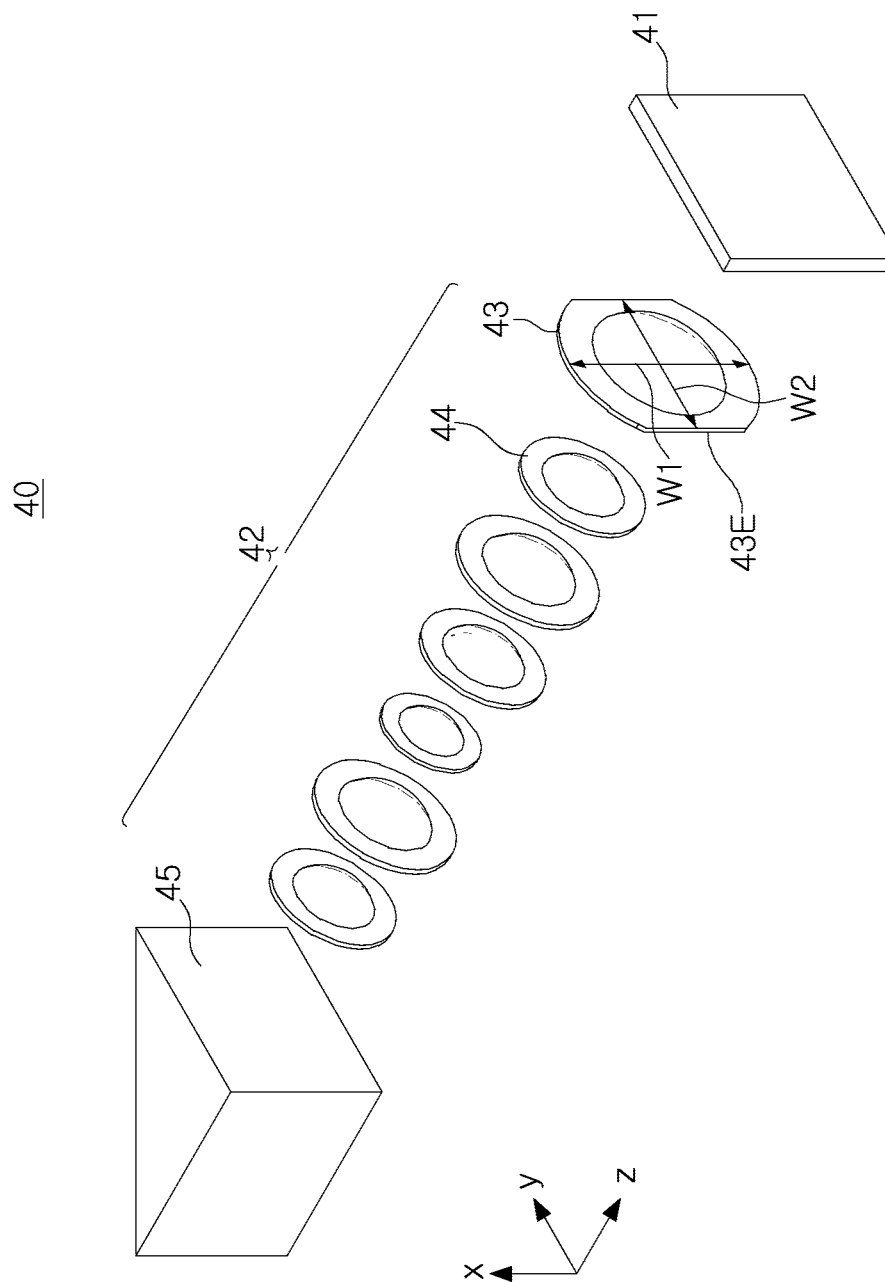
FIGS. 3 and 4 illustrate camera devices according to some example embodiments.
Figure 4:
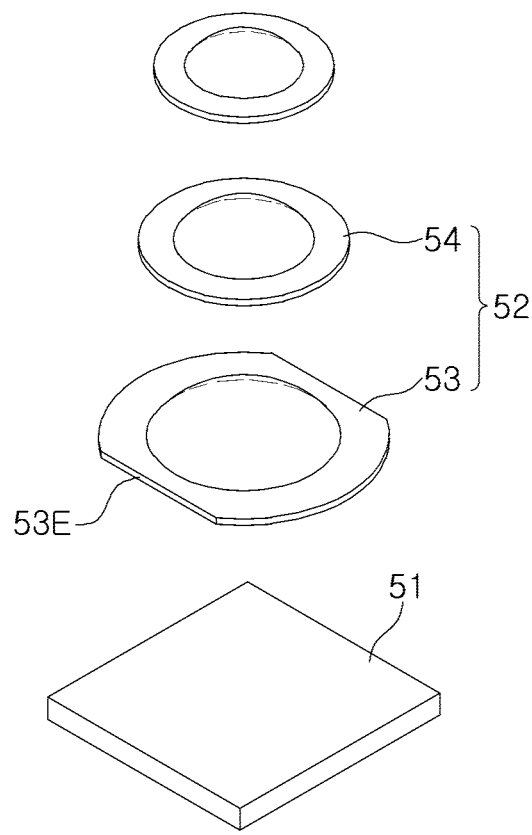

FIGS. 3 and 4 illustrate camera devices according to some example embodiments.

FIG. 3 may be a schematic diagram of a first camera device 40. Referring to FIG. 3, the first camera device 40 may include an image sensor 41 and an optical module 42 allowing light incident in one direction (e.g., a Y-axis direction) to be incident on the image sensor 41 in a different direction (e.g., a Z-axis direction). The first camera device 40 may include other components not shown in FIG. 3. The optical module 42 may include a plurality of lenses 43 and 44 arranged in a path of the light incident on the image sensor 41, and a refractive member 45 refracting the light incident in the one direction (the Y-axis direction) to the different direction, and the optical module 42 may include other components not shown in FIG. 3. As described above, an upper surface of a pixel array included in the image sensor 41 may be parallel to an X-Y plane.

The optical module 42 may include a first lens 43 and a second lens 44 having different shapes. Referring to FIG. 3, the first lens 43 may have at least one edge 43E extending in a first direction (e.g., an X-axis direction). Due to formation of the edge 43E extending in the first direction, the first lens 43 may have different widths in the first direction and a second direction (e.g., a Y-axis direction). As an example, the first lens 43 may have a first width W1 in the first direction and a second width W2 in the second direction. The second width W2 may be smaller than the first width W1.

In the first camera device 40 illustrated in FIG. 3, the second direction (e.g., the Y-axis direction) may be a thickness direction of an electronic device in which the first camera device 40 is mounted. Therefore, the edge 43E extending in the first direction may be formed on a lens having a relatively large diameter such as the first lens 43 to significantly reduce not only a thickness of the first camera device 40 but also a thickness of an electronic device in which the first camera device 40 is mounted.

Referring to FIG. 4, a second camera device 50 may include an image sensor 51 and an optical module 52. Unlike the first camera device 40, the optical module 52 of the second camera device 50 may not include a refractive member. An upper surface of a pixel array included in the image sensor 51 may be parallel to an X-Z plane. The optical module 52 may include a plurality of lenses 53 and 54, and a first lens 53 and a second lens 54 may have different shapes. As an example, unlike the second lens 54 having a circular shape, the first lens 53 may have at least one corner and/or edge 53E, which may be a straight edge extending in a direction (e.g., the Z-axis direction in FIG. 4).

In the example camera devices illustrated in FIGS. 3 and 4, the number and arrangement of the first lenses 43 and 53 may be variously changed. For example, in FIGS. 3 and 4, the first lenses 43 and 53 are illustrated as being arranged to be close to the image sensors 41 and 51, but may be in the middle or front of the optical modules 42 and 52. As an example, in the example embodiment illustrated in FIG. 4, the first lens 53 may be in front of the optical module 52 to reduce an area of the second camera device 50 that is exposed outwardly of the electronic device.

As described with reference to FIGS. 3 and 4, the first lenses 43 and 53 having edges 43E and 53E may be included in the optical modules 42 and 52 to obtain various effects. On the other hand, the first lenses 43 and 53 may cause a difference between pixel signals appearing in autofocus pixels included in the image sensors 41 and 51, which may contribute to an error in autofocusing. Accordingly, a method of accurately implementing an autofocusing function may be applied to the image sensors 41 and 51 and/or the camera devices 40 and 50.

Figure 5:
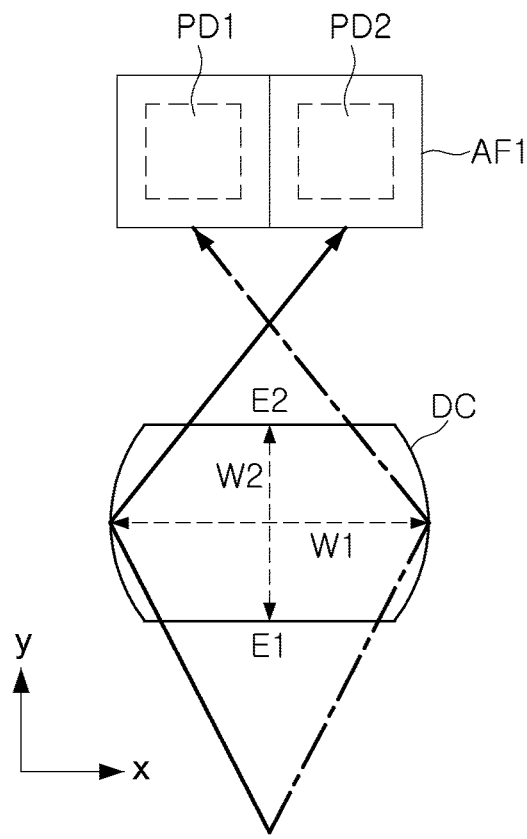
FIGS. 5 and 6 illustrate operations of an image sensor according to some example embodiments.
Figure 5:
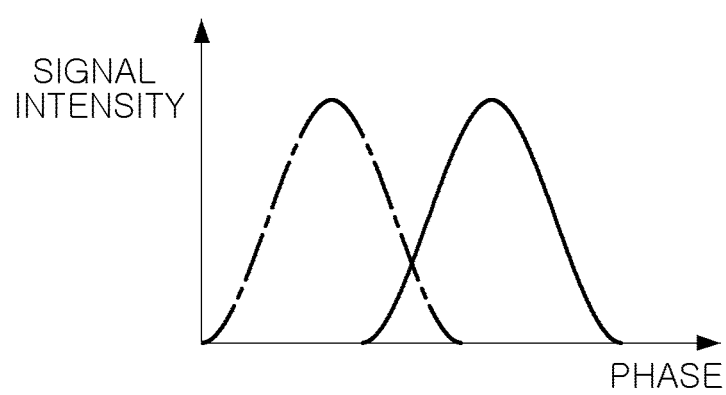
Figure 6:
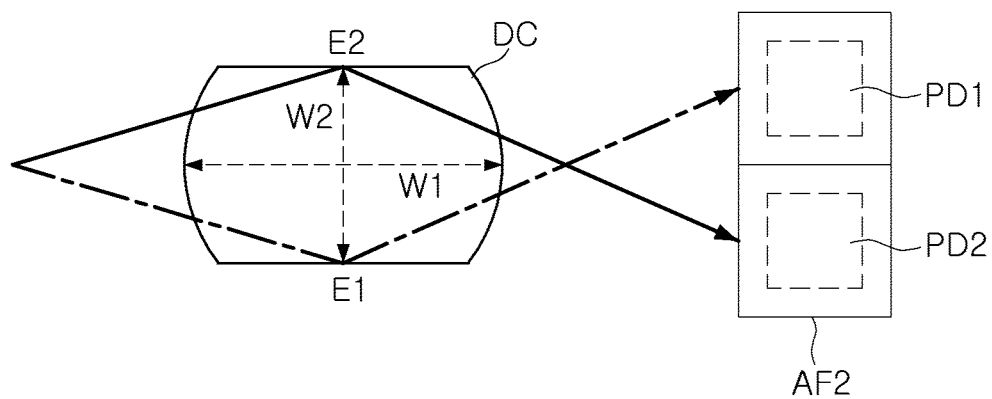
Figure 6:
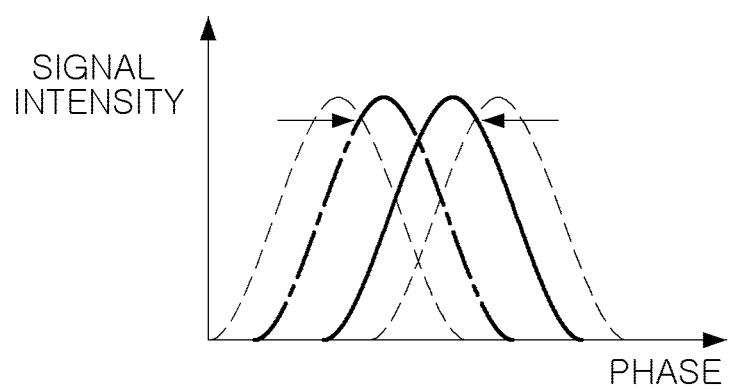

FIGS. 5 and 6 illustrate an operation of an image sensor according to some example embodiments.

FIGS. 5 and 6 are provided to describe a difference between pixel signals generated by autofocus pixels AF1 and AF2 included in a pixel array of an image sensor. In some example embodiments, and as illustrated in FIGS. 5 and 6, a lens DL is in a path of light incident on the autofocus pixels AF1 and AF2. For example, the lens DL may have edges E1 and E2 extending in a first direction (e.g., an X-axis direction). Accordingly, the lens DL may have a first width W1 in the first direction and a second width W2, smaller than the first width W1, in a second direction (e.g., a Y-axis direction).

Each of the autofocus pixels AF1 and AF2 may include a first photodiode PD1 and a second photodiode PD2 adjacent to each other. Referring to FIGS. 5 and 6, the first photodiode PD1 and the second photodiode PD2 included in the first autofocus pixel AF1 may be adjacent to each other in the first direction, and the first photodiode PD1 and the second photodiode PD2 included in the second autofocus pixel AF2 may be adjacent to each other in the second direction. Accordingly, as illustrated in FIGS. 5 and 6, a difference between pixel signals obtained from the first autofocus pixel AF1 and a difference between pixel signals obtained from the second autofocus pixel AF2 may be different from each other.

A height of the lens DC of FIG. 5, as viewed from the first autofocus pixel AF1, may be a first width W1. A height of the lens DC of FIG. 6, as viewed from the second autofocus pixel AF2, may be a second width W2. The second width W2 may be less than a first width W1. Linear distances between the first autofocus pixel AF1 and the second autofocus pixel AF2, and the lenses DC may be the same. Thus, a numerical aperture defined in the first autofocus pixel AF1 may be different from a numerical aperture defined in the second autofocus pixel AF2. For example, when the second width W2 is 1/A times the first width W1, the numerical aperture of the second autofocus pixel AF2 may be 1/A times the numerical aperture of the first autofocus pixel AF1. Stated differently, the second autofocus pixel AF2 may have a smaller field of view than the first autofocus pixel AF1.

In some example embodiments, to compensate for a difference in numerical aperture between the first autofocus pixel AF1 and the second autofocus pixel AF2, at least one of a radius of curvature of a microlens and/or a thickness of a light transmission layer included in the second autofocus pixel AF2 may be different from those in the first autofocus pixel AF1. The different radius of curvature and/or thickness of the light transmission layer may result in a change in a focal length of the second autofocus pixel AF2 to compensate for a difference in the numerical aperture between the first autofocus pixel AF1 and the second autofocus pixel AF2.

For example, the radius of curvature of the microlens included in the second autofocus pixel AF2 may be smaller than a radius of curvature of the microlens included in the first autofocus pixel AF1. Additionally, or alternatively, the thickness of the light transmission layer included in the second autofocus pixel AF2 may be greater than the thickness of the light transmission layer included in the first autofocus pixel AF1. In some example embodiments, the radius of curvature of the microlens included in the second autofocus pixel AF2 and the thickness of the light transmission layer may be adjusted together. As the radius of curvature of the microlens and/or the thickness of the light transmission layer are changed, an upper surface of the microlens included in the second autofocus pixel AF2 may be arranged to be structurally higher than an upper surface of the microlens included in the first autofocus pixel AF1.

Figure 7:
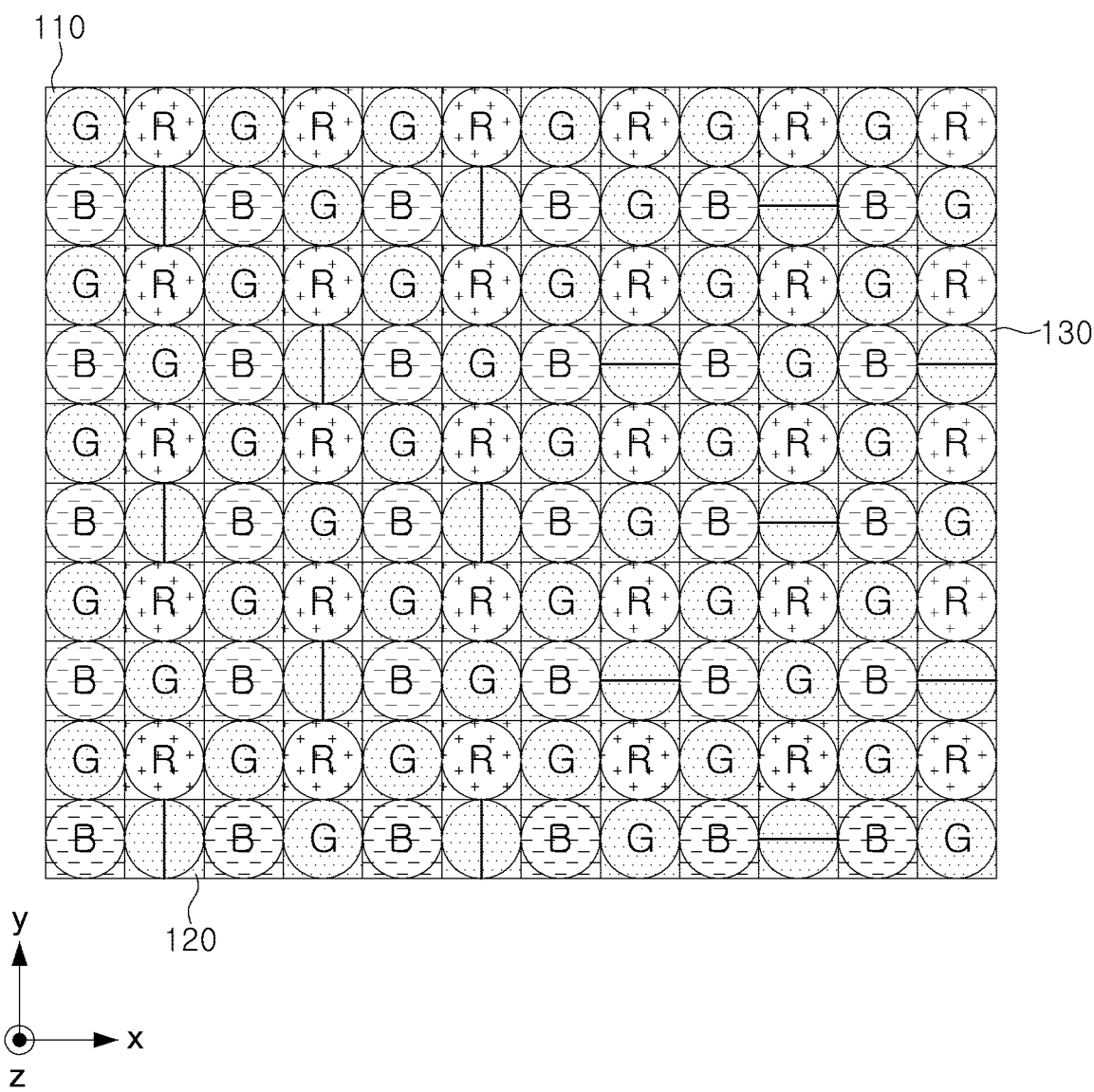
FIG. 7 illustrates a pixel array of an image sensor according to some example embodiments.

FIG. 7 illustrates a pixel array of an image sensor according to some example embodiments.

Referring to FIG. 7, a pixel array 100 of an image sensor according to some example embodiments may include a plurality of pixels 110 to 130 arranged in a first direction (e.g., an X-axis direction) and a second direction (e.g., a Y-axis direction). For example, the pixel array 100 may include general pixels 110, first autofocus pixels 120, and second autofocus pixels 130. The pixel array 100 may include a variable number of the general pixels 110, the first autofocus pixels 120, and the second autofocus pixels 130. For example, the number of the general pixels 110 may be greater than the number of the autofocus pixels 120 and 130. The locations of the first autofocus pixels 120 and the second autofocus pixels 130 are not limited to what is illustrated in FIG. 7, and may be variously changed without departure from the present inventive concepts. Although multiple first autofocus pixels 120 and second autofocus pixels 130 are present in the pixel array 100 illustrated in FIG. 7, the discussion herein will be of a first autofocus pixel 120 and a second autofocus pixel 130 for convenience of description, with the understanding that the discussion thereof is applicable to each of the first autofocus pixels 120 and second autofocus pixels 130 that are present in the pixel array 100.

The first autofocus pixel 120 and the second autofocus pixel 130 may each include a first photodiode and a second photodiode. In the first autofocus pixel 120, the first photodiode and the second photodiode may be arranged in the first direction. In the second autofocus pixel 130, the first photodiode and the second photodiode may be arranged in the second direction. As with the first autofocus pixel 120 and the second autofocus pixel 130, each of the general pixels 110 may include a plurality of photodiodes, or the general pixels 100 may each include a single photodiode.

In some example embodiments, although not illustrated in FIG. 7, a plurality of lenses may be in a path of light incident on the image sensor. At least one of the plurality of lenses may be a D-cut lens having an edge extending in the first direction. When the D-cut lens has an edge extending in the first direction, the D-cut lens may have a first width in the first direction and may have a second width in the second direction, with the second width smaller than the first width.

The presence of the D-cut lens in the path of light incident to the image sensor, may result in numerical apertures of the first autofocus pixel 120 and the second autofocus pixel 130 having different values. Therefore, when the D-cut lens is in the path of light incident to the image sensor, autofocus information generated by a pixel signal output from a first autofocus pixel 120 and autofocus information generated by a pixel signal output from a second autofocus pixel 130 may be different from each other. If not accounted for, this difference may result in an issue in an autofocusing function.

In some example embodiments, the first autofocus pixel 120 and the second autofocus pixel 130 may be formed to be different from each other, and thus, the above issue may be addressed and the autofocusing function of the image sensor may be improved. For example, an upper surface of a microlens included in the first autofocus pixel 120 and an upper surface of a microlens included in the second autofocus pixel 130 may be at different heights. Thus, a difference in numerical apertures in the first autofocus pixel 120 and the second autofocus pixel 130 resulting from the D-cut lens may be accommodated, and the autofocusing function may be more accurately implemented and/or improved.

A height of the upper surface of the microlens included in the second autofocusing pixel 130 may be greater than a height of the upper surface of the microlens included in the first autofocusing pixel 120. For example, in a third direction (a Z-axis direction) perpendicular to an upper surface of the pixel array 100, a gap between the upper surface of the microlens of the first autofocus pixel 120 and the D-cut lens may be greater than a gap between the upper surface of the microlens of the pixel 130 and the D-cut lens.

In some embodiments, in the pixel array 100 illustrated in FIG. 7, the numerical aperture of the second autofocus pixel 130 may be smaller than the numerical aperture of the first autofocus pixel 120. For example, the microlens of the second autofocus pixel 130 may be formed to have a smaller radius of curvature than the microlens of the first autofocus pixel 120. As a radius of curvature is decreased, the numerical aperture of the microlens is increased. Therefore, the microlenses in the first autofocus pixel 120 and the second autofocus lens 130 may be formed to have different radii of curvature to address an issue of the difference in the numerical aperture resulting from the disposition of the D-cut lens. Additionally, or alternatively, light transmission layers, each between a microlens and a photodiode in the first autofocus pixel 120 and the second autofocus pixel 130 may be formed to have different thicknesses to address the issue of the difference in the aperture resulting from the disposition of the D-cut lens. According to some example embodiments, the radius of curvature of the microlens and/or the thickness of the light transmission layer in the first autofocus pixel 120 and the radius of curvature of the microlens and the thickness of the light transmission layer in the first autofocus pixel 120 in the second autofocus pixel 130 may be different from each other.

Figure 8A:
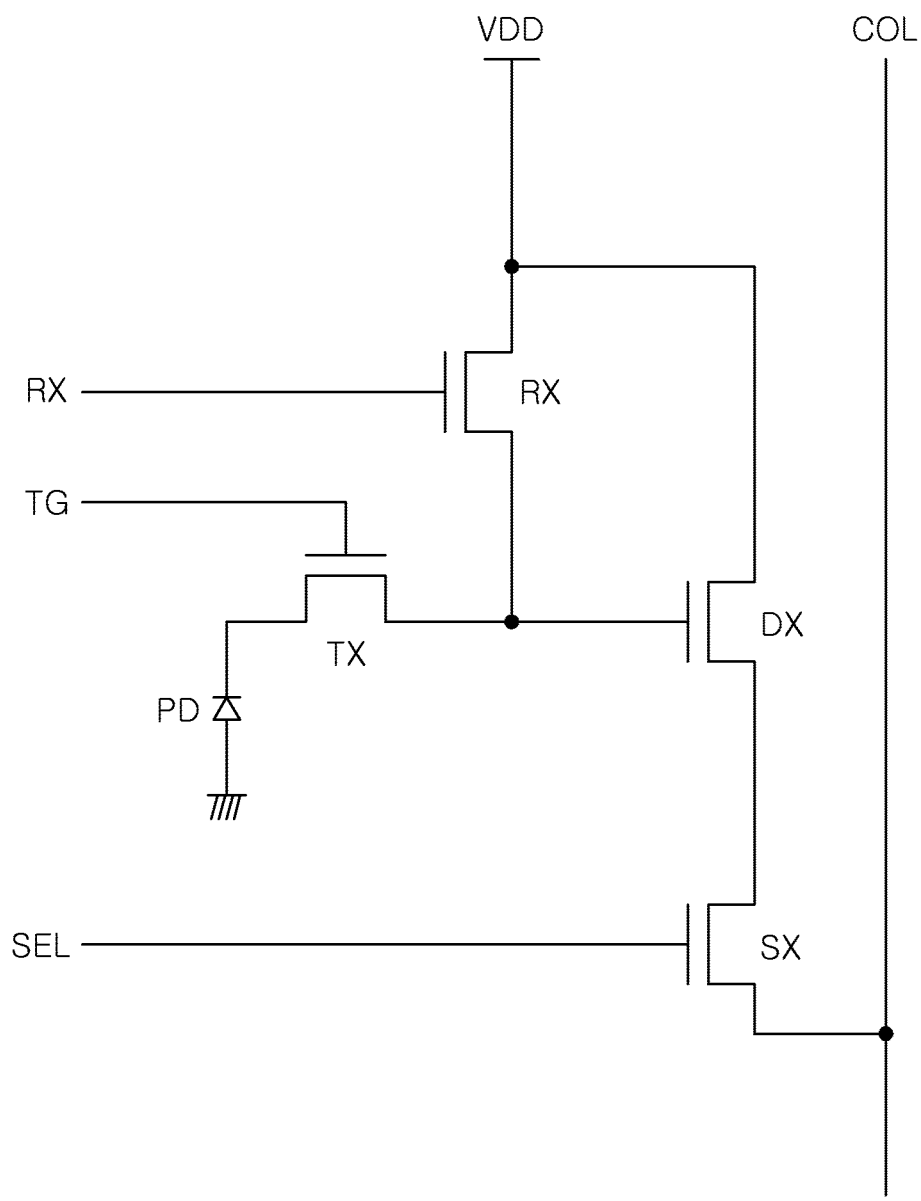
FIGS. 8A and 8B illustrate a pixel circuit of an image sensor according to some example embodiments.
Figure 8B:
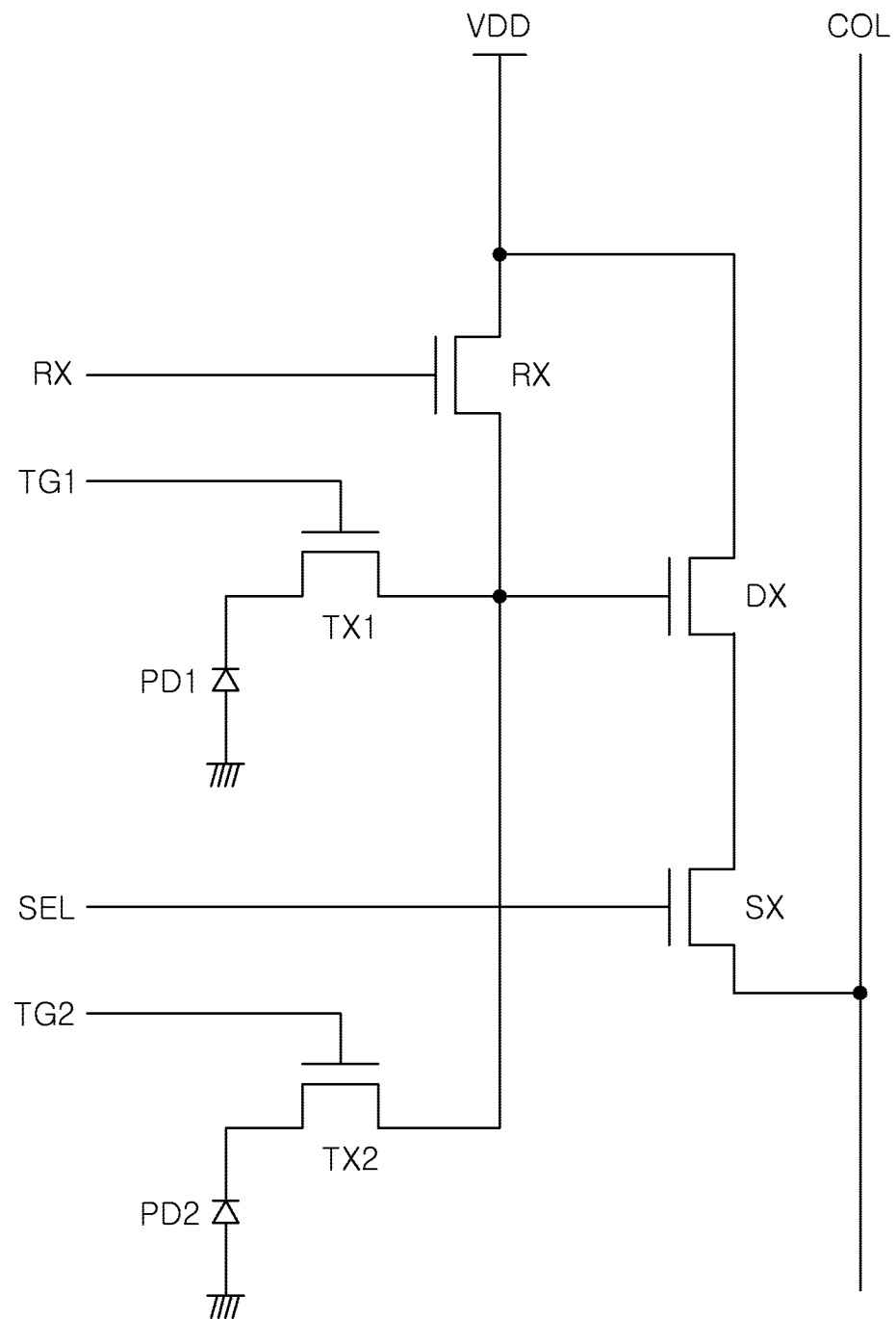

FIGS. 8A and 8B illustrate a pixel circuit of an image sensor according to some example embodiments.

FIG. 8A is an example of a circuit diagram illustrating a pixel circuit of the general pixel 110 in the pixel array 100 illustrated in FIG. 7, and FIG. 8B is an example of a circuit diagram illustrating a pixel circuit of the first autofocus pixel 120 and/or the second autofocus pixel 130 in the pixel array 100 illustrated in FIG. 7. However, pixel circuits included in the pixels 110, 120, and 130 are not necessarily limited to that which is illustrated in FIGS. 8A and 8B and, as necessary, some elements may be added and/or omitted.

Referring to FIG. 8A, a pixel circuit of the general pixel 110 may include a photodiode PD, a transfer transistor TX, a reset transistor RX, a driving transistor SF, and a selection transistor SX. The pixel circuit may be connected to a logic circuit of an image sensor through a column line COL, and the logic circuit may obtain a reset voltage and a pixel voltage through the column line COL to generate a pixel signal of the general pixel 110.

Referring to FIG. 8B, a pixel circuit of the first autofocus pixel 120 and the second autofocus pixel 130 may include a first photodiode PD1, a first transfer transistor TX1, and a second A photodiode PD2, a second transfer transistor TX2, a reset transistor RX, a driving transistor SF, a selection transistor SX, and the like. As with the general pixel 110, the logic circuit may obtain pixel signals of the first autofocus pixel 120 and the second autofocus pixel 130 through a column line COL.

As an example, the logic circuit may obtain a first pixel signal, corresponding to an electric charge generated by the first photodiode PD1, and a second pixel signal corresponding to an electric charge generated by the second photodiode PD2. The logic circuit may implement an autofocusing function using the first pixel signal and the second pixel signal.

Figure 9:
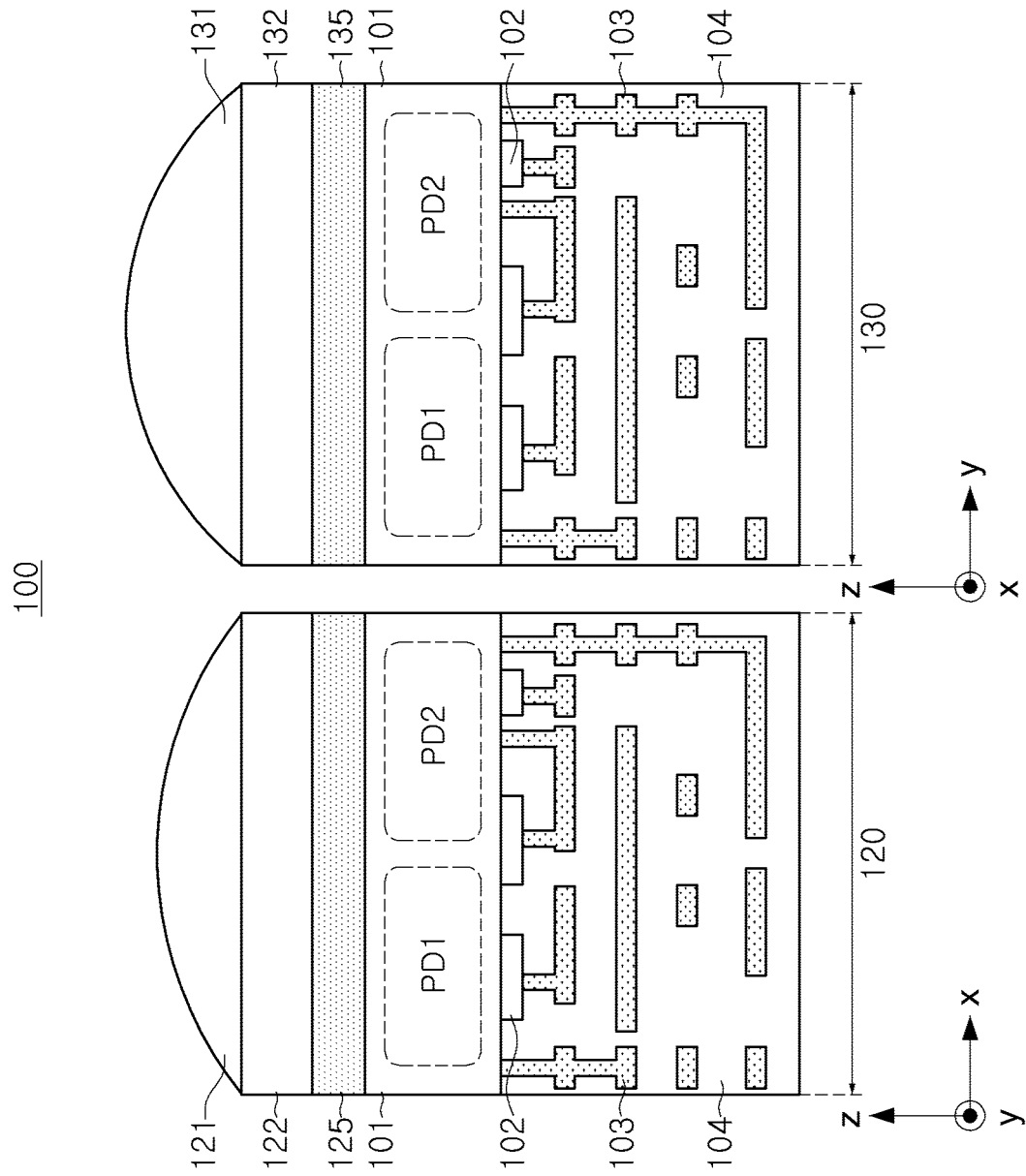
FIGS. 9 to 11 illustrate pixels included in an image sensor according to some example embodiments.
Figure 10:
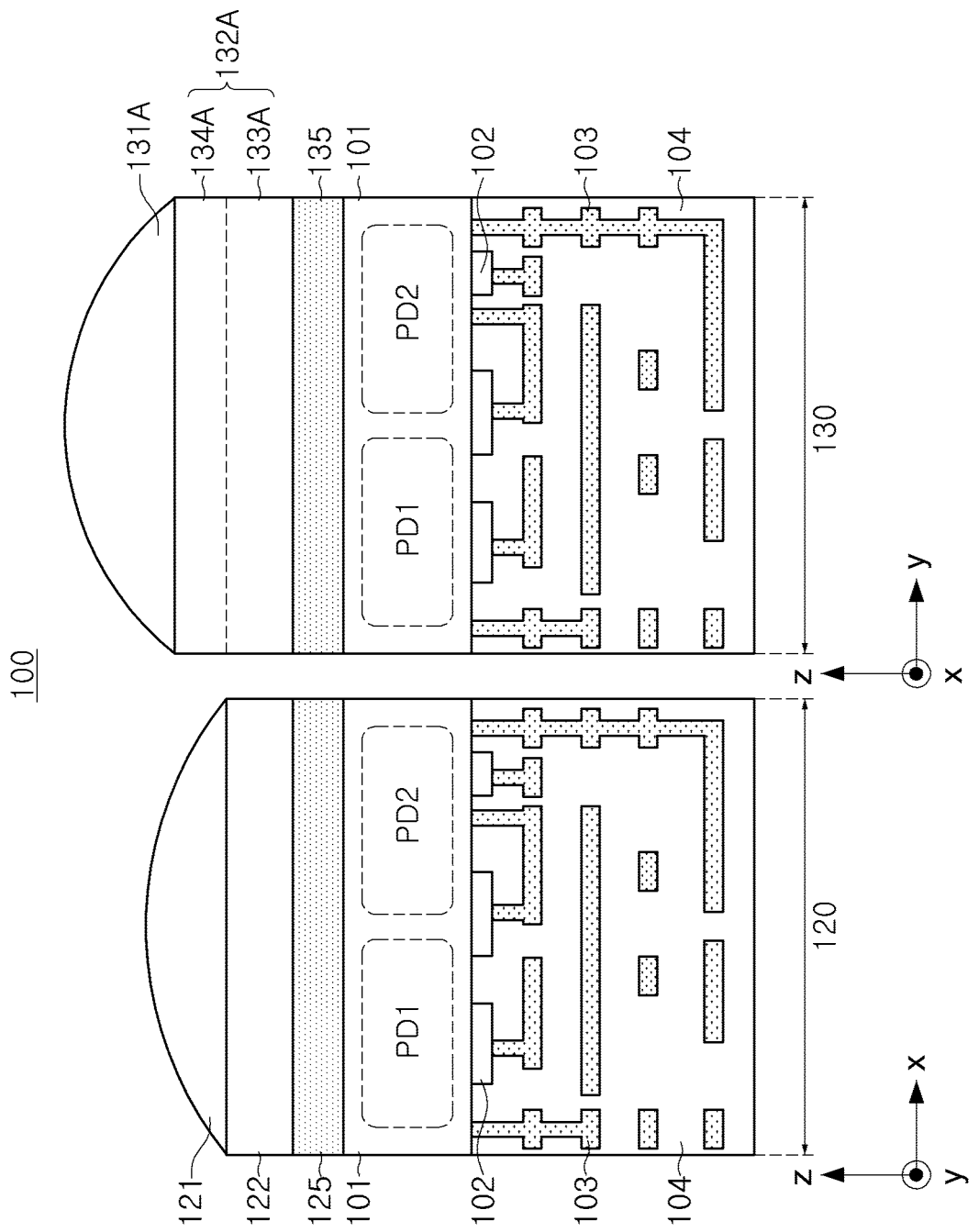
Figure 11:
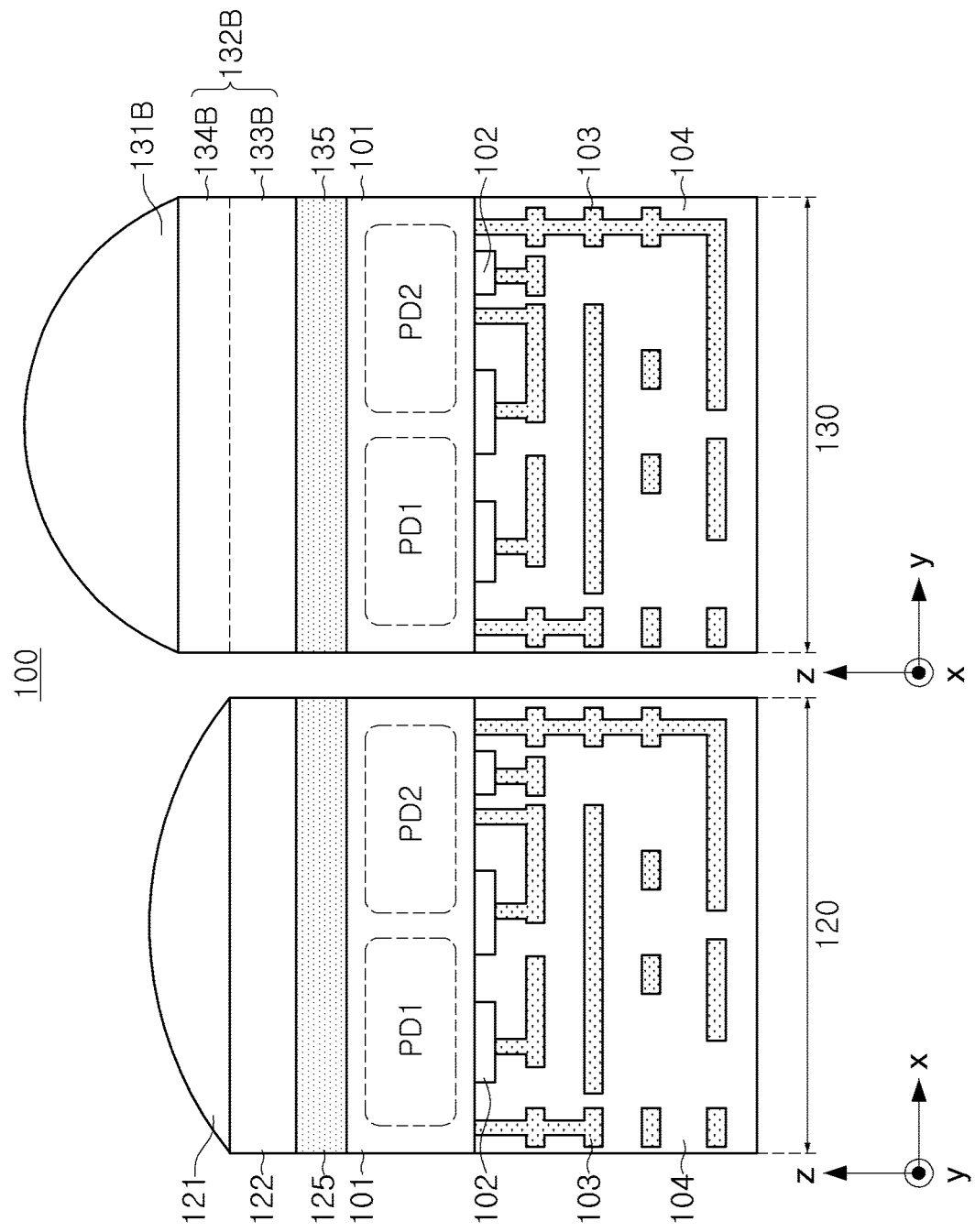

FIGS. 9 to 11 illustrate pixels included in an image sensor according to some example embodiments.

As an example, FIGS. 9 to 11 are cross-sectional views of various embodiments of the first autofocus pixel 120 and the second autofocus pixel 130 in the pixel array 100 illustrated in FIG. 7. In each of the embodiments illustrated in FIGS. 9 to 11, each of the first autofocus pixel 120 and the second autofocus pixel 130 may include a first photodiode PD1 and a second photodiode PD2 in a semiconductor substrate 101. In each of the first autofocus pixel 120 and the second autofocus pixel 130, the first photodiode PD1 and the second photodiode PD2 may be connected to elements 102, and the elements 102 may provide a pixel circuit together with interconnection patterns 103. The elements 102 and the interconnection patterns 103 may be covered with an insulating layer 104.

A light-receiving area of each of the first photodiode PD1 and the second photodiode PD2 may be smaller than a light-receiving area of a photodiode included in the general pixel 110. As an example, the first photodiode PD1 may be defined as a first sub-photodiode, and the second photodiode PD2 may be defined as a second sub-photodiode.

Referring to FIG. 9, the first autofocus pixel 120 may include a first microlens 121, a first light transmission layer 122, and a first color filter 125 in an incident path of light. In some embodiments, each autofocus pixel 120 may comprise a pixel circuit (which includes the elements 102 and the interconnection patterns 103), photodiodes PD1 and PD2, a first color filter 125, a first light transmission layer 122, and a first microlens 121 that are sequentially stacked. In addition, the second autofocus pixel 130 may include a second microlens 131, a second light transmission layer 132, and a second color filter 135 in an incident path of light. In some embodiments, each autofocus pixel 130 may comprise a pixel circuit (which includes the elements 102 and the interconnection patterns 103), photodiodes PD1 and PD2, a second color filter 135, a second light transmission layer 132, and a second microlens 131 that are sequentially stacked According to some example embodiments, wavelength bands of lights respectively passing through the first color filter 125 and the second color filter 135 may be the same or different from each other. As noted by the different axes in FIG. 9, in the first autofocus pixel 120 the first photodiode PD1 and the second photodiode PD2 may be adjacent to each other in a first direction (e.g., an X-axis direction) and in the second autofocus pixel 130 the first photodiode PD1 and the second photodiode PD2 may be adjacent to each other in a second direction (e.g., a Y-axis direction).

In the example embodiment illustrated in FIG. 9, the first microlens 121 may have a larger radius of curvature than the second microlens 131. A radius of curvature may be inversely proportional to a curvature, so that an upper surface of the second microlens 131 may be higher than an upper surface of the first microlens 121. Since the second microlens 131 has a relatively smaller radius of curvature, a numerical aperture of the second autofocus pixel 130 may be increased and may effectively compensate for a decrease in numerical aperture resulting from a D-cut lens (not shown) in front of the pixel array 100. In some example embodiments, the radius of curvature of the first microlens 121 may be the same as a radius of curvature of a microlens included in the general pixel 110.

In some example embodiments, a ratio of the radius of curvature of the first microlens 121 to and the radius of curvature of the second microlens 131 may be determined according to a shape of the D-cut lens. When the D-cut lens has a first width in the first direction and a second width in the second direction that is smaller than the first width, the ratio of the radius of curvature of the first microlens 121 and the radius of curvature of the second microlens 131 may correspond to a ratio of the first width to the second width. For example, when the first width is N times the second width (where N is a number greater than 1), the radius of curvature of the first microlens 121 may be N times the radius of curvature of the second microlens 131.

Referring to FIG. 10, the first autofocus pixel 120 may include a first microlens 121, a first light transmission layer 122, and a first color filter 125 in an incident path of light, as described with reference to FIG. 9. The second autofocus pixel 130 may include a second microlens 131A, a second light transmission layer 132A, and a second color filter 135 in an incident path of light. In the example embodiment illustrated in FIG. 10, the first microlens 121 and the second microlens 131A may have the same radius of curvature; that is, the radii of curvature of the first microlens 121 and the second microlens 131A may equal each other. Accordingly, as illustrated in FIG. 10, an upper surface of the first microlens 121 and an upper surface of the second microlens 131A may have the same shape.

In the example embodiment illustrated in FIG. 10, the first light transmission layer 122 and the second light transmission layer 132A may have different thicknesses. For example, the second light transmitting layer 132A may have a larger thickness than the first light transmitting layer 122. Accordingly, the second autofocus pixel 130 may have a smaller focal length than the first autofocus pixel 120. Since the numerical aperture is in inverse proportion to the focal length, the second light transmission layer 132A may be formed to have a greater thickness to increase a numerical aperture of the second autofocus pixel 130. As a result, a decrease in the aperture resulting from the D-cut lens may be compensated for and an autofocusing function of the image sensor may be improved.

According to some example embodiments, the second light transmission layer 132A may include a lower light transmission layer 133A and an upper light transmission layer 134A, and the upper light transmission layer 134A may be between the lower light transmission layer 133A and the second microlens 131A. The upper light transmission layer 134A may be formed of the same material as the lower light transmission layer 133A, or may be formed of a material different from a material of the lower light transmission layer 133A.

When the upper light transmission layer 134A is formed of a material different from a material of the lower light transmission layer 133A, the upper light transmission layer 134A may be formed of the same material as the second microlens 131A. Alternatively, the upper light transmission layer 134A may be formed of a material having a relatively lower refractive index than the lower light transmission layer 133A. The material of the upper light transmission layer 134A may be selected as described above, so that a height of the second autofocus pixel 130 may be increased to significantly reduce a decrease in the intensity of light incident on neighboring pixels.

Referring to FIG. 11, a radius of curvature of the second microlens 131B and a thickness of the second light transmission layer 132B included in the second autofocus pixel 130 may be different from the radius of curvature of the first microlens 121 and the thickness of the first light transmission layer 122 included in the first autofocus pixel 120. In the example embodiment illustrated in FIG. 11, the radius of curvature of the second microlens 131B may be smaller than the radius of curvature of the first microlens 121, and the thickness of the second light transmission layer 132B may be greater than the thickness of the first light transmission layer 122. Therefore, an upper surface of the second microlens 131B may be higher than an upper surface of the first microlens 121, and the numerical aperture of the second autofocus pixel 130 may be increased to compensate for a decrease in the numerical aperture resulting from the disposition of the D-cut lens.

Figure 12:
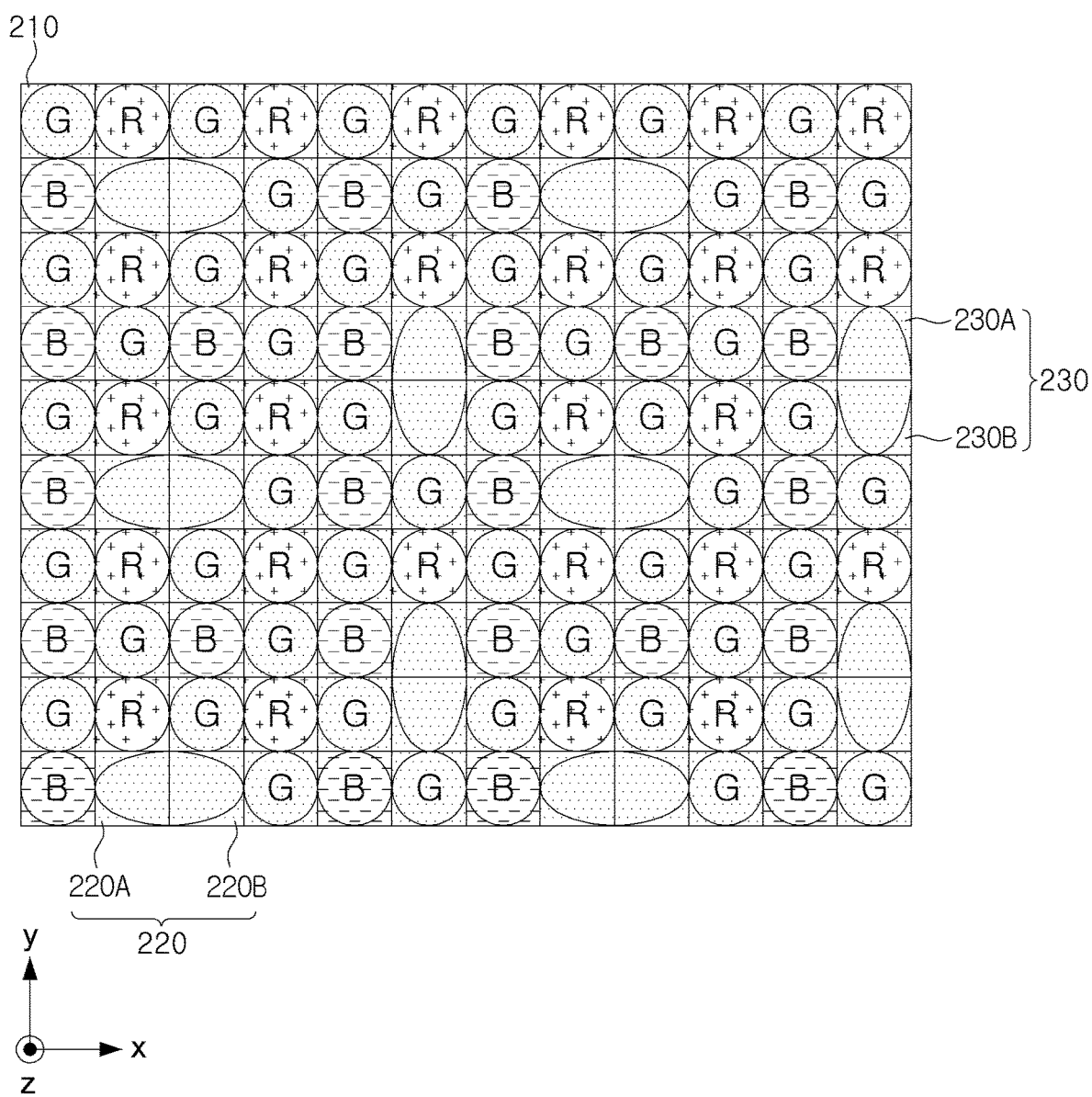
FIG. 12 illustrates a pixel array of an image sensor according to some example embodiments.
Figure 13:
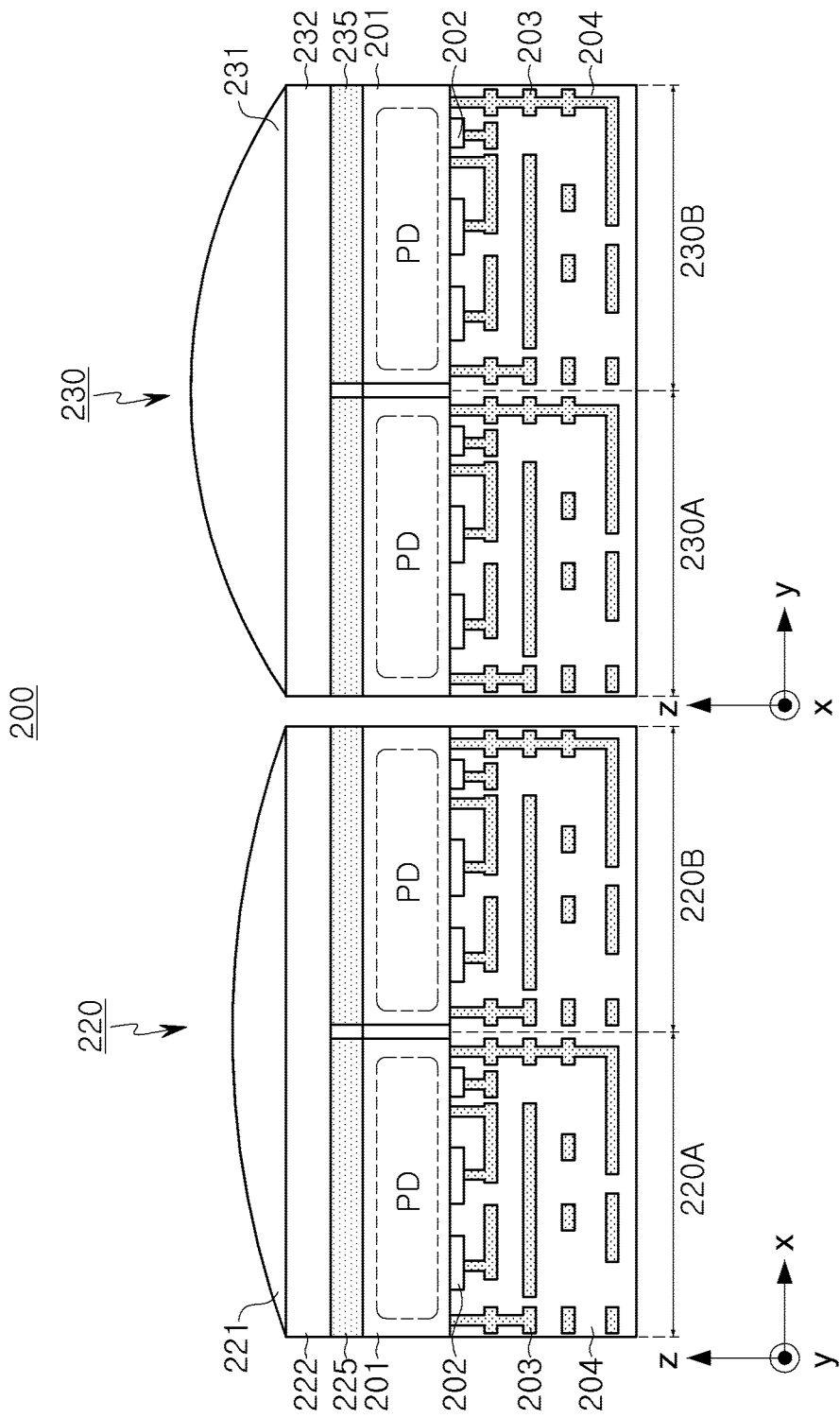
FIGS. 13 and 14 illustrate pixels included in an image sensor according to some example embodiments.
Figure 14:
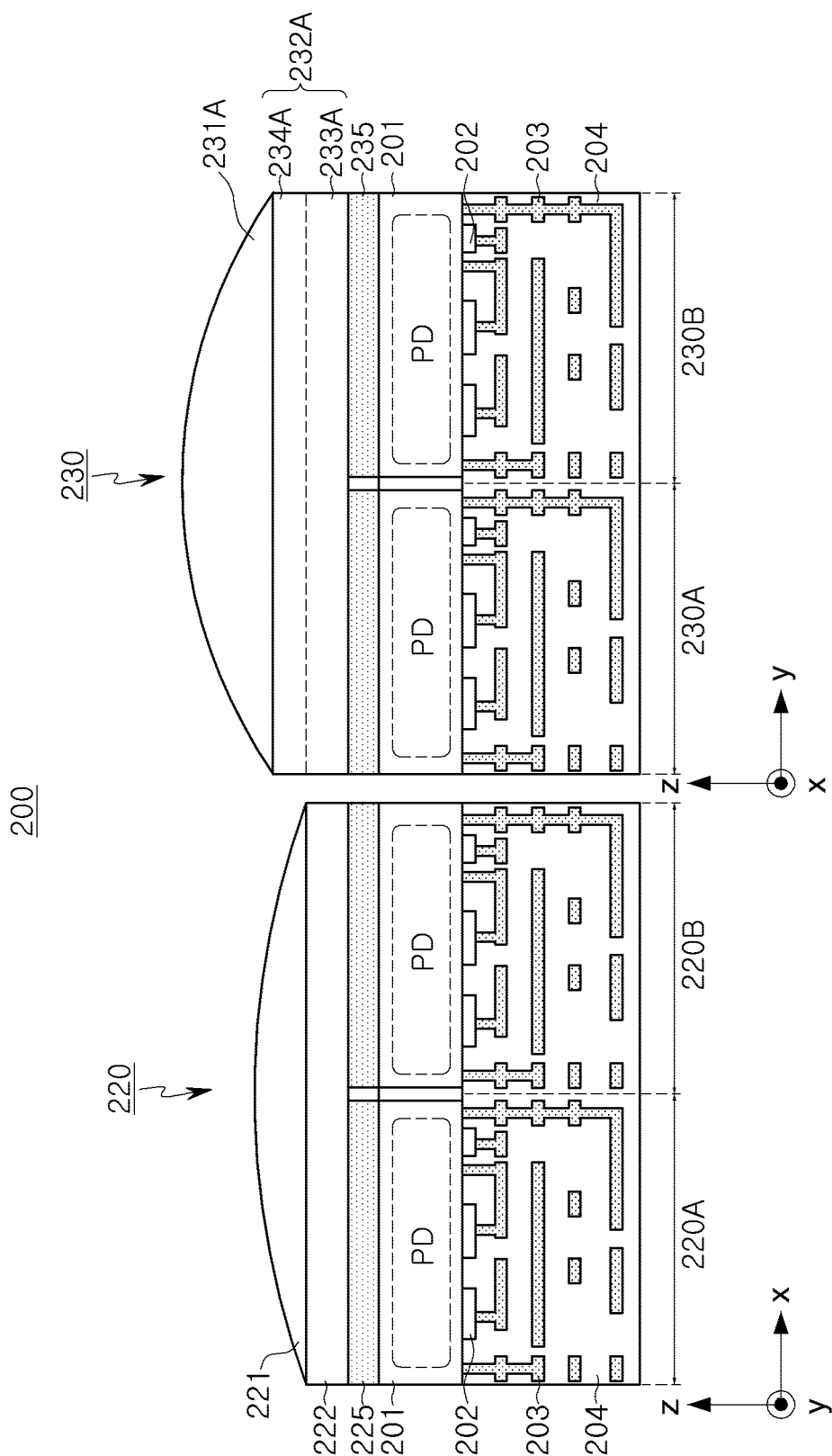

FIG. 12 illustrates a pixel array of an image sensor according to some example embodiments. FIGS. 13 and 14 illustrate pixels included in the image sensor of FIG. 12, according to some example embodiments.

Referring to FIG. 12, a pixel array 200 of an image sensor according to some example embodiments may include a plurality of pixels 210 to 230 arranged in a first direction (an X-axis direction) and a second direction (a Y-axis direction). The pixel array 200 may include general pixels 210, first autofocus pixels 220, and second autofocus pixels 230. As with the discussion of FIG. 7, although multiple first autofocus pixels 220 and second autofocus pixels 230 are present in the pixel array 200 illustrated in FIG. 12, the discussion herein will be of a first autofocus pixel 220 and a second autofocus pixel 230 for convenience of description, with the understanding that the discussion thereof is applicable to each of the first autofocus pixels 220 and second autofocus pixels 230 that are present in the pixel array 200.

As seen in FIGS. 13 and 14, the first autofocus pixel 220 may include a first pixel 220A and a second pixel 220B adjacent to each other in the first direction, and the second autofocus pixel 230 may include a first pixel 230A and the a second pixel 230B adjacent to each other in the second direction. Accordingly, a second light receiving area of each of the first autofocus pixel 220 and the second autofocus pixel 230 may be larger than a first light receiving area of the general pixel 210. For example, a light receiving area of each of the first pixels 220A and 220B and each the second pixels 230A and 230B may be substantially the same as the first light receiving area, and the second light receiving area (that is, the light receiving area of the first autofocus pixel 220 or the second autofocus pixel 230 as a whole) may be twice the first light receiving area.

Each of the first autofocus pixel 220 and the second autofocus pixel 230 may include a single microlens. Therefore, the first pixel 220A and the second pixel 220B and the second autofocus pixel 230 may share a single microlens in the first autofocus pixel 220, and the first pixel 230A and the second pixel 230B may share a single microlens in the second autofocus pixel 230.

Referring to FIGS. 13 and 14, each of the first autofocus pixel 220 and the second autofocus pixel 230 may include a photodiode PD in the semiconductor substrate 201. Each of the first pixels 220A and 230A and the second pixels 220B and 230B may include a photodiode PD, elements 202 and interconnection patterns 203 providing a pixel circuit, an insulating layer 204, and other components not seen in FIGS. 13 and 14.

Color filters 225 and 235, light transmission layers 222 and 232, and microlenses 221 and 231 may be on a semiconductor substrate 201. As described above, the first pixel 220A and the second pixel 220B included in the first autofocus pixel 220 may share the first microlens 221. Similarly, the first pixel 230A and the second pixel 230B included in the second autofocus pixel 230 may share the second microlens 231. According to some example embodiments, wavelength bands of lights respectively passing through the color filter 225 and the color filter 235 may be the same or different from each other.

An upper surface of the first microlens 221 may be at the same height as an upper surface of the microlens included in the general pixel 210. However, since the light receiving area of each of the autofocus pixels 220 and 230 is larger than a light receiving area of the general pixel 210, a radius of curvature of the first microlens 221 may be greater than a radius of curvature of a microlens included in the general pixel 210.

Referring to FIG. 13, the first microlens 221 and the second microlens 231 may have different radii of curvature. As an example, the radius of curvature of the first microlens 221 may be greater than the radius of curvature of the second microlens 231. An upper surface of the first microlens 221 may be lower than an upper surface of the second microlens 231, and a numerical aperture of the second autofocus pixel 230 may be greater than a numerical aperture of the first autofocus pixel 220. Thus, deterioration in performance of autofocusing function may be prevented from the presence of a D-cut lens in front of the pixel array 200.

As described above, the D-cut lens in front of the pixel array 200 may be a D-cut lens having an edge extending in a first direction (an X-axis direction), and a first width in the first direction may be larger than a second width in a second direction (a Y-axis direction). In some example embodiments, a ratio of a radius of curvature of the first microlens 221 to a radius of curvature of the second microlens 231 may be selected or determined based on a ratio of the first width to the second width.

Referring to FIG. 14, the first microlens 221 and the second microlens 231A may have the same radius of curvature. Accordingly, as illustrated in FIG. 14, an upper surface of the first microlens 221 and an upper surface of the second microlens 231A may have the same shape.

In some example embodiments, and as illustrated in FIG. 14, the first light transmission layer 222 and the second light transmission layer 232A may have different thicknesses. For example, the second light transmission layer 232A may include a lower light transmission layer 233A and an upper light transmission layer 234A and may have a greater thickness than the first light transmission layer 222. As an example, the lower light transmission layer 233A may have substantially the same thickness as the first light transmission layer 222, and the thickness of the second light transmission layer 232A may increase by the thickness of the upper light transmission layer 234A.

Due to the thickness of the second light transmission layer 232A, the second autofocus pixel 230 may have a smaller focal length than the first autofocus pixel 220. Since a numerical aperture is in inverse proportion to a focal length, the second light transmission layer 232A may be formed to have a greater thickness to increase the numerical aperture of the second autofocus pixel 230. As a result, a decrease in the aperture, resulting from the D-cut lens, may be compensated for and an autofocusing function of the image sensor may be improved. The upper light transmission layer 234A may be formed of a material having a lower refractive index than the lower light transmission layer 233A and the first light transmission layer 222. For example, the upper light transmission layer 234 may be formed of the same material as the microlenses 221 and 231A.

In addition, the inventive concepts described with reference to FIGS. 13 and 14 may be simultaneously applied to the second autofocus pixel 230. For example, in the second autofocus pixel 230, the second microlens 231 may be formed to have a smaller radius of curvature than the first microlens 221, and the second light transmission layer 232A may be formed to have a greater thickness than the transmission layer 222.

Figure 15:
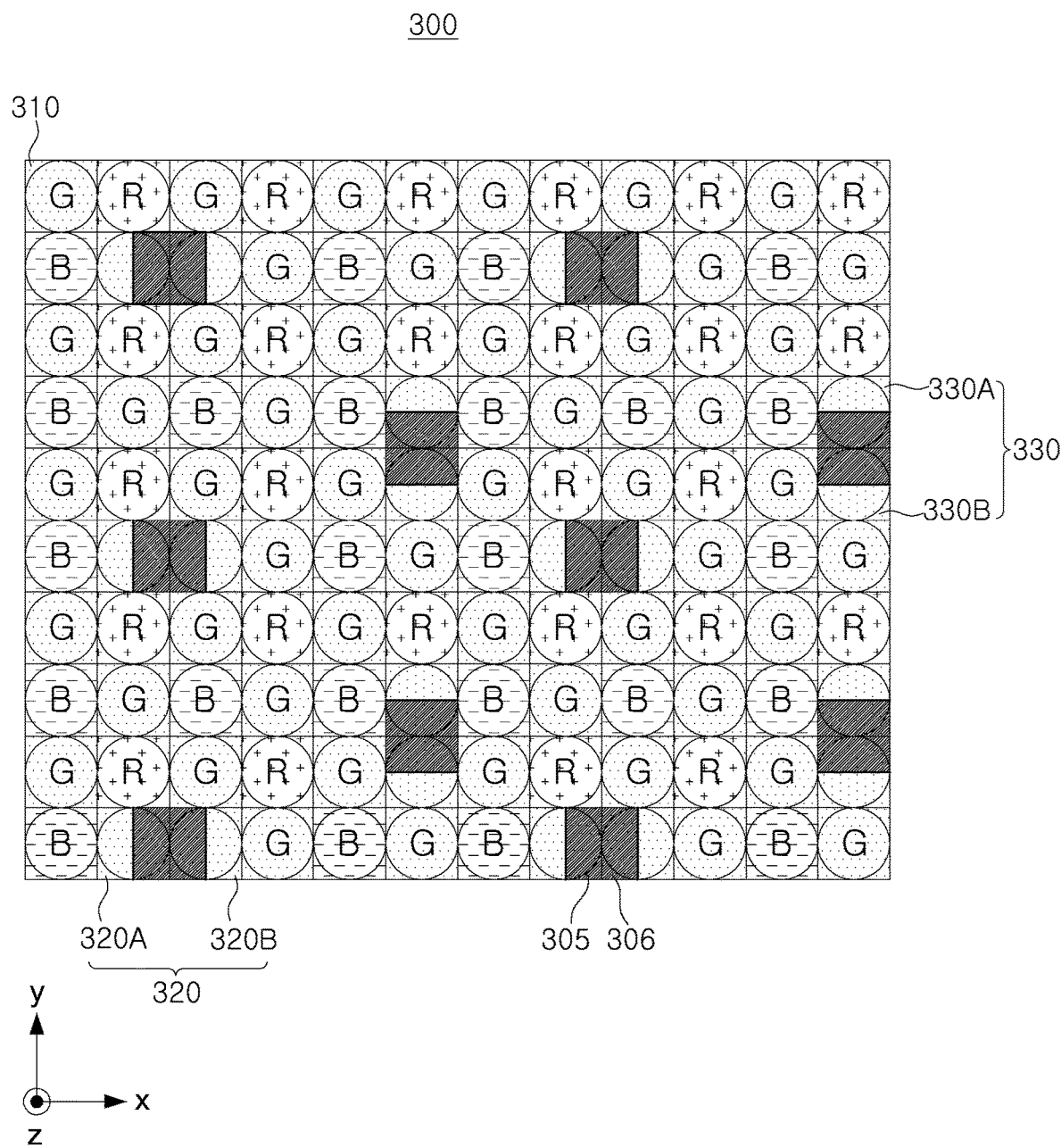
FIG. 15 illustrates a pixel array of an image sensor according to some example embodiments.
Figure 16:
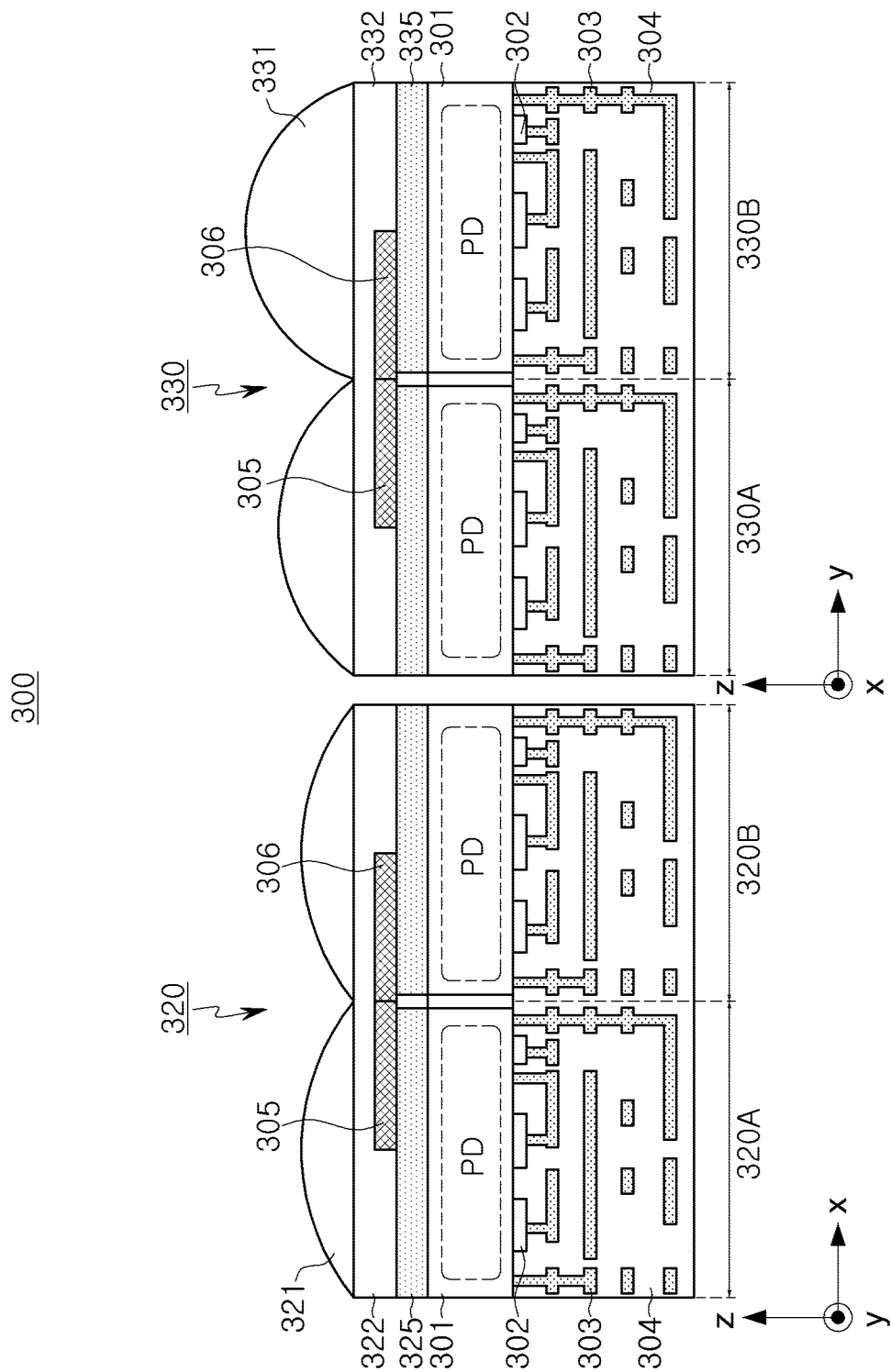
FIGS. 16 and 17 illustrate pixels included in an image sensor according to some example embodiments.
Figure 17:
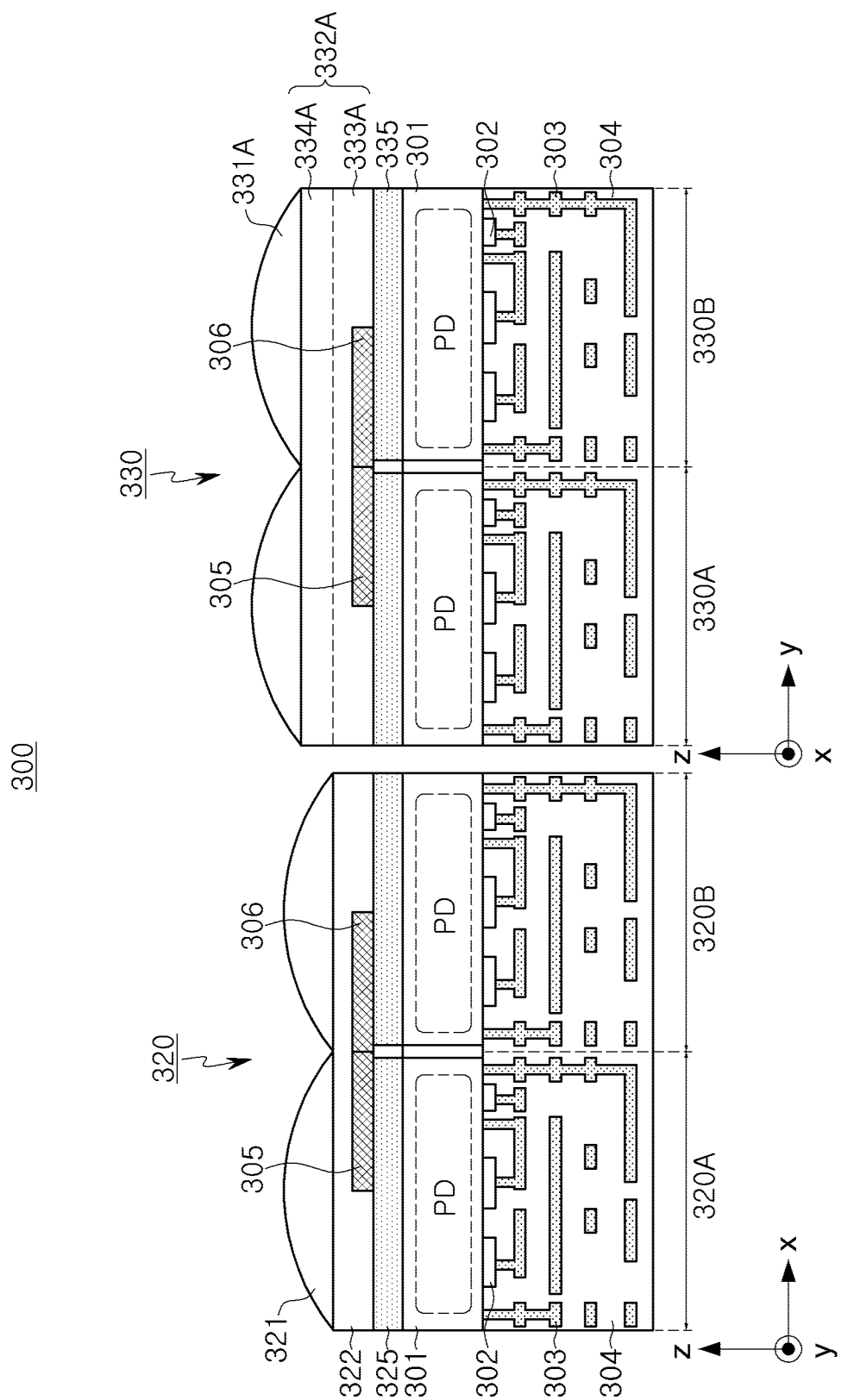

FIG. 15 illustrates a pixel array of an image sensor according to some example embodiments. FIGS. 16 and 17 illustrate pixels included in the image sensor of FIG. 15, according to some example embodiments.

Referring to FIG. 15, a pixel array 300 of an image sensor according to an example embodiment may include a plurality of pixels disposed in a first direction (e.g., an X-axis direction) and a second direction (e.g., a Y-axis direction). The pixel array 300 may include a general pixel 310, first autofocus pixels 320, and second autofocus pixels 330. As with the discussion of FIG. 7, although multiple first autofocus pixels 320 and second autofocus pixels 330 are present in the pixel array 300 illustrated in FIG. 15, the discussion herein will be of a first autofocus pixel 320 and a second autofocus pixel 330 for convenience of description, with the understanding that the discussion thereof is applicable to each of the first autofocus pixels 320 and second autofocus pixels 330 that are present in the pixel array 300.

The first autofocus pixel 320 may include a first pixel 320A and a second pixel 320B adjacent to each other in the first direction, and the second autofocus pixel 330 may include a first pixel 330A and the second pixel 330B adjacent to each other in the second direction. Therefore, a second light receiving area of each of the first autofocus pixel 320 and the second autofocus pixel 330 may be larger than a first light receiving area of the general pixel 310. As an example, a light receiving area of each of the first pixels 320A and 320B and the second pixels 330A and 330B may be substantially the same as the first light receiving area, and the second light receiving area (that is, the light receiving area of the first autofocus pixel 320 or the second autofocus pixel 330 as a whole) may be twice as large as the first light receiving area.

In contrast to the example embodiments described with reference to FIG. 12, in the first autofocus pixel 320, each of the first pixel 320A and the second pixel 320B may include a microlens and in the second autofocus pixel 330, each of the first pixel 330A and the second pixel 330B may include a microlens. In addition, each of the first pixels 320A and 330A and the second pixels 320B and 330B may include a first blocking layer 305 and a second blocking layer 306 that are configured to block light. As an example, the first blocking layer 305 and the second blocking layer 306 may be adjacent to each other or physically connected to each other at a boundary between the first pixels 320A and 330A and the second pixels 320B and 330B. Hereinafter, this will be described in more detail with reference to FIGS. 16 and 17.

FIGS. 16 and 17 are views illustrating structures of the first autofocus pixel 320 and the second autofocus pixel 330 in the pixel array 300 illustrated in FIG. 15 according to some example embodiments. In each of the embodiments illustrated in FIGS. 16 and 17, each of the first autofocus pixel 320 and the second autofocus pixel 330 may include a photodiode PD in a semiconductor substrate 301. Each of the first pixels 320A and 330A and the second pixels 320B and 330B may include a photodiode PD, elements 302 and interconnection patterns 303 providing a pixel circuit, an insulating layer 304, and other components not illustrated in FIGS. 16 and 17.

Color filters 325 and 335, light transmission layers 322 and 332, and microlenses 321 and 331 may be arranged on the semiconductor substrate 301. As described above, each of the first pixels 320A and 330A may include a first microlens 321, and each of the second pixels 320B and 330B may include a second microlens 331.

Referring to FIG. 16, the first microlens 321 and the second microlens 331 may have different radii of curvature. As an example, the radius of curvature of the first microlens 321 may be larger than the radius of curvature of the second microlens 331. Therefore, numerical apertures of the first pixel 330A and the second pixel 320B included in the second autofocus pixel 330 are smaller than numerical apertures of the first pixel 320A and the second pixel 320B included in the first autofocus pixel 320. The different radii of curvature may prevent a deterioration in the performance of an autofocusing function resulting from the presence of a D-cut lens in a path of light incident on the pixel array 300. The D-cut lens in front of the pixel array 300 may be a D-cut lens having an edge extending in a first direction (e.g., an X-axis direction) and a first width in the first direction may be greater than a second width of the D-cut lens in a second direction (e.g., a Y-axis direction). In some example embodiments, a ratio of a radius of curvature of the first microlens 321 to a radius of curvature of the second microlens 331 may be determined based on a ratio of the first width to the second width.

Referring to FIG. 17, the first microlens 321 and the second microlens 331A may have the same radius of curvature. Therefore, an upper surface of the first microlens 321 and an upper surface of the second microlens 331A may have the same shape.

In the example embodiment illustrated in FIG. 17, the first light transmission layer 322 and the second light transmission layer 332A may have different thicknesses. As an example, the second light transmission layer 332A may have a greater thickness than the first light transmission layer 322 and may include a lower light transmission layer 333A and an upper light transmission layer 334A. As an example, the lower light transmission layer 333A may have substantially the same thickness as the first light transmission layer 322, and the thickness of the second light transmission layer 332A may be increased by the thickness of the upper light transmission layer 334A.

Due to the second light transmission layer 332A, the second autofocus pixel 330 may have a smaller focal length than the first autofocus pixel 320. Since numerical aperture is inversely proportional to focal length, a numerical aperture of the second autofocus pixel 330 may be larger than a numerical aperture of the first autofocus pixel 320. Accordingly, a decrease in numerical aperture resulting from the presence of a D-cut lens may be compensated for, and an autofocusing function of the image sensor may be improved. The upper light transmission layer 334A may be formed of a material having a lower refractive index than the lower light transmission layer 333A and the first light transmission layer 322. For example, the upper light transmission layer 334A may be formed of the same material as the microlenses 321 and 331A. However, according to some example embodiments, the upper light transmission layer 334A may be formed of the same material as the lower light transmission layer 333A.

Figure 18:
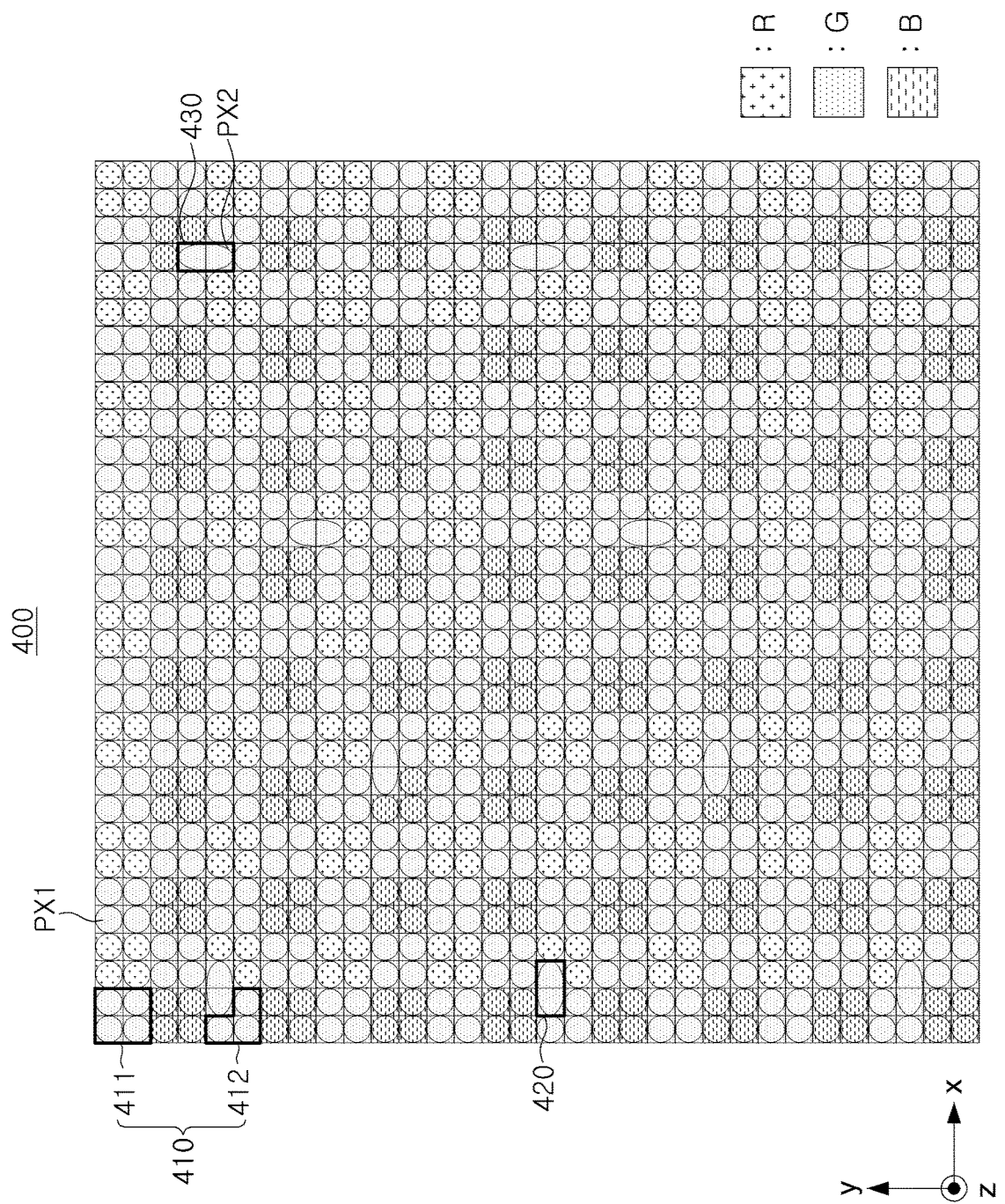
FIG. 18 illustrates a pixel array of an image sensor according to some example embodiments.

FIG. 18 illustrates a pixel array of an image sensor according to some example embodiments.

Referring to FIG. 18, a pixel array 400 of an image sensor according to some example embodiments may include a plurality of pixels PX1 and PX2 arranged in a first direction (an X-axis direction) and a second direction (a Y-axis direction). In the example embodiment illustrated in FIG. 18, two or more first pixels PX1 adjacent to each other in at least one of the first direction and the second direction may provide general pixel blocks 410. In addition, a pair of second pixels PX2 adjacent to each other in the first direction or the second direction may provide autofocus pixel blocks 420 and 430. The number of the first pixels PX1 may be greater than the number of the second pixels PX2, although the present disclosure is not limited thereto. An area in which the first pixels PX1 are arranged may be defined as a general pixel area, and an area in which the second pixels PX2 are arranged may be defined as an autofocus pixel area.

The autofocus pixel blocks 420 and 430 may include a first autofocus pixel block 420 and a second autofocus pixel block 430. A pair of second pixels PX2 included in the first autofocus pixel block 420 may be adjacent to each other in the first direction, and a pair of second pixels PX2 included in the second autofocus pixel block 430 may be adjacent to each other in the second direction. The pair of second pixels PX2 included in each of the autofocus pixel blocks 420 and 430 may include color filters of the same color.

The pair of second pixels PX2 included in each of the autofocus pixel blocks 420 and 430 may share a single microlens. A microlens included in each of the autofocus pixel blocks 420 and 430 may have a radius of curvature different from a radius of curvature of a microlens included in each of the first pixels PX1. In some example embodiments, the radius of curvature of the microlens included in each of the first pixels PX1 may have a first value, and a radius of curvature of the single microlens shared by the pair of second pixels PX2 in each of the autofocus pixel blocks 420 and 430 may have a second value. The second value may be greater than the first value.

In some example embodiments, each of the first value and the second value is not a predetermined single value, and may be defined instead as a predetermined range. For example, the first value may be a value between a first minimum value and a first maximum value, and the second value may be a value between a second minimum value and a second maximum value. The range of the first value (that is, a difference between the first maximum value and the first minimum value) may be smaller than a range of the second value (that is, a difference between the second maximum value and the second minimum value). In some example embodiments, the difference between the first maximum value and the first minimum value may be several tens of nanometers, and the difference between the second maximum value and the second minimum value may be several hundreds of nanometers. The second minimum value may be greater than the first maximum value.

At least a portion of the general pixel blocks 410 may have different shapes. As an example, referring to FIG. 18, a first general pixel block 411 may include four first pixels PX1, while a second general pixel block 412 may include three first pixels PX1. The second general pixel block 412 may be adjacent or proximate to another second general pixel block 412 in at least one of the first direction and a second direction, and one of the autofocus pixel blocks 420 and 430 may be between a pair of second general pixel blocks 412 adjacent or proximate in the first direction or the second direction.

Figure 19A:
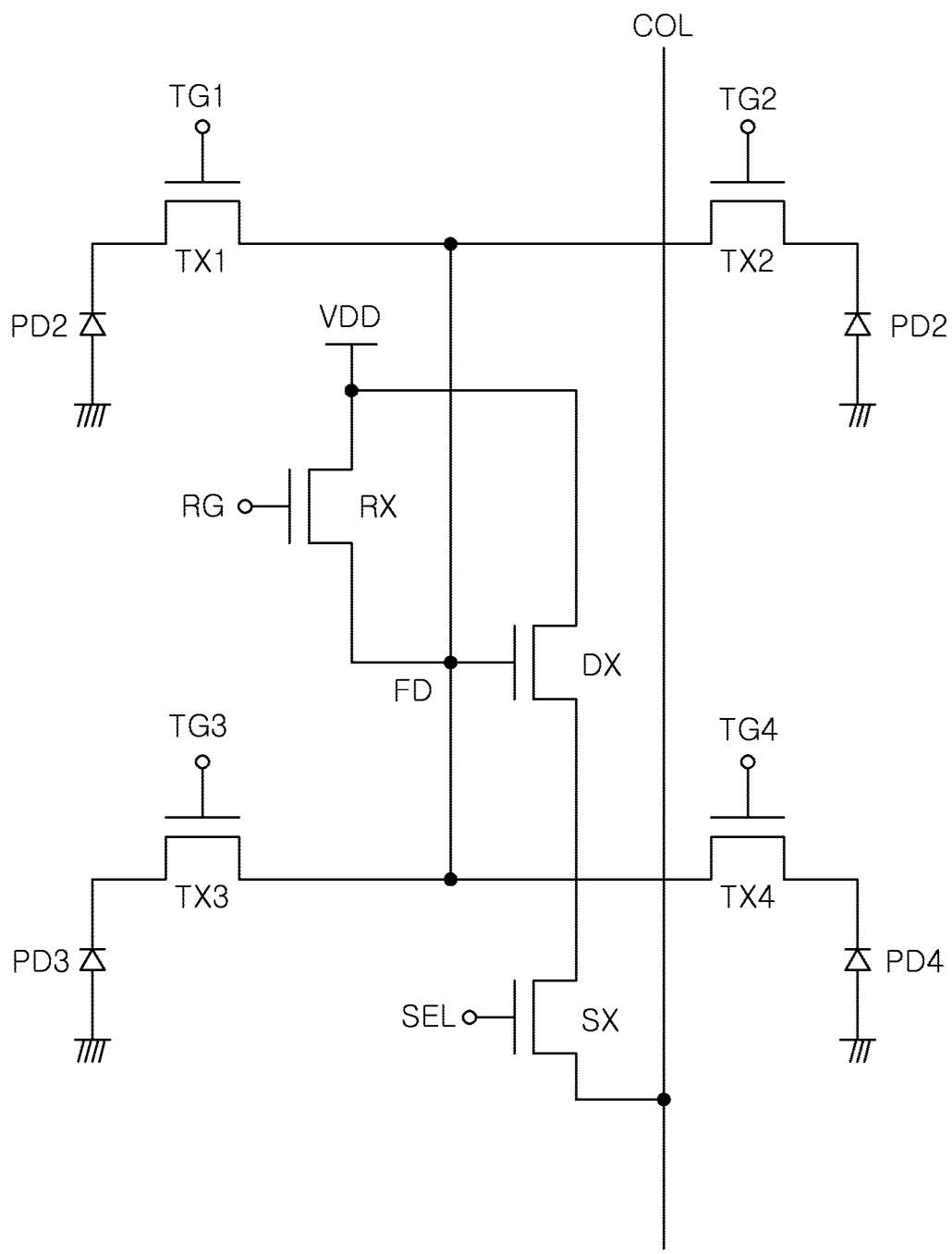
FIGS. 19A to 19C illustrate pixel circuits of an image sensor according to some example embodiments.
Figure 19B:
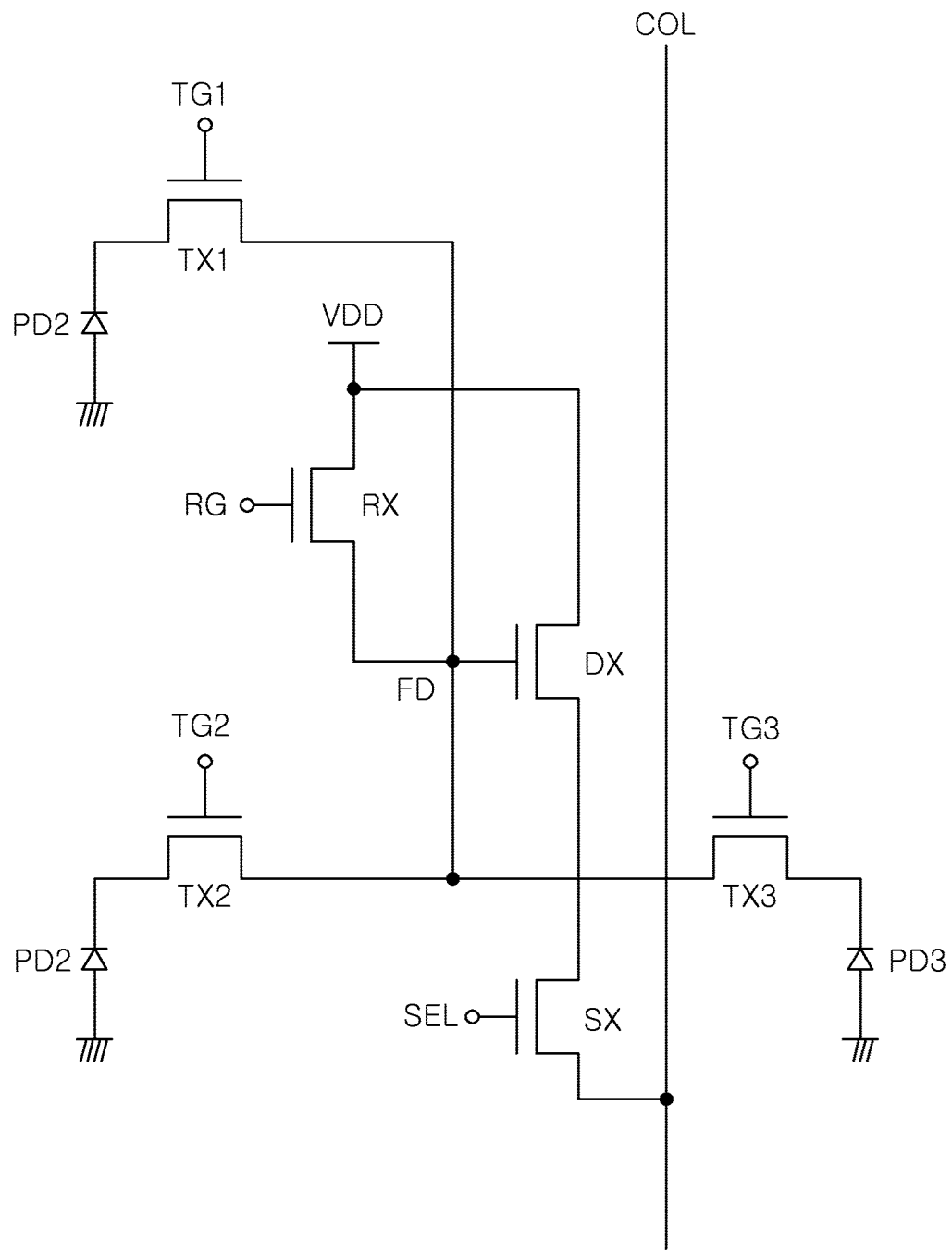
Figure 19C:
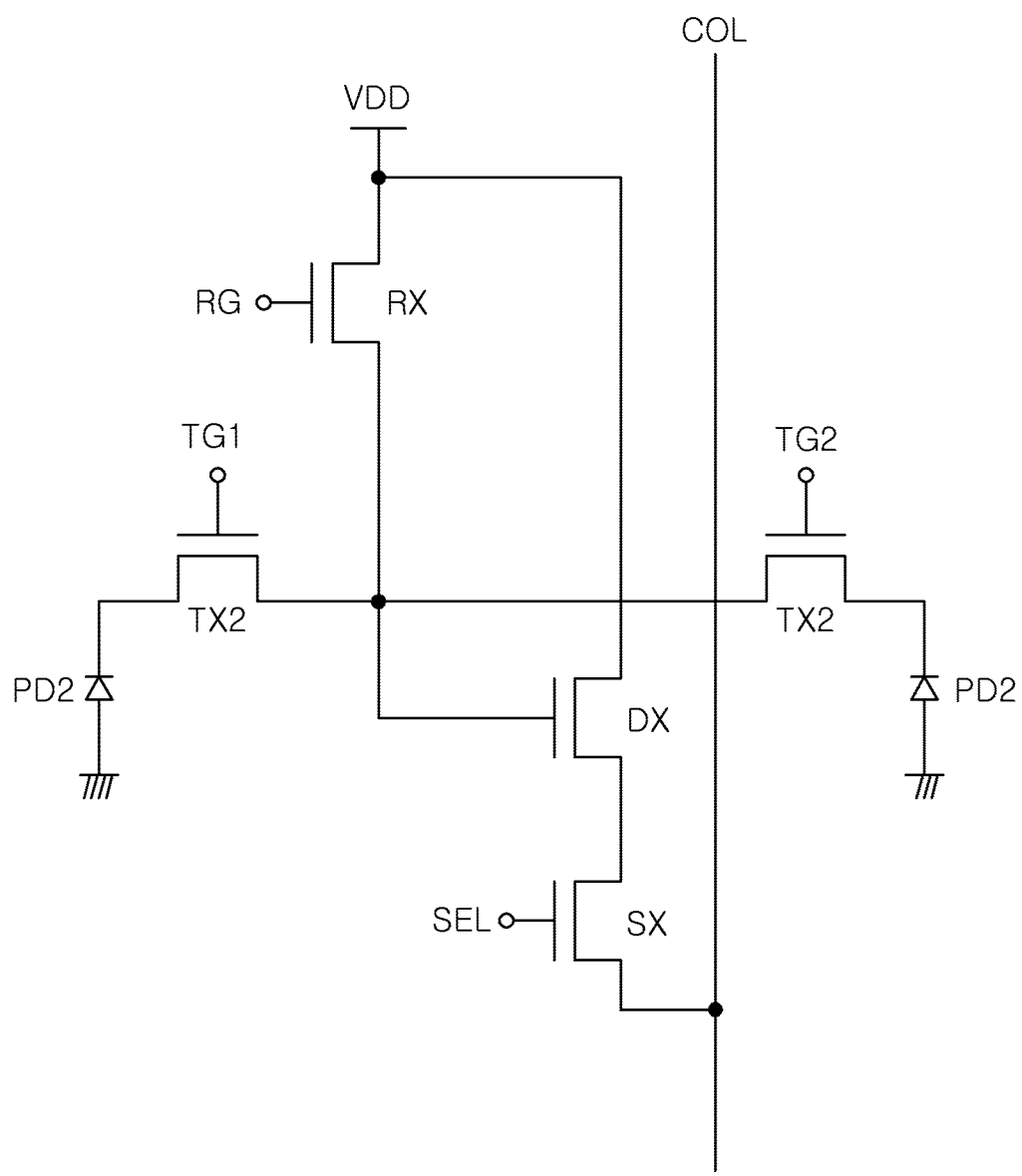

FIGS. 19A to 19C illustrate pixel circuits of an image sensor according to some example embodiments, respectively.

FIG. 19A is a circuit diagram illustrating a pixel circuit of the first general pixel block 411 in the pixel array 400 illustrated in FIG. 18, according to some example embodiments. Referring to FIG. 19A, the pixel circuit of the first general pixel block 411 may include a plurality of photodiodes PD1 to PD4, a plurality of transfer transistors TX1 to TX4, a reset transistor RX, a driving transistor SF, a selection transistor SX. In some example embodiments, other components may be present in the pixel block 411. The pixel circuit may be connected to a logic circuit of the image sensor through a column line COL, and the logic circuit of the image sensor may obtain a reset voltage and a pixel voltage through the column line COL to generate a pixel signal of the general pixel block 410.

Each of the first pixels PX1 included in the first general pixel block 411 may include one of the photodiodes PD1 to PD4 and one of the transfer transistors TX1 to TX4. The first pixels PX1 included in the first general pixel block 411 may share a floating diffusion region FD, a reset transistor RX, a driving transistor SF, a selection transistor SX, and other components as well.

FIG. 19B is a circuit diagram illustrating a pixel circuit of the second general pixel block 412 in the pixel array 400 illustrated in FIG. 18, according to some example embodiments. The second general pixel block 412 may include three first pixels PX1. Therefore, as illustrated in FIG. 19B, three photodiodes PD1 to PD3 and three transfer transistors TX1 to TX3 may share a floating diffusion FD, a reset transistor RX, a driving transistor SF, a selection transistor SX, and other components as well.

FIG. 19C is a circuit diagram illustrating a pixel circuit of the first autofocus pixel block 420 in the pixel array 400 illustrated in FIG. 18, according to some example embodiments. The first autofocus pixel block 420 may include a pair of second pixels PX2. Therefore, as illustrated in FIG. 19C, a pair of photodiodes PD1 and PD2 and a pair of transfer transistors TX1 and TX2 may share a floating diffusion region FD, a reset transistor RX, a driving transistor SF, a selection transistor SX, and other components as well. The pixel circuit of the second autofocus pixel block 430 may be similar to the pixel circuit of the first autofocus pixel block 420 that is illustrated in FIG. 19C.

Figure 20:
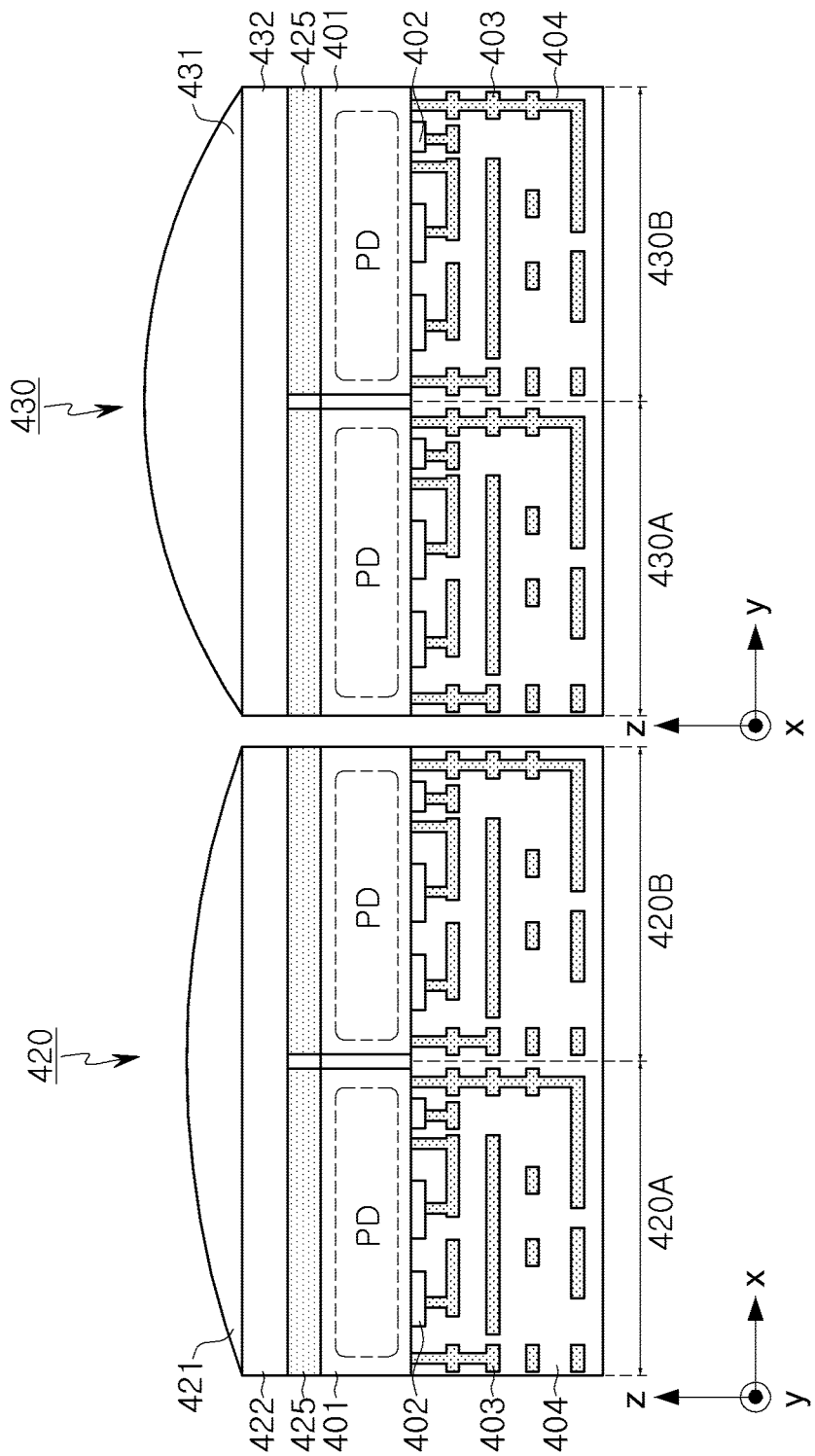
FIGS. 20 and 21 illustrate pixels included in an image sensor according to some example embodiments.
Figure 21:
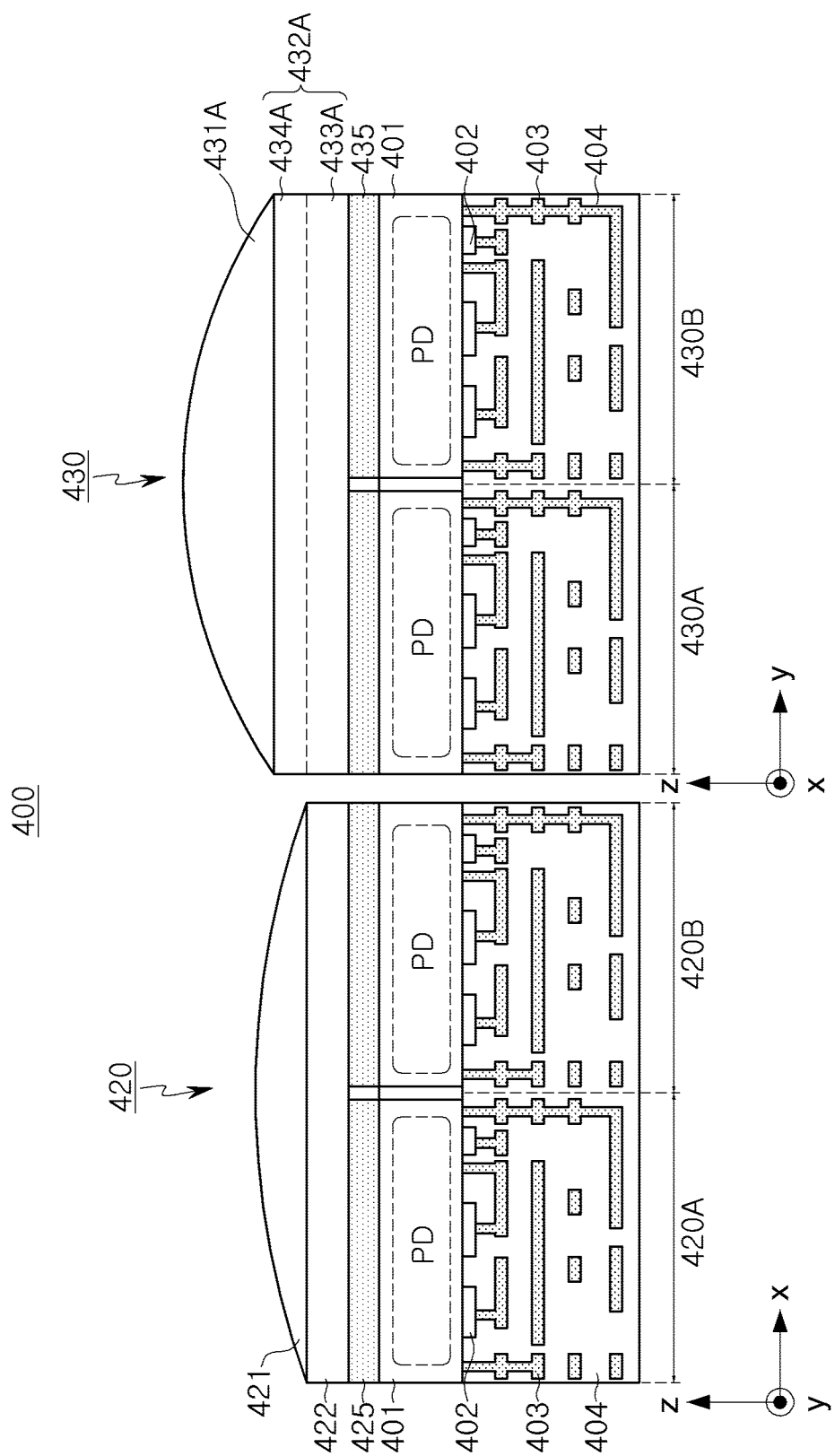

FIGS. 20 and 21 illustrate pixels included in an image sensor according to some example embodiments.

FIGS. 20 and 21 are views illustrating structures of the first autofocus pixel block 420 and the second autofocus pixel block 430 in the pixel array 400 illustrated in FIG. 18, according to some example embodiments. Each of the first autofocus pixel block 420 and the second autofocus pixel block 430 may include a pair of second pixels PX2. Each of the second pixels PX2 may include a semiconductor substrate 401 in which a photodiode PD is arranged, elements 402 and interconnection patterns 403 providing a pixel circuit, an insulating layer 404, and other components not illustrated in FIGS. 20 and 21.

Color filters 425, light transmission layers 422 and 432, and microlenses 421 and 431 may be arranged on the semiconductor substrate 401. The pair of second pixels PX2 included in the first autofocus pixel block 420 may share a first microlens 421, and the pair of second pixels PX2 included in the second autofocus pixel block 430 may share a second microlens 431. A radius of curvature of each of the first microlens 421 and the second microlens 431 may be greater than a radius of curvature of a microlens included in the first pixel PX1.

Referring to FIG. 20, the radius of curvature of the first microlens 421 may be greater than the radius of curvature of the second microlens 431. In the example embodiment illustrated in FIG. 21, a first microlens 421 and a second microlens 431A may have the same radius of curvature, and a first light transmission layer 422 and a second light transmission layer 432A may have different thicknesses. The second light transmission layer 432A may include a lower light transmission layer 433A and an upper light transmission layer 434A, and the upper light transmission layer 434A may have a lower refractive index than the lower light transmission layer 433A. In a similar manner to that which is described above with reference to FIGS. 13 and 14, in some embodiments the radius of curvature of the second microlens 431 may be smaller than the radius of curvature of the first microlens 421 and the second light transmission layer 432A may have a larger thickness than the first light transmission layer 422.

Figure 22:
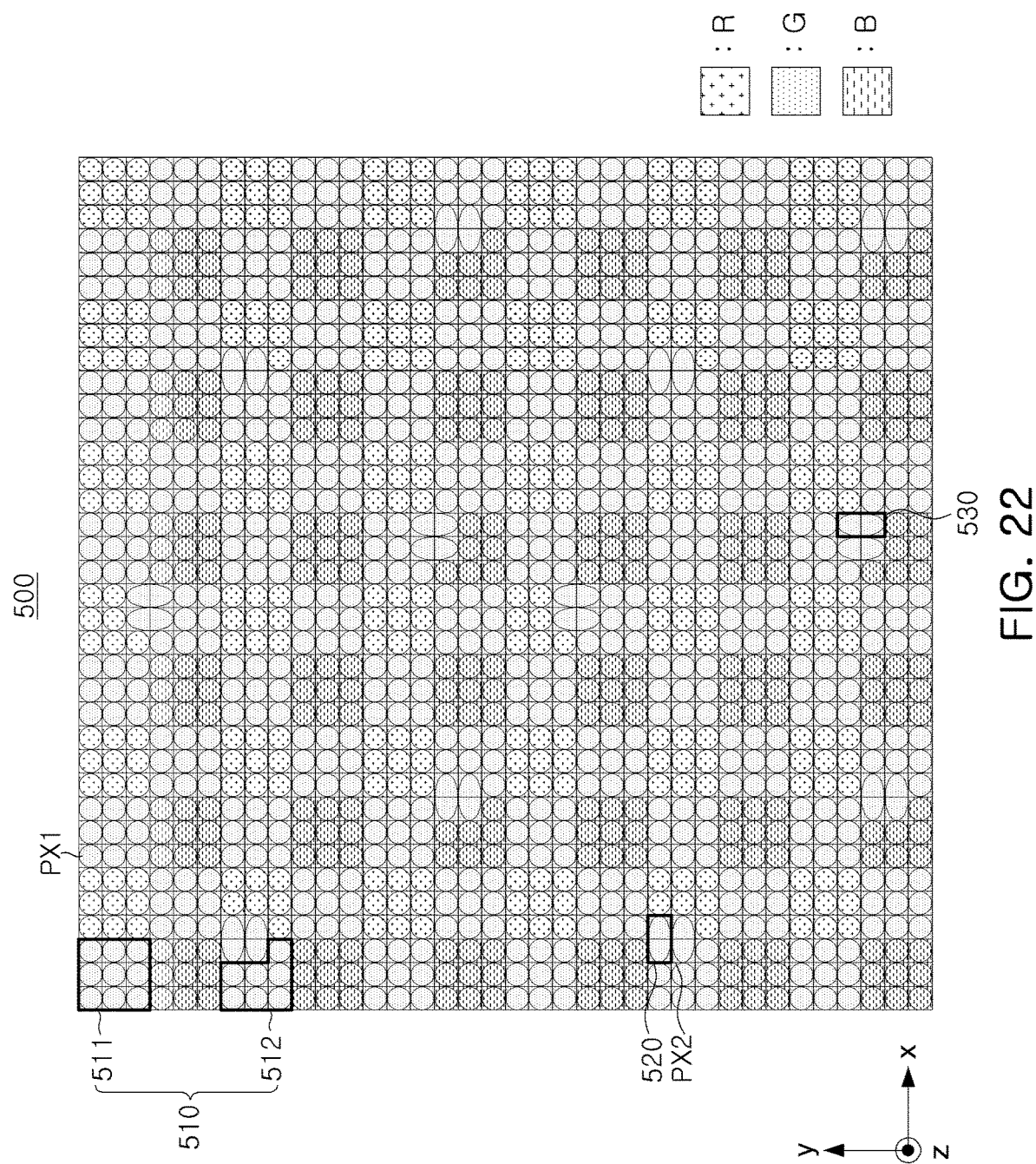
FIG. 22 illustrates a pixel array of an image sensor according to some example embodiments.

FIG. 22 illustrates a pixel array of an image sensor according to some example embodiments.

A pixel array 500 of an image sensor according to some example embodiments may include a plurality of pixels PX1 and PX2 arranged in a first direction (e.g., an X-axis direction) and a second direction (e.g., a Y-axis direction). Referring to FIG. 22, a plurality of first pixels PX1 adjacent to each other in at least one of the first direction and the second direction may provide general pixel blocks 510. A pair of second pixels PX2 adjacent to each other in the first direction or the second direction may provide autofocus pixel blocks 520 and 530. The number of first pixels PX1 may be greater than the number of second pixels PX2, although the present disclosure is not limited thereto.

Autofocus pixel blocks 520 and 530 may include a first autofocus pixel block 520 and a second autofocus pixel block 530. As with the discussion of FIG. 7, although multiple first autofocus pixels 520 and second autofocus pixels 530 are present in the pixel array 500 illustrated in FIG. 22, the discussion herein will be of a first autofocus pixel 520 and a second autofocus pixel 530 for convenience of description, with the understanding that the discussion thereof is applicable to each of the first autofocus pixels 520 and second autofocus pixels 530 that are present in the pixel array 500. A pair of second pixels PX2 included in the first autofocus pixel block 520 may be adjacent to each other in the first direction, and a pair of second pixels PX2 included in the second autofocus pixel block 530 may be adjacent to each other in the second direction. The pair of second pixels PX2 included in each of the autofocus pixel blocks 520 and 530 may include color filters of the same color, for example, green color filters.

A pair of second pixels PX2 included in each of the autofocus pixel blocks 520 and 530 may share a single microlens. A microlens included in each of the autofocus pixel blocks 520 and 530 may have a radius of curvature different from a radius of curvature of the microlens included in each of the first pixels PX1. In some example embodiments, the radius of curvature of the microlens included in each of the first pixels PX1 may have a first value, and the radius of curvature of the microlens included in each of the autofocus pixel blocks 520 and 530 may have a second value. The second value may be greater than the first value. The first value and the second value may be determined or selected in a similar manner to that described above with reference to FIG. 18.

At least some of the general pixel blocks 510 may have different shapes. Referring to FIG. 22, a first general pixel block 511 may include nine first pixels PX1, while a second general pixel block 512 may include seven first pixels PX1. The second general pixel block 512 may be adjacent or proximate to another second general pixel block 512 in at least one of the first direction and the second direction. One of the autofocus pixel blocks 520 and 530 may be between a pair of second general pixel blocks 512 that are adjacent or proximate to each other in the first direction or the second direction.

In each of the general pixel blocks 510, some of the first pixels PX1 may share a driving transistor, a reset transistor, a selection transistor, and a floating diffusion region included in a pixel circuit. As an example, three first pixels PX1 arranged in the same location in the first or second direction in the first general pixel block 511 may share a driving transistor, a reset transistor, a selection transistor, and a floating diffusion region, and the like. A pair of second pixels PX2 included in each of the autofocus pixel blocks 520 and 530 may also share a driving transistor, a reset transistor, a selection transistor, and a floating diffusion region, and the like.

In some example embodiments, and as illustrated in FIG. 22, a pair of autofocus pixel blocks 520 and 530 may be continuously arranged or immediately adjacent to each other in the first direction or the second direction. As an example, a pair of first autofocus pixel blocks 520 may be continuously arranged or immediately adjacent to each other in a second direction, and a pair of second autofocus pixel blocks 530 may be continuously arranged or immediately adjacent to each other in a first direction.

Figure 23:
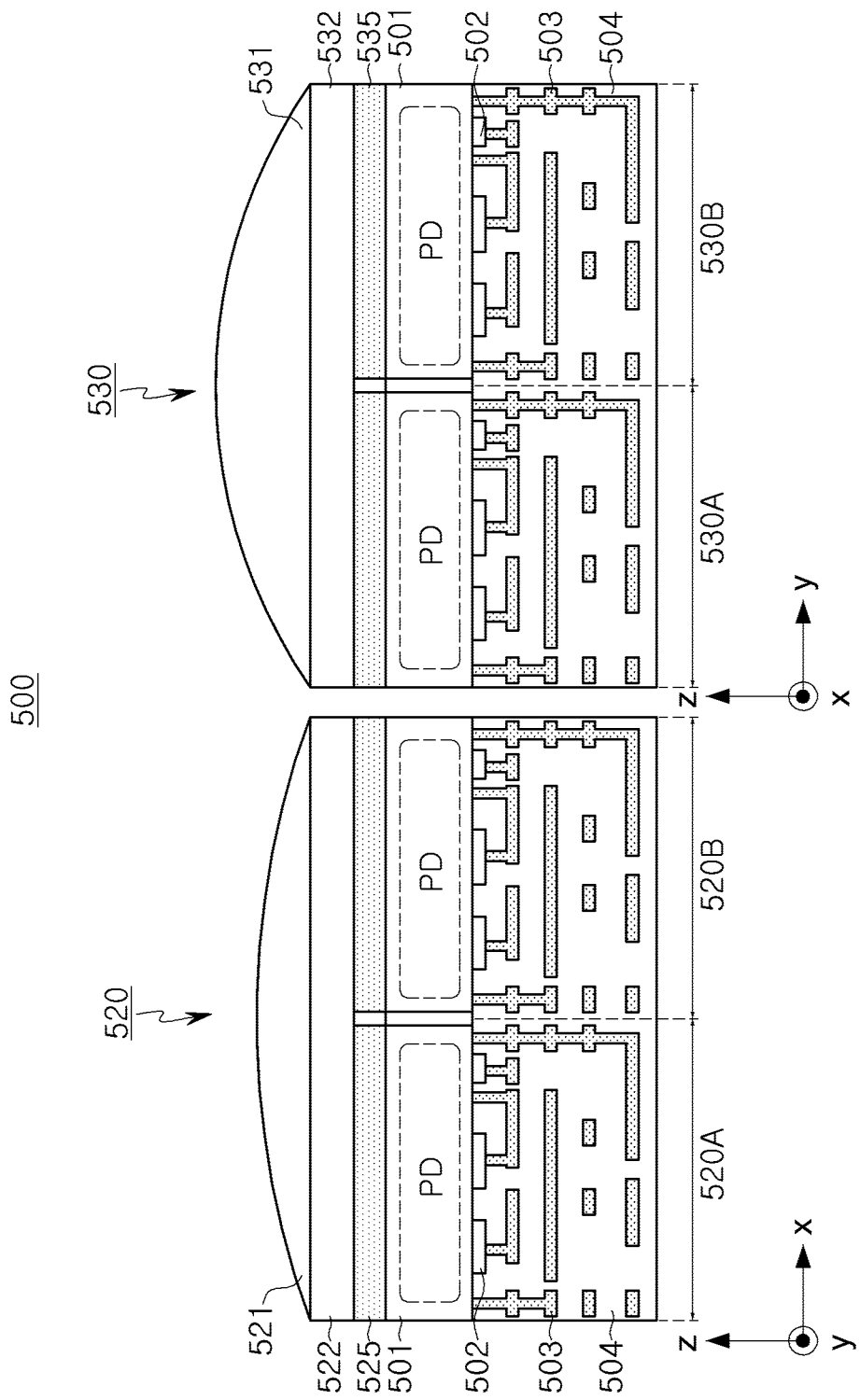
FIGS. 23 and 24 illustrate pixels included in an image sensor according to some example embodiments.
Figure 24:
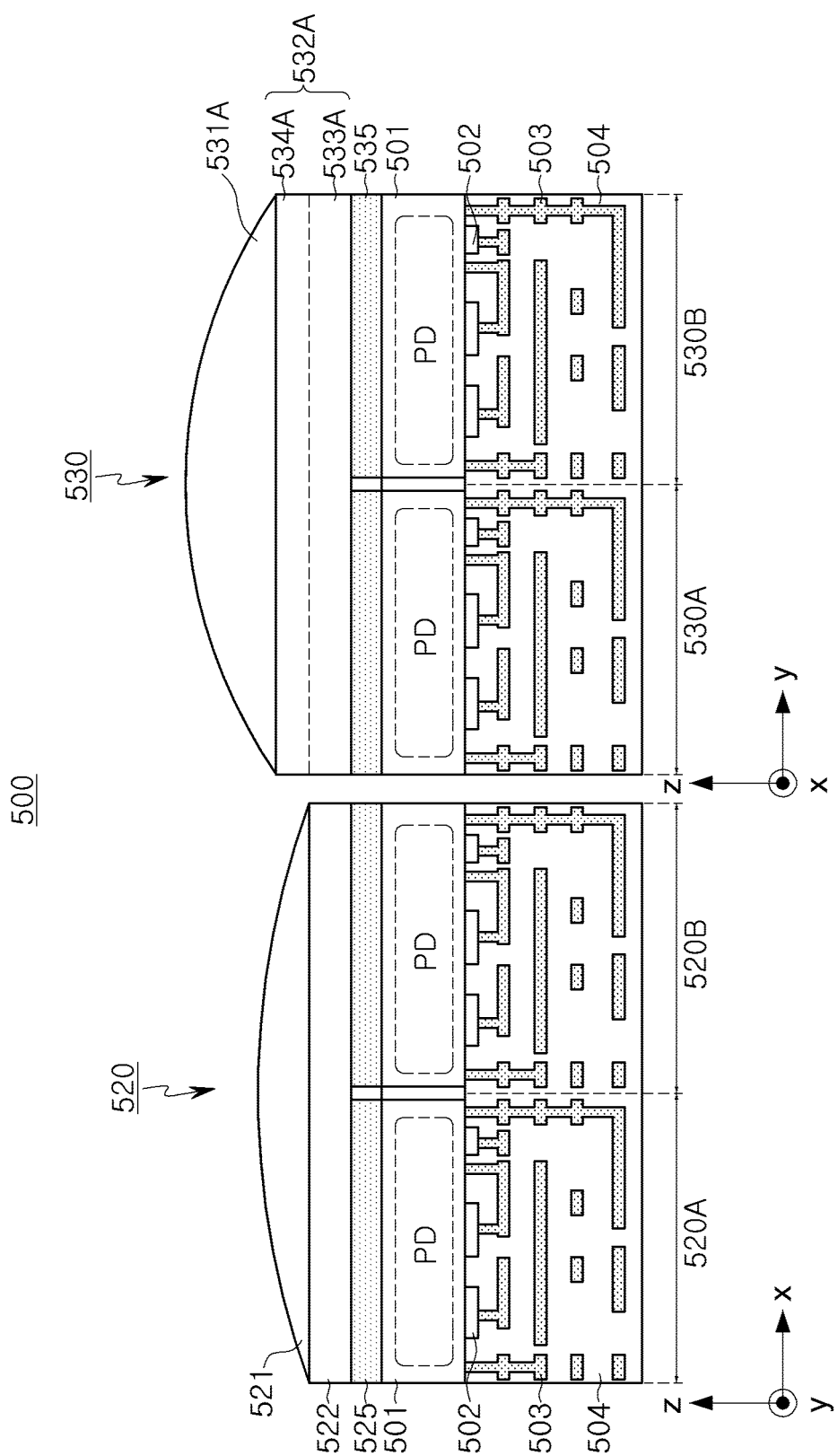

FIGS. 23 and 24 illustrate pixels included in an image sensor according to some example embodiments.

FIGS. 23 and 24 are schematic diagrams of a first autofocus pixel block 520 and a second autofocus pixel block 530 in the pixel array 500 illustrated in FIG. 22, according to some example embodiments. Each of the first autofocus pixel block 520 and the second autofocus pixel block 530 may include a pair of second pixels PX2. Each of the second pixels PX2 may include a semiconductor substrate 501 in which a photodiode PD is arranged, elements 502 and interconnection patterns 503 providing a pixel circuit, an insulating layer 504, and other components not illustrated in FIGS. 22 and 23.

Referring to FIG. 23, color filters 525, light transmission layers 522 and 532, and microlenses 521 and 531 may be arranged on a semiconductor substrate 501. In the first autofocus pixel block 520, a pair of second pixels PX2 may share a first microlens 421. In the second autofocus pixel block 530, a pair of second pixels PX2 may share a second microlens 531. As an example, a radius of curvature of each of the first microlens 521 and the second microlens 531 may be greater than a radius of curvature of a microlens included in the first pixel PX1.

Referring to FIG. 23, a radius of curvature of the first microlens 521 may be greater than a radius of curvature of the second microlens 531. In the embodiment illustrated in FIG. 24, a first microlens 521 and a second microlens 531A have the same radii of curvature, and the first light transmission layer 522 and the second light transmission layer 532A may have different thicknesses. The second light transmission layer 532A may include a lower light transmission layer 533A and an upper light transmission layer 534A, and the upper light transmission layer 534A may have a lower refractive index than the lower light transmission layer 533A. In some embodiments the radius of curvature of a second microlens 531 may be smaller than the radius of curvature of the first microlens 521 and the second light transmission layer 532A may have a greater thickness than the first light transmission layer 522.

The autofocus pixels according to the example embodiments described with reference to FIG. 7 to 17 may be applied to the pixel arrays 400 and 500 according to the example embodiments described with reference to FIGS. 18 to 24. For example, each of the autofocus pixels 420, 430, 520, and 530 according to some example embodiments described with reference to FIGS. 18 to 24 may be implemented as a single second pixel PX2, and the single second pixel PX2 may include a pair of photodiodes arranged in the first direction or the second direction. Alternatively, each of the autofocus pixels 420, 430, 520, 530 may include a pair of second pixels PX2 arranged in the first direction or the second direction, with each of the pair of second pixels PX2 including an additional microlens, and with each of the pair of second pixels PX2 including a light blocking layer.

Figure 25:
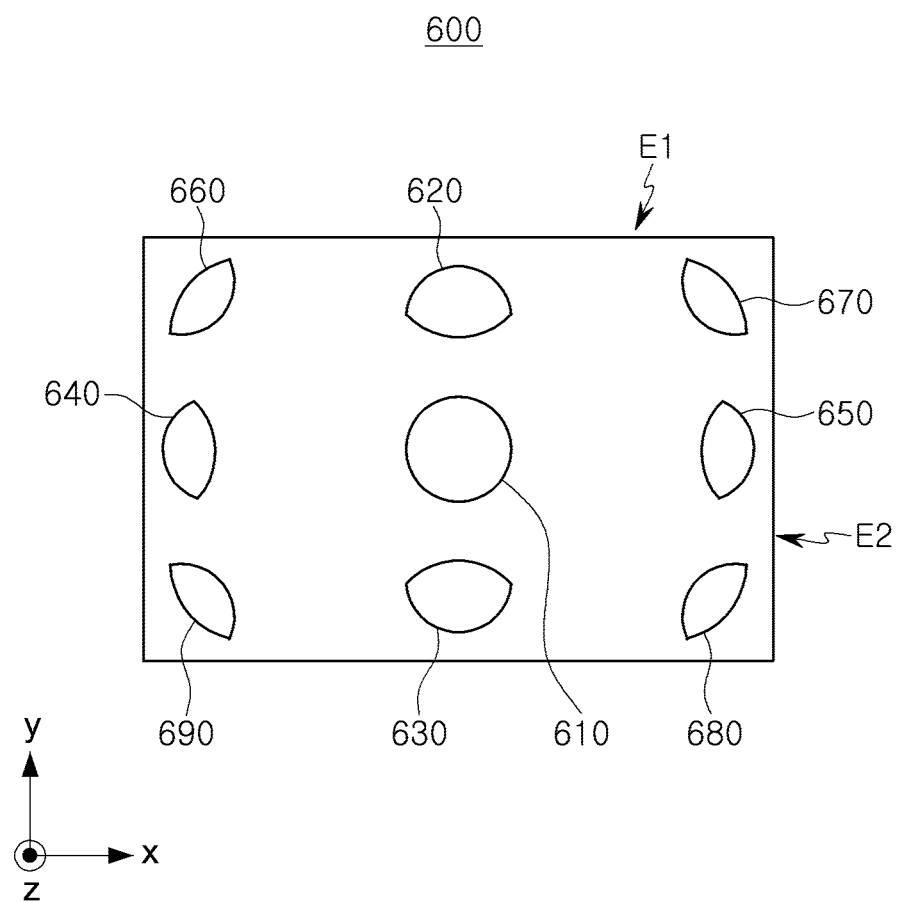
FIGS. 25 and 26 illustrate an operation of an image sensor according to some example embodiments.
Figure 26:
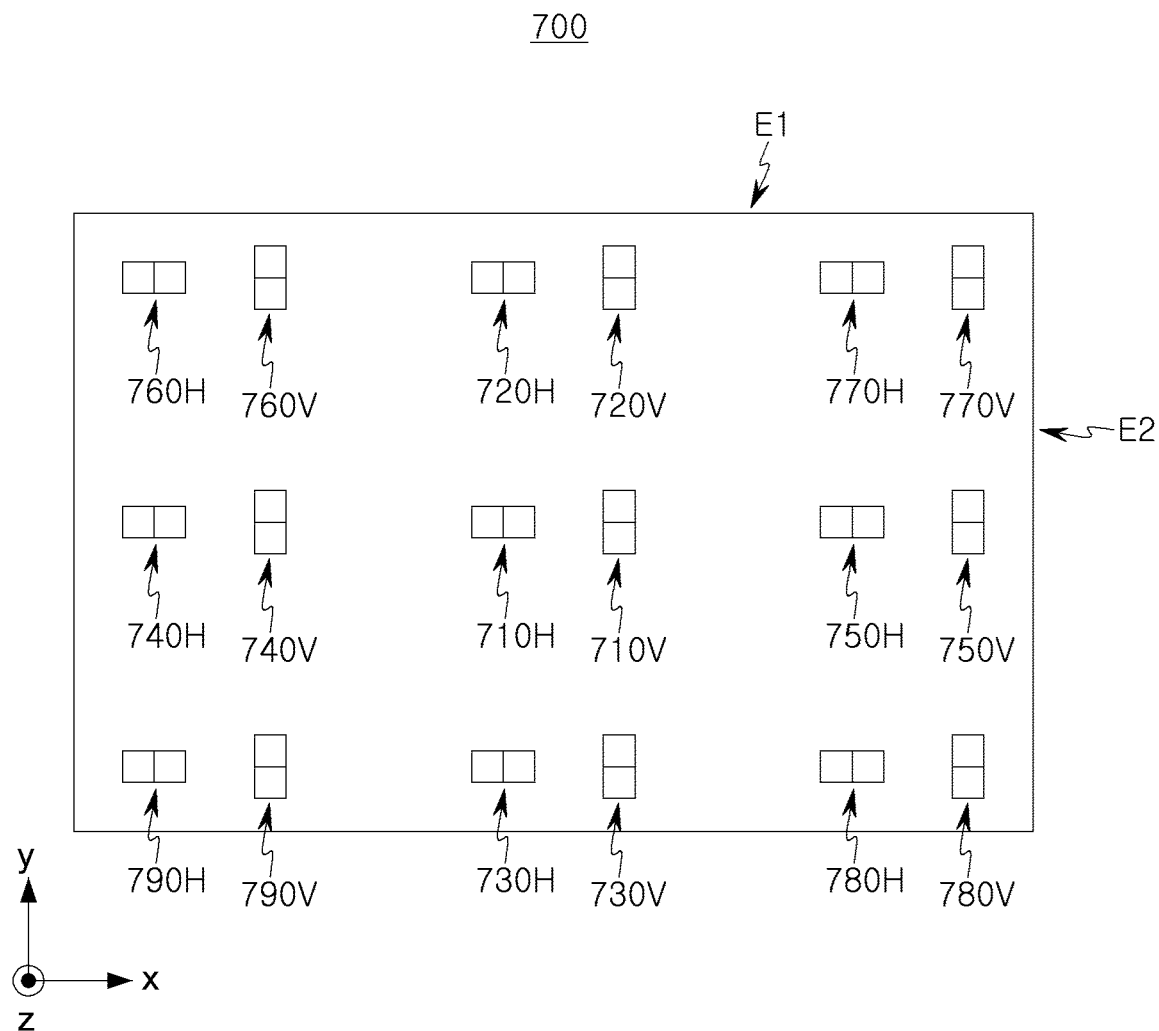

FIGS. 25 and 26 illustrate an operation of an image sensor according to some example embodiments.

FIG. 25 is a view illustrating shapes of exit pupils 610 to 690 appearing for or in each region of a pixel array 600 in an image sensor according to some example embodiment. The exit pupil may refer to a hole through which light passes. In the example embodiments described with reference to FIG. 25, the exit pupils 610 to 690 may have different shapes depending on locations of a first direction (e.g., an X-axis direction) and a second direction (e.g., a Y-axis direction) in which pixels are arranged.

As an example, in a region close to the center of the pixel array 600, the exit pupil 610 may have a circle-like shape. On the other hand, in regions close to a first edge E1 or a second edge E2 of the pixel array 600, each of the exit pupils 620 to 690 may have a shape other than a circular shape. As a result, each of the pixels included in the pixel array 600 may have different exit pupils 610 to 690 according to locations thereof, which may cause a difference in the numerical aperture of each of the pixels. As described above, autofocus information generated by each of the autofocus pixels arranged in different positions in the pixel array 600 may vary depending on the difference in numerical apertures. In some example embodiments, at least a portion of the autofocus pixels may be formed to have different heights to compensate for the difference in numerical apertures resulting from a difference between the exit pupils 610 to 690.

FIG. 26 is a view illustrating autofocus pixels 710H to 790H and 710V to 790V arranged in different locations in a pixel array 700. Referring to FIG. 26, the pixel array 700 may include horizontal autofocus pixels 710H to 790H, in which a pair of pixels are arranged in a first direction, and vertical autofocus pixels 710V to 790V in which a pair of pixels are arranged in a second direction.

The autofocus pixels 710H to 790H and 710V to 790V may be arranged in different locations in at least one of the first direction and the second direction. Therefore, the horizontal autofocus pixels 710H to 790H may have different exit pupils 610 to 690, and the vertical autofocus pixels 710V to 790V may also have different exit pupils 610 to 690. As an example, the autofocus pixels 710H and 710V, arranged in the center of the pixel array 700, may each have a larger exit pupil than other autofocus pixels 720H to 790H and 720V to 790V.

The autofocus pixels 720H to 790H and 720V to 790V, arranged adjacent to at least one of the first edge E1 and the second edge E2, may have smaller exit pupils 620 to 690 than the autofocus pixels 710H and 710V arranged in the center of the pixel array 700. Thus, the numerical aperture may be decreased to have a narrow field of view. In some example embodiments, a height of each of the autofocus pixels 710H to 790H and 710V to 790V may be determined in consideration of a difference between the exit pupils 610 to 690, and a focal length of each of the autofocus pixels 710H to 790H and 710V to 790V may be changed to compensate for a difference in numerical apertures. Hereinafter, this will be described in more detail with reference to FIGS. 27A to 28C.

FIGS. 27A to 28C illustrate pixels included in a pixel array in FIG. 26 according to some example embodiments.

Figure 27A:
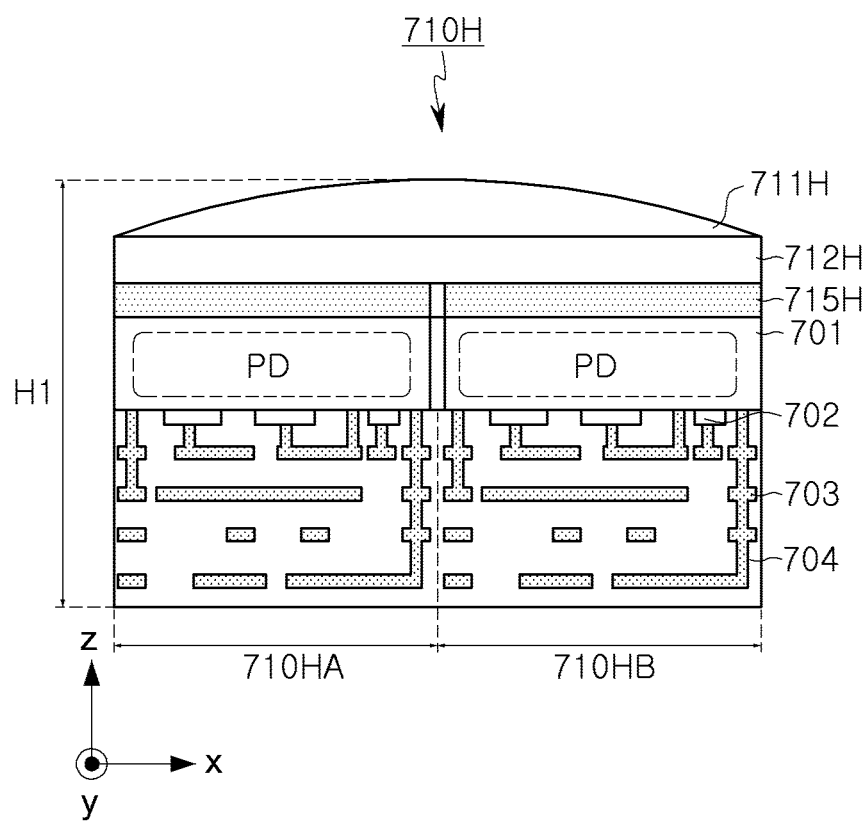
FIGS. 27A to 28C illustrate pixels included in a pixel array in FIG. 26 according to some example embodiments.
Figure 27B:
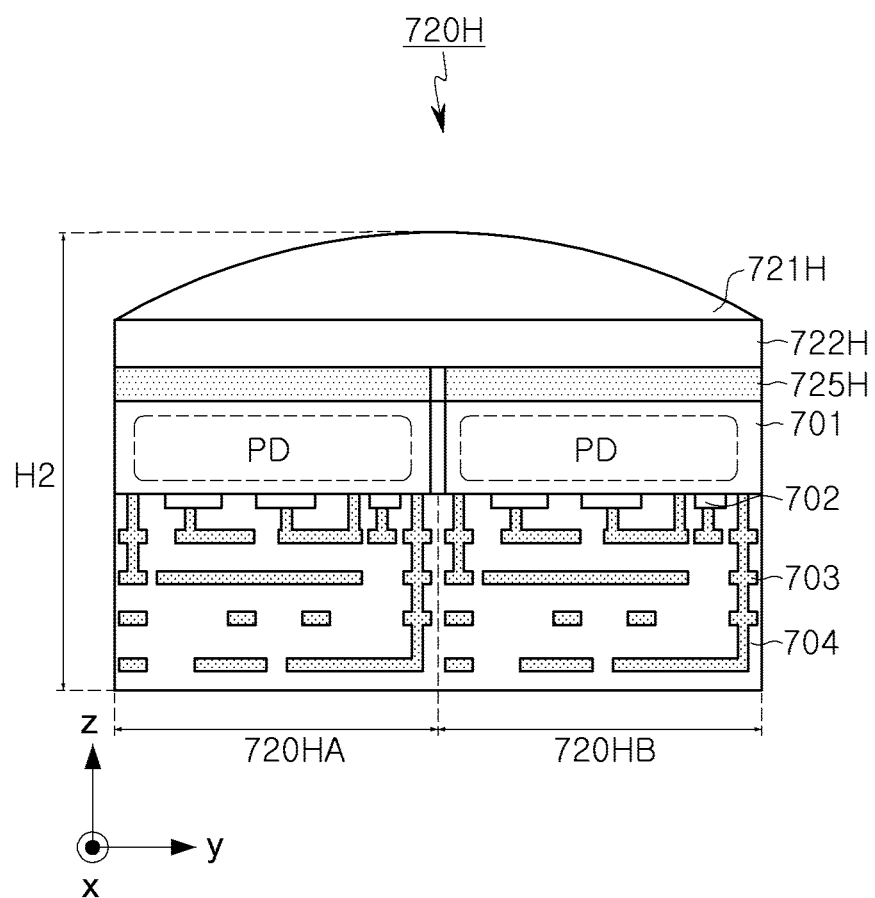
Figure 27C:
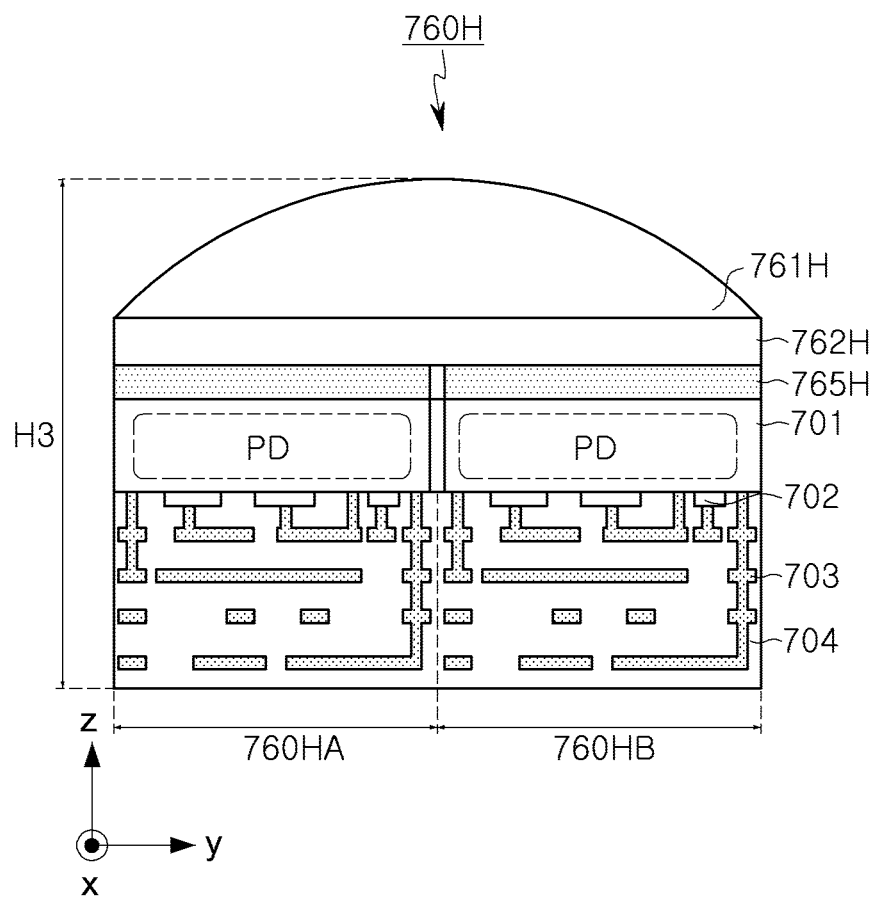

FIGS. 27A to 27C are views illustrating some of the horizontal autofocus pixels among horizontal autofocus pixels 710H to 790H of the example embodiments described with reference to FIGS. 25 and 26. Referring to FIG. 27A, a first horizontal autofocus pixel 710H, arranged in the center of the pixel array 700, may include a first pixel 710HA and a second pixel 710HB disposed in a first direction (an X-axis direction), and each of the first pixel 710HA and the second pixel 710HB may include a photodiode PD arranged in a semiconductor substrate 701. Elements 702 and interconnection patterns 703, providing a pixel circuit, may be arranged on the semiconductor substrate 701, and an insulating layer 704 may be arranged on one surface of the semiconductor substrate 701.

A color filter 715H, a light transmission layer 712H, and a microlens 711H may be arranged on the semiconductor substrate 701. The color filters 715H, arranged in the first pixel 710HA and the second pixel 710HB, may allow lights of the same color to pass therethrough. The first horizontal autofocus pixel 710H may have a first height H1 in a third direction (e.g., a Z-axis direction).

FIG. 27B is a view illustrating a second horizontal autofocus pixel 720H adjacent to a first edge E1 of the pixel array 700. The second horizontal autofocus pixel 720H may have a structure that is similar to a structure of the first horizontal autofocus pixel 710H. However, referring to FIG. 27B, the second horizontal autofocus pixel 720H may have a second height H2 greater than a first height H1 in the third direction. Accordingly, a decrease in numerical aperture that occurs because the second horizontal autofocus pixel 720H has a relatively smaller exit pupil than the first horizontal autofocus pixel 710H may be compensated for. Referring to FIG. 25, the exit pupil for the first horizontal autofocus pixel 710H may be exit pupil 610, and the exit pupil for the second horizontal autofocus pixel 720H may be exit pupil 620. As an example, the second horizontal autofocus pixel 720H may be formed to have the second height H2 greater than the first height H1 by decreasing a radius of curvature of the microlens 721H in the second horizontal autofocus pixel 720H and/or by increasing a thickness of the light transmission layer 722H.

FIG. 27C is a view illustrating a sixth horizontal autofocus pixel 760H close to a corner where edges E1 and E2 of a pixel array 700 meet. The sixth horizontal autofocus pixel 760H may have a structure similar to a structure of each of the first and second horizontal autofocus pixels 710H and 720H, but the sixth horizontal autofocus pixel 760H may have a third height H3 greater than the second height H2. As an example, a microlens 761H included in the sixth horizontal autofocus pixel 760H may have a smaller radius of curvature than the microlenses 711H and 721H. Additionally, or alternatively, a light transmission layer 762H included in the sixth horizontal autofocus pixel 760H may have a greater thickness than the light transmission layers 712H and 722H.

Figure 28A:
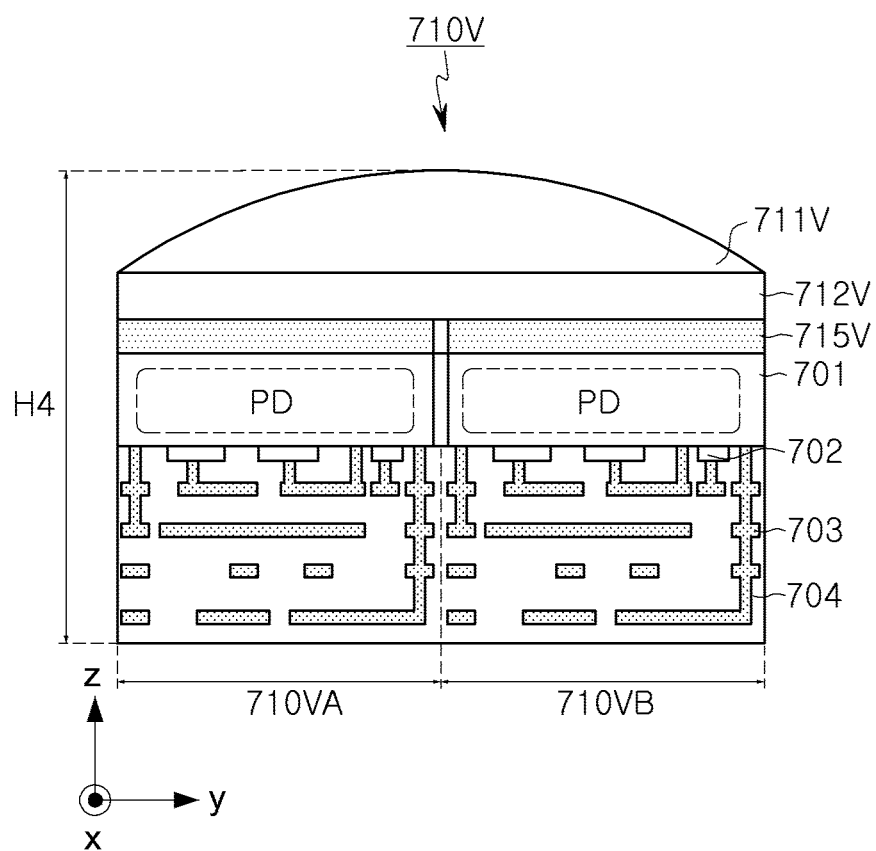
Figure 28B:
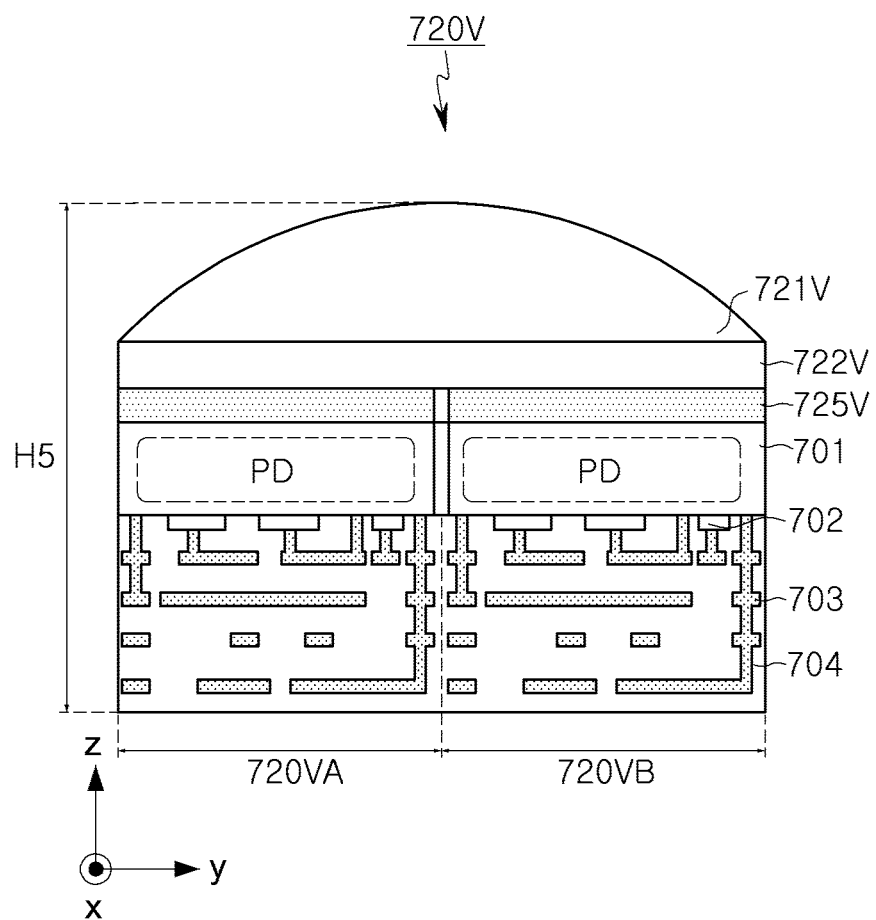
Figure 28C:
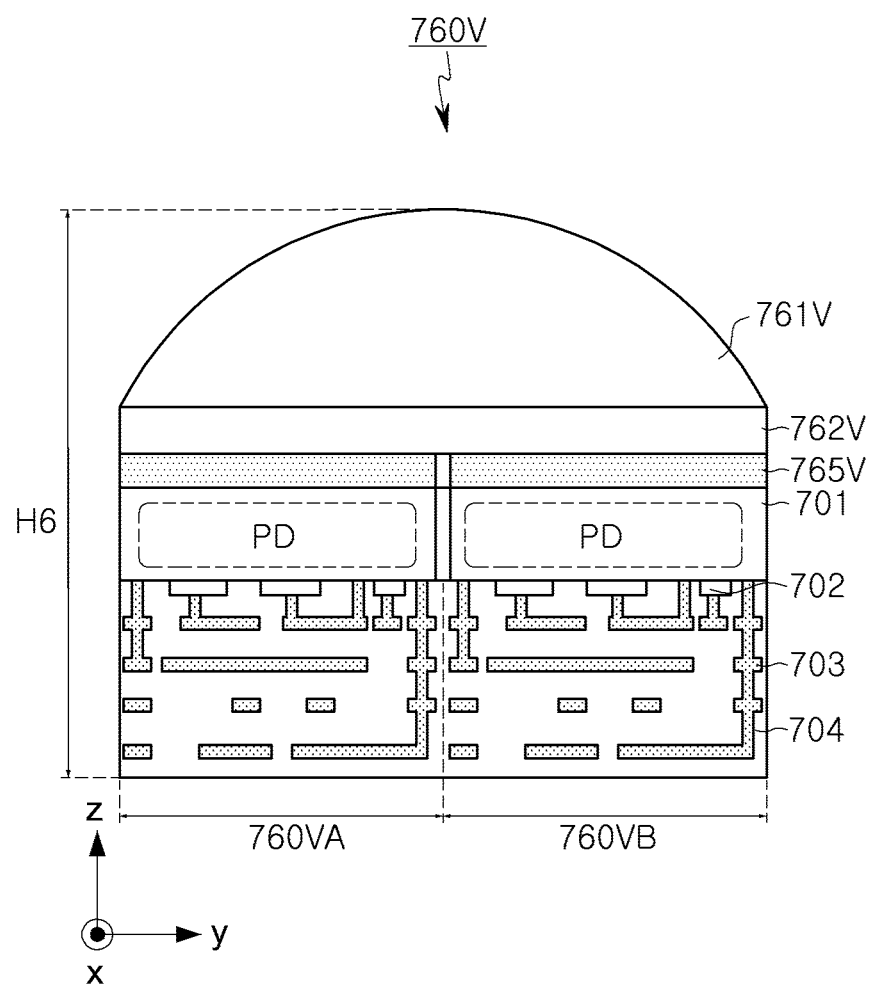

FIGS. 28A to 28C are views illustrating some of the vertical autofocus pixels among vertical autofocus pixels 710V to 790V of the example embodiments described with reference to FIGS. 25 and 26. Referring to FIG. 28A, a first vertical autofocus pixel 710V disposed in the center of the pixel array 700 may include a first pixel 710VA and a second pixel 710VB disposed in a second direction (a Y-axis direction). A structure of the first vertical autofocus pixel 710V may be similar to a structure of each of the horizontal autofocus pixels 710H to 790H.

The first vertical autofocus pixel 710V may have a fourth height H4, and the fourth height H4 may be greater than a first height H1. When a D-cut lens having an edge extending in a first direction is in front of the pixel array 700, the first vertical autofocus pixel 710V may have a smaller exit pupil than the first horizontal autofocus pixel 710H due to the D-cut lens. Thus, a numerical aperture of the first vertical autofocus pixel 710V may be decreased. In some example embodiments, the first vertical autofocus pixel 710V may be formed to have a fourth height H4 that is greater than the first height H1. This greater height H4 may compensate for the decrease in numerical aperture. As an example, the first vertical autofocus pixel 710V may be formed to have the fourth height H4 that greater than the first height H1 by decreasing a radius of curvature of the microlens 711V and/or by increasing a thickness of a light transmission layer 712V.

FIG. 28B is a view illustrating a second vertical autofocus pixel 720V adjacent to a first edge E1 of the pixel array 700. Referring to FIG. 28B, the second vertical autofocus pixel 720V may have a fifth height H5 that is greater than a fourth height H4 in a third direction. The fifth height H5 may compensate for a decrease in numerical aperture that occurs because the second vertical autofocus pixel 720V has a relatively smaller exit pupil than the first vertical autofocus pixel 710V. Referring to FIG. 25, the exit pupil for the first vertical autofocus pixel 710V may be exit pupil 610, and the exit pupil for the second vertical autofocus pixel 720V may be exit pupil 620. As an example, the second vertical autofocus pixel 720V may be formed to have the fifth height H5 that is greater than the fourth height H4 by decreasing a radius of curvature of a microlens 721V in the second vertical autofocus pixel 720V and/or by increasing a thickness of the light transmission layer 722V.

FIG. 28C is a view illustrating a sixth vertical autofocus pixel 760V that is close to a corner where edges E1 and E2 of the pixel array 700. The sixth vertical autofocus pixel 760V may have a sixth height H6 greater than a fifth height H5. As an example, a microlens 761V included in the sixth vertical autofocus pixel 760V may have a smaller radius of curvature than the microlenses 711V and 721V. Additionally, or alternatively, a light transmission layer 762V included in the sixth vertical autofocus pixel 760V may have a greater thickness than the light transmission layers 712V and 722V.

In some example embodiments, a height of each of the autofocus pixels may be determined in consideration of a direction in which a pair of pixels or a pair of photodiodes included in each of the autofocus pixels are arranged, and in consideration of a direction in which an edge of a D-cut lens included in an image sensor extends. In addition, heights of the autofocus pixels may vary depending on locations of the autofocus pixels within a pixel array. In some example embodiments, the heights may vary independently of a direction in which pixels or photodiodes are arranged in each of the autofocus pixels. For example, in some example embodiments, a height of each of the autofocus pixels may be determined or selected in consideration of a shape of an exit pupil appearing in each of the autofocus pixels and in consideration of a difference in numerical apertures resulting therefrom. Thus, an autofocusing function of the image sensor may be improved.

Figure 29:
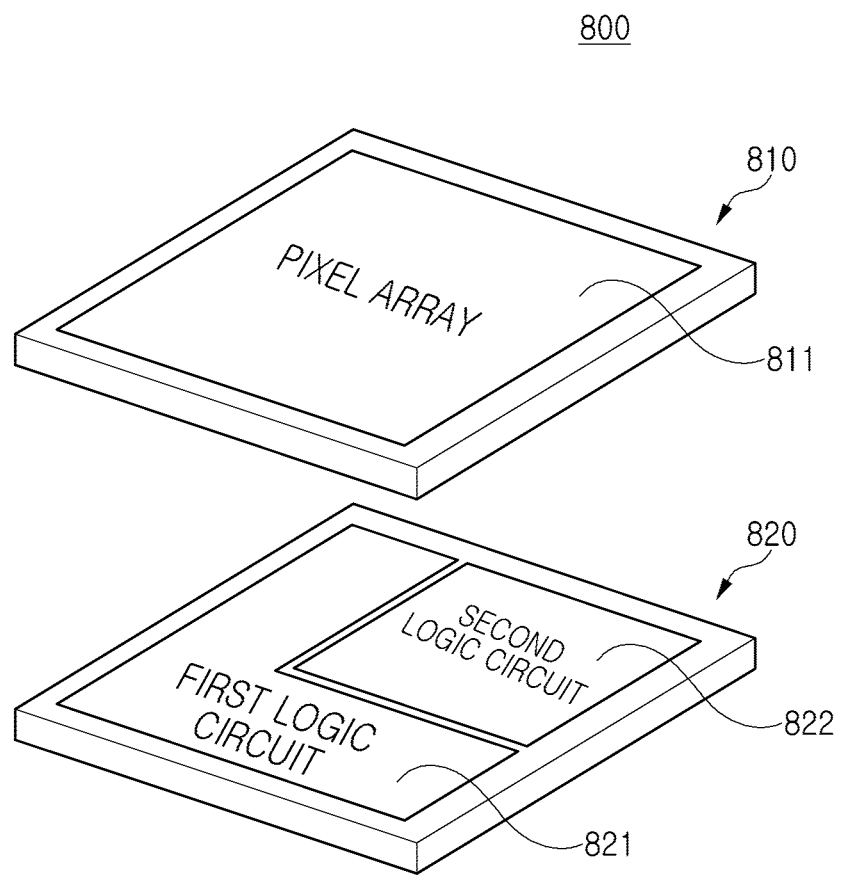
FIGS. 29 and 30 illustrate image sensors according to some example embodiments.
Figure 30:
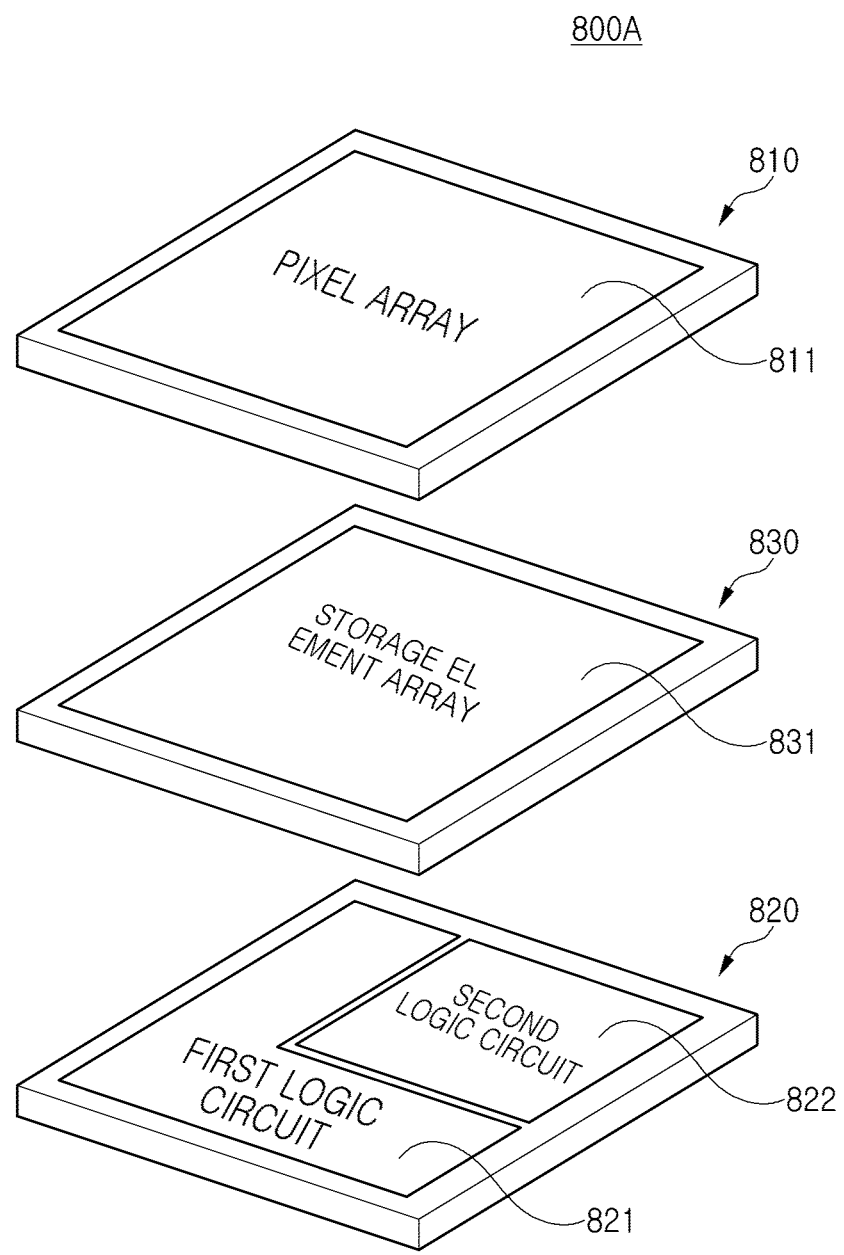

FIGS. 29 and 30 illustrate image sensors according to some example embodiments, respectively.

Referring to FIG. 29, an image sensor 800 according to some example embodiments may include a first layer 810 and a second layer 820. The first layer 810 and the second layer 820 may be stacked in a vertical direction.

The first layer 810 may include a pixel array 811, and the second layer 820 may include logic circuits 821 and 822. The pixel array 811 may be connected to the logic circuits 821 and 822 through a plurality of row lines and a plurality of column lines.

As an example, the pixel array 811 may include general pixels and autofocus pixels. The number of the general pixels may be greater than the number of the autofocus pixels, and each of the autofocus pixels may include a plurality of photodiodes, although the present disclosure is not limited thereto. In addition, when a D-cut lens is arranged in front of the pixel array 811, the autofocus pixels may include a first autofocus pixel in which photodiodes are arranged in a direction of an edge of the D-cut lens, and a second autofocus pixel in which photodiodes are arranged in a direction that is different from the direction of the edge of the D-cut lens. In a vertical direction in which the first layer 810 and the second layer 820 are stacked, a height of the first autofocus pixel may be smaller than a height of the second autofocus pixel.

The logic circuits 821 and 822 may include a first logic circuit 821 and a second logic circuit 822. The first logic circuit 821 may include a row driver, a readout circuit, a column driver, a control logic required to drive the pixel array 811, and the like. The second logic circuit 822 may include a power supply circuit, an input/output interface, an image signal processor, and the like. An area occupied by each of the first logic circuit 821 and a second logic circuit 822, an arrangement form of the first and second logic circuits 821 and 822, and other aspects of the second layer 820 and the components thereof may be variously changed without departure from the inventive concepts of the present disclosure.

Referring to FIG. 30, an image sensor 800A may include a first layer 810, a second layer 820, and a third layer 830 arranged between the first layer 810 and the second layer 820. The first layer 810 and the second layer 820 may be similar to those described with reference to FIG. 29. The third layer 830 may include a storage element array 831, and the storage element array 831 may include storage elements such as a metal-insulator-metal (MIM) capacitor, a charge trapping element, a magnetic tunnel junction (MTJ) element, a germanium-antimony-tellurium (Ge—Sb—Te or GST) element, and the like. The storage elements may be connected to at least one of pixels, arranged in the first layer 810, and/or to logic circuits 821 and 822.

Configurations of the image sensors 800 and 800A are not limited to what are illustrated in FIGS. 29 and 30 and may be changed in various ways. As an example, a portion of the logic circuits 821 and 822, for example, at least a portion of the first logic circuit 821 may be arranged on the first layer 810 together with the pixel array 811.

Figure 31:
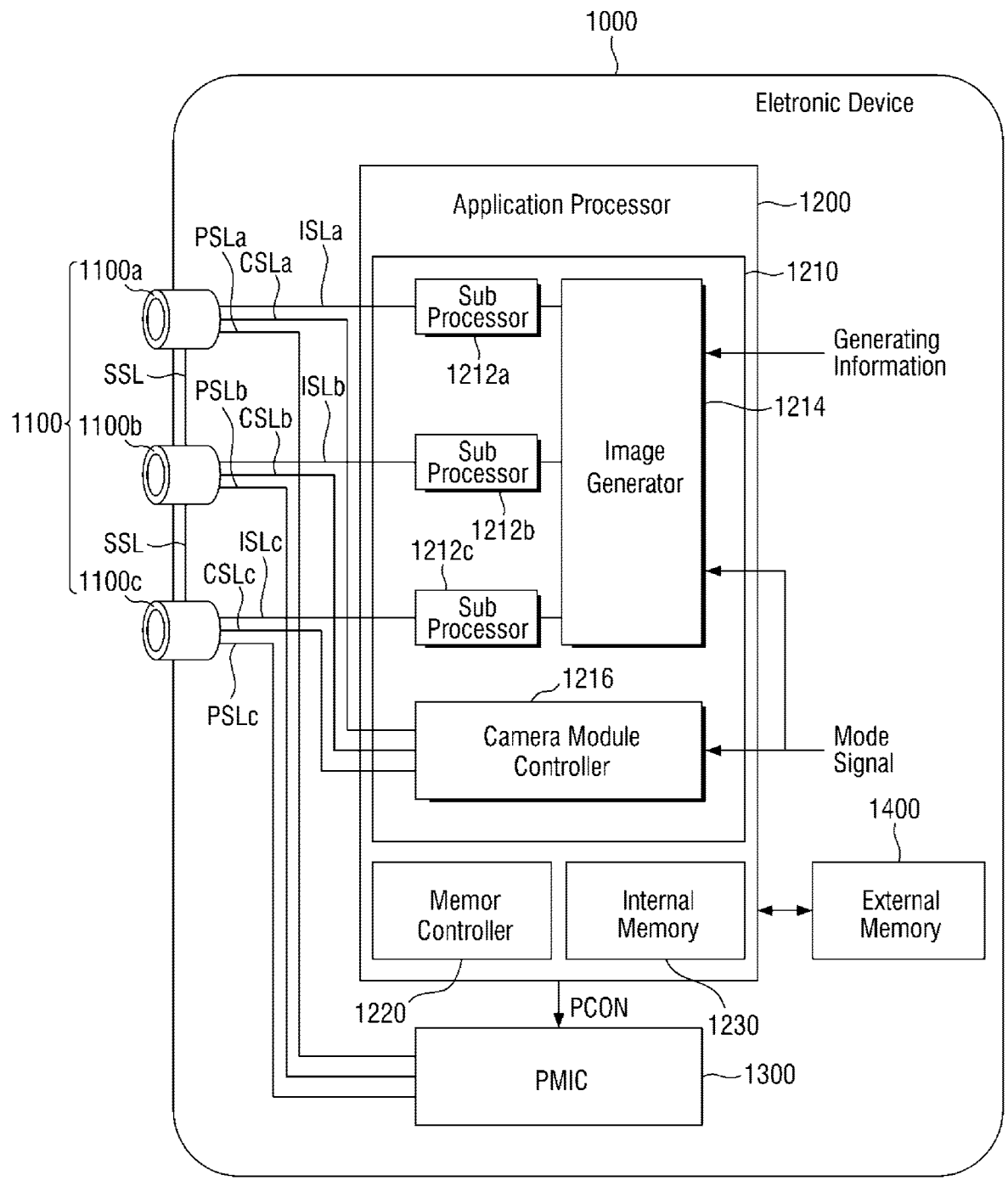
FIGS. 31 and 32 illustrate an electronic device including an image sensor according to some example embodiments.
Figure 32:
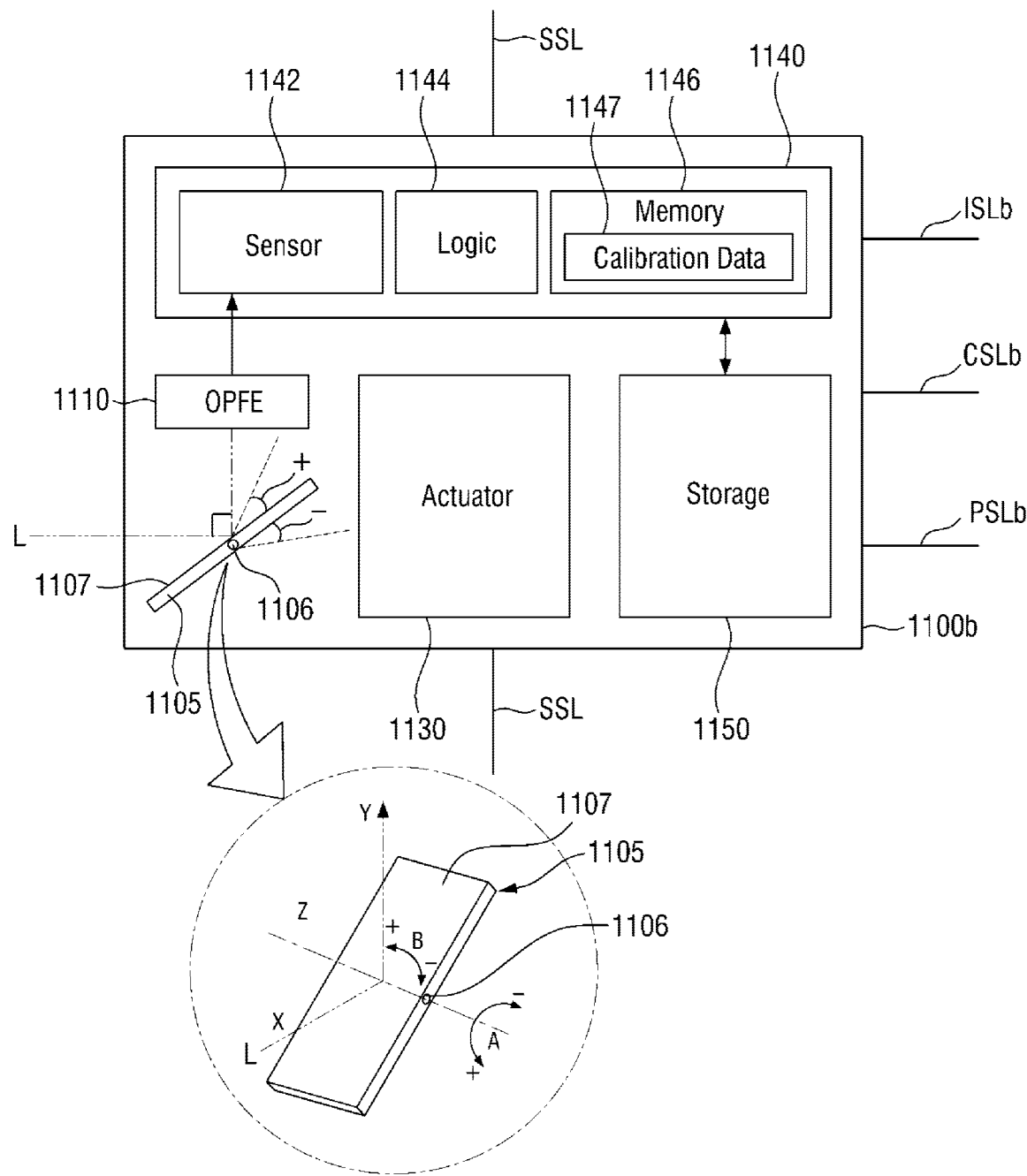

FIGS. 31 and 32 illustrate an electronic device including an image sensor according to some example embodiments.

Referring to FIG. 31, an electronic device 1000 may include a camera module group 1100, an application processor 1200, a PMIC 1300, and an external memory 1400.

The camera module group 1100 may include a plurality of camera modules 1100a, 1100b, and 1100c. An example embodiment, in which three camera modules 1100a, 1100b, and 1100c are arranged, is illustrated in the drawing, but the present disclosure is not limited thereto. In some embodiments, the camera module group 1100 may be modified to include only two camera modules. In addition, in some embodiments, the camera module group 1100 may be modified to include n camera modules (where n is a positive integer of 4 or more). In addition, in some embodiments, at least one of the plurality of camera modules 1100a, 1100b, and 1100c included in the camera module group 1100 may include an image sensor according to one of the example embodiments described above with reference to FIGS. 1 to 30.

Hereinafter, a detailed configuration of the camera module 1100b will be described in more detail with reference to FIG. 32. However, the following description may be equally applied to the other camera modules 1100a and 1100c according to some example embodiments.

Referring to FIG. 32, the camera module 1100b may include a prism 1105, an optical path folding element (hereinafter referred to as "OPFE") 1110, an actuator 1130, an image sensing device 1140, and a storage unit 1150.

The prism 1105 may include a reflective surface of a light reflecting material to change a path of external incident light.

In some embodiments, the prism 1105 may change a path of light L, incident in a first direction X, into a second direction Y perpendicular to the first direction X. In addition, the prism 1105 may change the path of the light L, incident in the first direction X, into the second direction Y perpendicular to the first direction X by allowing the reflective surface 1107 of the light reflecting material to rotate about a central axis 1106 in an A direction or allowing the central axis 1106 to rotate in a B direction. In this case, the OPFE 1110 may also move in a third direction Z, perpendicular to the first direction X and the second direction Y.

In some embodiments, as illustrated in the drawing, a maximum rotation angle of the prism 1105 in the direction A may be 15 degrees or less in a positive (+) A direction and greater than 15 degrees in a negative (−) A direction. However, the present disclosure is not limited thereto.

In some embodiments, the prism 1105 may move at an angle of around 20 degrees, or at an angle between 10 degrees and 20 degrees or between 15 degrees and 20 degrees in a positive (+) or negative (−) B direction. The prism 105 may move at the same angle in the positive (+) or negative (−) B direction, or to an almost similar angle in the range of around 1 degree.

In some embodiments, the prism 1105 may allow the reflective surface 1106 of the light reflecting material to move in the third direction (for example, the Z direction), parallel to a direction in which the central axis 1106 extends.

The OPFE 1110 may include, for example, an optical lens including m groups (where m is a positive integer). The m lenses may move in the second direction Y to change an optical zoom ratio of the camera module 1100b. For example, when the m optical lenses included in the OPFE 1110 are moved, an optical zoom magnification of the camera module 1100b may change to 3Z or 5Z, or 5Z or more (where Z is a basic optical zoom magnification of the camera module 1100b).

The actuator 1130 may move the OPFE 1110 or an optical lens (hereinafter, referred to as an optical lens) to a specific location. For example, the actuator 1130 may adjust the position of the optical lens so that the image sensor 1142 may adjust a location of the optical lens such that the image sensor 1142 is disposed at a focal length of the optical lens to achieve precise sensing.

The image sensing device 1140 may include an image sensor 1142, a control logic 1144, and a memory 1146. The image sensor 1142 may sense an image of a sensing object using light L provided through an optical lens. The control logic 1144 may control the overall operation of the camera module 1100b. For example, the control logic 1144 may control an operation of the camera module 1100b according to a control signal provided through a control signal line CSLb.

The memory 1146 may store information, required for the operation of the camera module 1100b, such as calibration data 1147. The calibration data 1147 may include information required for the camera module 1100b to generate image data using externally provided light L. The calibration data 1147 may include, for example, information on a degree of rotation, information on a focal length, information on an optical axis, and the like. When the camera module 1100b is implemented in the form of a multi-state camera having a focal length varying depending on a location of the optical lens, the calibration data 1147 may include information associated with a focal length value for each location (or state) of the optical lens and autofocusing.

The storage unit 1150 may store image data sensed through the image sensor 1142. The storage unit 1150 may be arranged outside of the image sensing device 1140, and may be implemented in a form stacked with a sensor chip constituting the image sensing device 1140. In some embodiments, the storage unit 1150 may be implemented as an electrically erasable programmable read-only memory (EEPROM), but the present disclosure is not limited thereto.

Referring to FIGS. 31 and 32 together, in some embodiments, a plurality of camera modules 1100a, 1100b, and 1100c may each include an actuator 1130. Accordingly, each of the plurality of camera modules 1100a, 1100b, and 1100c may include the same or different calibration data 1147 based on the operation of the actuator 1130 included therein.

In some embodiments, among the plurality of camera modules 1100a, 1100b, 1100c, one camera module (for example, 1100b) may be a folded lens-type camera module including the prism 1105 and OPFE 1110 described above, and the other camera modules (for example, 1100a and 1100b) may be vertical camera modules, which may omit the prism 1105 and OPFE 1110. However, the present disclosure is not limited thereto.

In some embodiments, among the plurality of camera modules 1100a, 1100b, and 1100c, one camera module (for example, 1100c) may be a vertical depth camera configured to extract depth information using, for example, infrared rays (IR). In this case, the application processor 1200 may be configured to merge image data provided from such a depth camera with image data provided from another camera module (for example, 1100a or 1100b), to generate a three-dimensional (3D) depth image.

In some embodiments, among the plurality of camera modules 1100a, 1100b, and 1100c, at least two camera modules (for example, 1100a and 1100b) may have different fields of views. In this case, for example, optical lenses of at least two camera modules (for example, 1100a and 1100b), among the plurality of camera modules 1100a, 1100b, and 1100c, may be different from each other, but the present disclosure is not limited thereto.

In some embodiments, fields of view of the plurality of camera modules 1100a, 1100b, and 1100c may be different from each other. In this case, optical lenses included in the plurality of camera modules 1100a, 1100b, and 1100c may also be different from each other, but the present disclosure is not limited thereto.

In some embodiments, the plurality of camera modules 1100a, 1100b, and 1100c may be arranged to be physically separated from each other. For example, a sensing area of one image sensor 1142 might not be used by two or more of the plurality of camera modules 1100a, 1100b, and 1100c, but an independent image sensor 1142 may be arranged in each of the plurality of camera modules 1100a, 1100b, and 1100c.

Returning to FIG. 31, the application processor 1200 may include an image processing device 1210, a memory controller 1220, and an internal memory 1230. The application processor 1200 may be implemented as separate from the plurality of camera modules 1100a, 1100b, and 1100c. For example, the application processor 1200 and the plurality of camera modules 1100a, 1100b, and 1100c may be implemented as semiconductor chips which are separated from each other.

The image processing device 1210 may include a plurality of sub-image processors 1212a, 1212b, and 1212c, an image generator 1214, and a camera module controller 1216.

The image processing device 1210 may include a plurality of sub-image processors 1212a, 1212b, and 1212c, and the number of the plurality of sub-image processors 1212a, 1212b, and 1212c may correspond to the number of the plurality of camera modules 1100a, 1100b, and 1100c.

Image data, generated by each of the camera modules 1100a, 1100b, and 1100c, may be provided to corresponding sub-image processors 1212a, 1212b, and 1212c through image signal lines ISLa, ISLb, and ISLc separated from each other. For example, image data generated by the camera module 1100a may be provided to the sub-image processor 1212a through an image signal line ISLa, image data generated by the camera module 1100b may be provided to the sub-image processor 1212b through the image signal line ISLb, and image data generated by the camera module 1100c may be provided to the sub-image processor 1212c through the image signal line ISLc. Such image data transmission may be performed using, for example, a camera serial interface (CSI) based on a mobile industry processor interface (MIPI), but example embodiments are not limited thereto.

In some embodiments, a single sub-image processor may be arranged to correspond to a plurality of camera modules. For example, the sub-image processor 1212a and the sub-image processor 1212c may be implemented as integrated into a single sub-image processor rather than implemented as separated from each other, as illustrated. In addition, image data provided from the camera module 1100a and the camera module 1100c may be selected through a selection element (for example, a multiplexer) or the like, and then provided to the integrated sub-image processor.

The image data provided to each of the sub-image processors 1212a, 1212b, and 1212c may be provided to the image generator 1214. The image generator 1214 may generate an output image using the image data provided from each of the sub-image processors 1212a, 1212b, and 1212c according to image generating information or a mode signal.

Specifically, the image generator 1214 may merge at least a piece of the image data, generated by the camera modules 1100a, 1100b, and 1100c having different fields of view, to generate an output image according to the image generation information or the mode signal. In addition, the image generator 1214 may select a piece of the image data, generated by camera modules 1100a, 1100b, and 1100c having different fields of view, to generate an output image according to the image generation information or the mode signal.

In some embodiments, the image generation information may include a zoom signal or a zoom factor. In some embodiments, the mode signal may be, for example, a signal based on a mode selected by a user.

When the image generation information is a zoom signal (zoom factor) and the camera module 1100a, 1100b, 1100c have different fields of view, the image generator 1214 may perform different operations according to type of the zoom signal. For example, when the zoom signal is a first signal, after merging image data output from the camera module 1100a and image data output from the camera module 1100c, the image generator 1214 may generate an output image using a merged image signal and the image data output from the camera module 1100b not used in the merge. When the zoom signal is a second signal different from the first signal, the image generator 1214 may select a piece of the image data, output from the camera modules 1100a, 1100b, and 1100c, to generate an output image without performing such image data merging. However, the present disclosure not limited thereto and, as appropriate, a method of processing image data may be changed.

In some embodiments, the image generator 1214 may receive a plurality of pieces of image data having different exposure times from at least one of the plurality of sub-image processors 1212a, 1212b, and 1212c, and may perform high dynamic range (HDR) processing on the plurality of pieces of image data to generate merged image data having an increased HDR.

The camera module controller 1216 may provide a control signal to each of the camera modules 1100a, 1100b, and 1100c. The control signal, generated by the camera module controller 1216, may be provided to corresponding camera modules 1100a, 1100b, and 1100c, through control signal lines CSLa, CSLb, and CSLc separated from each other.

One of the plurality of camera modules 1100a, 1100b, 1100c may be designated as a master camera (for example, 1100b) according to image generation information including a zoom signal or a mode signal, and the other camera modules (for example, 1100a and 1100c) may be designated as slave cameras according to image generation information, including a zoom signal, or a mode signal. Such information may be included in the control signal and provided to the corresponding camera modules 1100a, 1100b, and 1100c through the control signal lines CSLa, CSLb, and CSLc separated from each other.

Camera modules, operating as a master camera and a slave camera, may vary depending on a zoom factor or an operating mode signal. For example, when a field of view of the camera module 1100a is wider than a field of view of the camera module 1100b and the zoom factor exhibits a low zoom magnification, the camera module 1100b may operate as a master camera and the camera module 1100a may operate as a slave camera. Meanwhile, when the zoom factor exhibits a high zoom magnification, the camera module 1100a may operate as a master camera and the camera module 1100b may operate as a slave camera.

In some embodiments, the control signal provided from the camera module controller 1216 to each of the camera modules 1100a, 1100b, and 1100c may include a synchronization enable signal. For example, when the camera module 1100b is a master camera and the camera modules 1100a and 1100c are slave cameras, the camera module controller 1216 may transmit the synchronization enable signal to the camera module 1100b. The camera module 1100b, receiving such a synchronization enable signal, may generate a synchronization signal based on the provided synchronization enable signal, and may transmit the generated synchronization signal to the camera modules 1100a and 1100c through a synchronization signal line SSL. The camera module 1100b and the camera modules 1100a and 1100c may be synchronized with the synchronization signal to transmit image data to the application processor 1200.

In some embodiments, the control signal provided from the camera module controller 1216 to the plurality of camera modules 1100a, 1100b, and 1100c may include mode information according to the mode signal. The plurality of camera modules 1100a, 1100b, and 1100c may operate in a first operating mode and a second operating mode based on such mode information in association with sensing speed.

In the first operating mode, the plurality of camera modules 1100a, 1100b, and 1100c may generate an image signal at a first rate (for example, generate an image signal at a first frame rate) to encode the image signal at a second speed higher than the first speed (for example, encode the image signal at a second frame higher than the first frame rate) and may transmit the encoded image signal to the application processor 1200. In this case, the second speed may be 30 times or less of the first speed.

The application processor 1200 may store the received image signal, for example, the encoded image signal in the memory 1230 provided therein or in a storage 1400 outside of the application processor 1200. Then, the application processor 1200 may read the encoded image signal from the memory 1230 or the storage 1400, decode the read encoded image signal, and may display image data generated based on the decoded image signal. For example, among a plurality of sub-processors 1212a, 1212b, and 1212c of the image processing device 1210a, a corresponding sub-processor may perform decoding and may also perform image processing on the decoded image signal.

In the second operating mode, the plurality of camera modules 1100a, 1100b, and 1100c may generate an image signal at a third rate lower than the first rate (for example, generate an image signal at a third frame rate lower than the first frame rate), and may transmit the image signal to the application processor 1200. The image signal, provided to the application processor 1200, may be an unencoded signal. The application processor 1200 may perform image processing on the received image signal or may store the image signal in the memory 1230 or the storage 1400.

The PMIC 1300 may supply power, for example, a power voltage, to each of the plurality of camera modules 1100a, 1100b, and 1100c. For example, the PMIC 1300 may supply first power to the camera module 1100a through a power signal line PSLa, may supply second power to the camera module 1100b through a power signal line PSLb, and may supply third power to the camera module 1100c through a power signal line PSLc, under the control of the application processor 1200.

The PMIC 1300 may generate power corresponding to each of the plurality of camera modules 1100a, 1100b, 1100c in response to a power control signal PCON from the application processor 1200, and may also adjust a level of power. The power control signal PCON may include a power control signal for each operating mode of the plurality of camera modules 1100a, 1100b, and 1100c. For example, the operating mode may include a low power mode. In this case, the power control signal PCON may include information on a camera module operating in the low power mode and a set power level. Levels of powers, respectively provided to the plurality of camera modules 1100a, 1100b, and 1100c, may be the same or different from each other. In addition, a level of power may be dynamically changed.

As described above, an image sensor may have a first autofocus pixel, in which photodiodes may be arranged in a first direction, and a second autofocus pixel in which photodiodes may be arranged in a second direction. The first direction and the second direction may intersect each other. In some example embodiments, an upper surface of a microlens included in the first autofocus pixel and an upper surface of a microlens included in the second autofocus pixel may be arranged at different heights to improve an autofocusing function of the image sensor.

While example embodiments have been shown and described above, it will be apparent to those skilled in the art that modifications and variations could be made without departing from the scope of the present inventive concepts as defined by the appended claims.

What is claimed is:

1. An image sensor comprising:
   a pixel array including a plurality of pixels arranged in a first direction and arranged in a second direction that intersects the first direction; and
   a logic circuit,
   wherein each of the plurality of pixels includes a pixel circuit, at least one photodiode, a light transmission layer above the photodiode, and a microlens that are sequentially stacked,
   wherein the logic circuit is configured to obtain a pixel signal from the plurality of pixels,
   wherein the pixel array includes a general pixel, a first autofocus pixel, and a second autofocus pixel,
   wherein the first autofocus pixel and the second autofocus pixel each include a first photodiode and a second photodiode, and the first photodiode and the second photodiode of the first autofocus pixel are adjacent to each other in the first direction and the first photodiode and the second photodiode of the second autofocus pixel are adjacent to each other in the second direction, and
   wherein a height of an upper surface of the microlens included in the first autofocus pixel is different from a height of an upper surface of the microlens included in the second autofocus pixel.

2. The image sensor of claim 1, wherein a radius of curvature of the microlens included in the first autofocus pixel is greater than a radius of curvature of the microlens included in the second autofocus pixel.

3. The image sensor of claim 1, wherein a radius of curvature of the microlens included in the first autofocus pixel is equal to a radius of curvature of the microlens included in the second autofocus pixel, and
wherein a thickness of the light transmission layer included in the first autofocus pixel is less than a thickness of the light transmission layer included in the second autofocus pixel.

4. The image sensor of claim 3, wherein the light transmission layer included in the second autofocus pixel includes a lower light transmission layer and an upper light transmission layer arranged between the lower light transmission layer and the microlens, and wherein a refractive index of the upper light transmission layer is smaller than a refractive index of the lower light transmission layer.

5. The image sensor of claim 1, wherein the general pixel has a first light receiving area and each of the first autofocus pixel and the second autofocus pixel has a second light receiving area, and wherein the first light receiving area is smaller than the second light receiving area.

6. The image sensor of claim 5, wherein the first autofocus pixel and the second autofocus pixel each includes a first pixel and a second pixel, and
wherein the first pixel and the second pixel share the microlens of the corresponding first autofocus pixel or the second autofocus pixel.

7. The image sensor of claim 5, wherein each of the first autofocus pixel and the second autofocus pixel includes a first pixel and a second pixel, and wherein the first pixel includes a first microlens and the second pixel includes a second microlens that is different from the first microlens, and
wherein the first pixel includes a first blocking layer configured to block a portion of light passing through the first microlens, and wherein the second pixel includes a second blocking layer configured to block a portion of light passing through the second microlens.

8. The image sensor of claim 7, wherein the first blocking layer and the second blocking layer are both adjacent to a boundary between the first pixel and the second pixel.

9. The image sensor of claim 1, wherein the second autofocus pixel comprises a plurality of second autofocus pixels arranged in different locations in at least one of the first direction and the second direction, and
wherein at least a portion of the plurality of second autofocus pixels have different heights.

10. The image sensor of claim 9, wherein a microlens included in one second autofocus pixel of the plurality of second autofocus pixels that is located relatively proximate to an edge of the pixel array has a height greater than a microlens included in other one second autofocus pixel of the plurality of second autofocus pixels that is located relatively proximate to a center of the pixel array.

11. An image sensor, comprising:
a plurality of general pixels arranged in a first direction and arranged in a second direction that intersects the first direction;
a plurality of first autofocus pixels, each of the plurality of first autofocus pixels including a first microlens, a first pair of photodiodes adjacent to each other in the first direction, and a first color filter between the first microlens and the first pair of photodiodes in a third direction that intersects the first direction and the second direction; and
a plurality of second autofocus pixels, each of the plurality of second autofocus pixels including a second microlens, a second pair of photodiodes adjacent to each other in the second direction, and a second color filter between the second microlens and the second pair of photodiodes,
wherein a first distance between an upper surface of the first color filter and an upper surface of the first microlens is different from a second distance between an upper surface of the second color filter and an upper surface of the second microlens.

12. The image sensor of claim 11, wherein each of the plurality of first autofocus pixels includes a first light transmission layer between the first microlens and the first pair of photodiodes, and
wherein each of the plurality of second autofocus pixels includes a second light transmission layer between the second microlens and the second pair of photodiodes.

13. The image sensor of claim 12, wherein a thickness of the first light transmission layer is different from a thickness of the second light transmission layer.

14. The image sensor of claim 13, wherein a radius of curvature of the first microlens is equal to a radius of curvature of the second microlens.

15. The image sensor of claim 13, wherein a radius of curvature of the first microlens is different from a radius of curvature of the second microlens.

16. The image sensor of claim 12, wherein a thickness of the first light transmission layer is equal to a thickness of the second light transmission layer, and
wherein a radius of curvature of the first microlens is different from a radius of curvature of the second microlens.

17. The image sensor of claim 12, wherein a photodiode included in each of the plurality of general pixels has a size equal to one of the first pair of photodiodes and one of the second pair of photodiodes.

18. The image sensor of claim 17, wherein each of the plurality of first autofocus pixels and each of the plurality of second autofocus pixels includes a blocking layer,
wherein, in each of the plurality of first autofocus pixels, the blocking layer overlaps with a boundary between the first pair of photodiodes, and
wherein, in each of the plurality of second autofocus pixels, the blocking layer overlaps with a boundary between the second pair of photodiodes.

19. An image sensor, comprising:
a plurality of general pixels arranged in a first direction and arranged in a second direction that intersects the first direction;
a plurality of first autofocus pixels, each of the plurality of first autofocus pixels including a first microlens, a first pair of photodiodes adjacent to each other in the first direction, and a first color filter between the first microlens and the first pair of photodiodes in a third direction that intersects the first direction and the second direction; and
a plurality of second autofocus pixels, each of the plurality of second autofocus pixels including a second microlens, a second pair of photodiodes adjacent to each other in the second direction, and a second color filter between the second microlens and the second pair of photodiodes,
wherein each of the plurality of first autofocus pixels includes a first light transmission layer between the first microlens and the first pair of photodiodes,
wherein each of the plurality of second autofocus pixels includes a second light transmission layer between the second microlens and the second pair of photodiodes, and wherein a thickness of the first light transmission layer is different from a thickness of the second light transmission layer.

\* \* \* \* \*